United States Patent
Yersin et al.

(10) Patent No.: US 8,610,110 B2
(45) Date of Patent: Dec. 17, 2013

(54) OPTOELECTRONIC COMPONENT COMPRISING NEUTRAL TRANSITION METAL COMPLEXES

(75) Inventors: Hartmut Yersin, Sinzing (DE); Tobias Fischer, Rimbach (DE); Rafal Czerwieniec, Regensburg (DE); Uwe Monkowius, Linz (AT)

(73) Assignee: Merck Patent GmbH (DE)

( * ) Notice: Subject to any disclaimer, the term of this patent is extended or adjusted under 35 U.S.C. 154(b) by 404 days.

(21) Appl. No.: 12/921,849

(22) PCT Filed: Feb. 25, 2009

(86) PCT No.: PCT/EP2009/001332
§ 371 (c)(1), (2), (4) Date: Sep. 10, 2010

(87) PCT Pub. No.: WO2009/112152
PCT Pub. Date: Sep. 17, 2009

(65) Prior Publication Data
US 2011/0012099 A1    Jan. 20, 2011

(30) Foreign Application Priority Data
Mar. 11, 2008    (DE) .................. 10 2008 013 691

(51) Int. Cl.
*H01L 35/24*    (2006.01)
(52) U.S. Cl.
USPC .................................. 257/40; 257/E51.001
(58) Field of Classification Search
USPC .......................................... 257/40, E51.001
See application file for complete search history.

(56) References Cited

U.S. PATENT DOCUMENTS

| | | | |
|---|---|---|---|
| 6,137,118 | A | 10/2000 | Kunugi et al. |
| 7,345,301 | B2 | 3/2008 | Gerhard et al. |
| 2005/0069729 | A1 | 3/2005 | Ueda et al. |
| 2005/0164031 | A1 | 7/2005 | Thompson et al. |
| 2006/0237059 | A1 | 10/2006 | Kurihara et al. |
| 2006/0255332 | A1 | 11/2006 | Becker et al. |
| 2007/0082284 | A1 | 4/2007 | Stoessel et al. |
| 2007/0176147 | A1 | 8/2007 | Buesing et al. |
| 2009/0134384 | A1 | 5/2009 | Stoessel et al. |
| 2009/0167166 | A1 | 7/2009 | Bach et al. |
| 2009/0206735 | A1 | 8/2009 | Yersin et al. |

(Continued)

FOREIGN PATENT DOCUMENTS

| | | |
|---|---|---|
| EP | 1205527 A1 | 5/2002 |
| EP | 1617710 A1 | 1/2006 |

(Continued)

OTHER PUBLICATIONS

Ma, Biwu, et al., "Platinum Binuclear Complexes as Phosphorescent Dopants for Monochromatic and White Organic Light-Emitting Diodes," *Advanced Functional Materials*, vol. 16, pp. 2438-2446 (2006).

(Continued)

*Primary Examiner* — Anthony Ho
(74) *Attorney, Agent, or Firm* — Novak Druce Connolly Bove + Quigg LLP

(57) ABSTRACT

The invention relates to the use of compositions as emitters or absorbers in an electronic component, wherein the compositions have a first neutral transition metal complex and a second neutral transition metal complex. According to the invention, the first transition metal complex and the second transition metal complex together form a column structure. The invention further relates to a method for the production of electronic components having such compositions.

16 Claims, 3 Drawing Sheets

(56) References Cited

U.S. PATENT DOCUMENTS

| | | |
|---|---|---|
| 2009/0302742 A1 | 12/2009 | Komori et al. |
| 2009/0302752 A1 | 12/2009 | Parham et al. |
| 2010/0187977 A1 | 7/2010 | Kai et al. |

FOREIGN PATENT DOCUMENTS

| | | |
|---|---|---|
| EP | 1617711 A1 | 1/2006 |
| EP | 1731584 A1 | 12/2006 |
| JP | 2004-288381 A | 10/2004 |
| JP | 2005-347160 A | 12/2005 |
| WO | WO-2004/006353 A2 | 1/2004 |
| WO | WO-2004/013080 A1 | 2/2004 |
| WO | WO-2004/093207 A2 | 10/2004 |
| WO | WO-2005/003253 A2 | 1/2005 |
| WO | WO-2005/039246 A1 | 4/2005 |
| WO | WO-2005/042550 A1 | 5/2005 |
| WO | WO-2005/111172 A2 | 11/2005 |
| WO | WO-2006/005627 A1 | 1/2006 |
| WO | WO-2006/117052 A1 | 11/2006 |
| WO | WO-2007/063754 A1 | 6/2007 |
| WO | WO-2007/118671 A1 | 10/2007 |
| WO | WO-2007/137725 A1 | 12/2007 |
| WO | WO-2008/056746 A1 | 5/2008 |
| WO | WO-2008/086851 A1 | 7/2008 |
| WO | WO-2009/062578 A1 | 5/2009 |
| WO | WO-2010/006680 A1 | 1/2010 |
| WO | WO-2010/015306 A1 | 2/2010 |

OTHER PUBLICATIONS

Schaafsma, T.J., "Organic solar cells using porphyrin assemblies on semiconductor substrates," *Solar Energy Materials and Solar Cells*, vol. 38, pp. 349-351 (1995).

| 8 | Cathode, Al: 60 nm |
| --- | --- |
| 7 | Interlayer LiF: 0.8 nm |
| 6 | ETL, Alq$_3$: 40 nm |
| 5 | Emitter layer: 30 to 100 nm |
| 4 | HTL: α-NPD: 50 nm |
| 3 | HIL: CuPc: 10 nm |
| 2 | Anode, ITO: 40 nm |
| 1 | Support material, glass |

Figure 5

| 7 | Cathode, Al: 60 nm |
| --- | --- |
| 6 | Interlayer CsF: 0.8 nm |
| 5 | ETL Alq$_3$: 40 nm |
| 4 | Emitter layer: 30 to 100 nm |
| 3 | HTL, PEDOT: PSS: 50 nm |
| 2 | Anode, ITO: 40 nm |
| 1 | Support material, glass |

Figure 6

| 6 | Electrode, positive |
| --- | --- |
| 5 | HTL: p-conductor material |
| 4 | Absorption layer |
| 3 | ETL: n-conductor material |
| 2 | Electrode, negative |
| 1 | Support material |

Figure 7

| 6 | Positive electrode, Au: 60 nm |
| --- | --- |
| 5 | HTL: MeO-TPD: 10 nm |
| 4 | Substance composition according to the invention: 50 to 100 nm |
| 3 | ETL, C$_{60}$: 50 nm |
| 2 | Negative electrode, ITO: 40 nm |
| 1 | Support material, glass |

OPTOELECTRONIC COMPONENT COMPRISING NEUTRAL TRANSITION METAL COMPLEXES

RELATED APPLICATIONS

This application is a national stage application (under 35 U.S.C. §371) of PCT/EP2009/001332, filed Feb. 25, 2009, which claims benefit of German Application No. 10 2008 013 691.3, filed Mar. 11, 2008.

The invention relates to the use of compositions for opto-electronic components, where the compositions comprise a first neutral transition-metal complex and a second neutral transition-metal complex. The invention furthermore relates to a process for the production of opto-electronic components of this type and to opto-electronic components which comprise complexes of this type.

Electroluminescent compounds represent the heart of organic light-emitting diodes (so-called OLEDs). These compounds are frequently embedded in or chemically bonded to polymeric materials, which are generally of such a nature that suitable charge carriers can be generated and transported in them, with the proviso that, when charge carriers of opposite charge meet, excitons are formed which transfer their excess energy to the respective electroluminescent compound. This electroluminescent compound can then be transferred into a particular electronic excited state, which is then, by the emission of light, converted into the associated ground state as completely as possible and with avoidance of radiation-free deactivation processes.

Apart from a few exceptions, the electronic excited state, which can also be formed by energy transfer from a suitable precursor exciton, is either a singlet or triplet state. Since the two states are generally occupied in the ratio 1:3 due to the spin statistics, only a maximum of 25% of the excitons generated result in emission in the case of emission from the singlet state, which is known as fluorescence and occurs principally in the case of organic, heavy-metal-free compounds. By contrast, in the case of triplet emission, which is known as phosphorescence and occurs principally in the case of organo-transition-metal compounds, all the excitons can be utilised, converted and emitted as light (triplet harvesting), so that the internal quantum yield in this case can achieve the value 100%, so long as the singlet state, which is excited at the same time and is energetically above the triplet state, is converted completely into the triplet state (intersystem crossing) and radiation-free concurrence processes remain unimportant. Thus, triplet emitters should in principle be more efficient electroluminophores and more suitable for ensuring a high light yield in an organic light-emitting diode.

In spite of an intensive search for highly efficient triplet emitters, only few compounds whose light yield extends to the limit of 100% have been disclosed hitherto, since radiation-free concurrence processes almost always occur at the same time as the desired phosphorescence. The highly efficient triplet emitters that have been disclosed to date are usually complexes of some heavy metals, originating predominantly from groups 6 to 11 of the Periodic Table, with certain, predominantly π electron-containing ligands.

It has been found that, in the case of the said complexes, the nature and strength of the metal-ligand bonds and the nature of the ligands have a crucial influence on the interaction between radiation-free and radiative deactivation and thus on the luminescence quantum yield that can be achieved in each case, but that these quantities are virtually impossible to predict unambiguously for a particular compound. This has the consequence that the search for suitable triplet emitters having a high luminescence quantum yield and appropriate emission colour and emission lifetime is at present still driven substantially empirically.

These emitter molecules can be achieved in various ways, using purely organic or organometallic molecules. It can be shown that the light yield of OLEDs comprising organo-transition-metal substances, so-called triplet emitters, can be substantially greater than for purely organic materials. Owing to this property, the further development of organo-transition-metal materials is of crucial importance.

Another important aim is efficient conversion of solar energy into electrical energy. The associated requirements of the device construction are in many requirements similar to those for the construction of an OLED. Thus, care must be taken in OLEDs that holes coming from the anode and electrons coming from the cathode recombine at the dyes (=Organometallic emitter) and emit light. Conversely, it must be ensured in the case of organic solar cells (OSCs), starting from the dye molecules excited by sunlight, that no further light emission takes place, but instead that holes and electrons form and migrate to the anode and the cathode respectively.

In the process leading to the generation of the photocurrent in an organic solar cell, which process is composed of a plurality of "elemental" steps, firstly a photon of the incident light is absorbed by a dye molecule in the absorption layer. The dye molecule is thus electronically excited. Since the molecule has different redox properties in the excited state (exciton) than in the ground state, electrical charge separation occurs within the absorption layer or at one of the layer boundaries in the case of suitably selected HOMO and LUMO positions of the hole-transport and electron-transport layers relative to the HOMO/LUMO positions of the absorption layer. The electrons and holes thus formed migrate through the respective electron- and hole-transport layers respectively in the direction of the electrodes, causing an electrical voltage to form at the electrodes. This functional principle gives rise to the requirements of the substances used in the device:

i) very high absorption of the dye over the entire visible spectral region, if possible as far as the near-IR region,
ii) relatively good hole and electron conductivities of the layers provided for this purpose,
iii) good exciton transport in the absorption layer,
iv) effective and fast exciton dissociation and transport of the charge carriers away from the absorption layer or from one of the interfaces in order to prevent hole-electron recombination.

The problems described in the prior art in the production of efficient OSCs arise essentially for the following two reasons:
i) lack of materials having high light absorption from the visible to the near infrared spectral region, and
ii) lack of materials having high exciton diffusion lengths, which ensure migration of the excitons from the interior of the light-absorbing layer to, for example, the interface at which, for example, the separation of the excitons takes place.

The light absorption capacity of a material at a given wavelength 2 is given by the Lambert-Beer law:

$$-\log(I/I_0) = \epsilon(\lambda)cd$$

where $I$=intensity of the transmitted light, $I_0$=intensity of the incident light, c=concentration of the absorbing substance, and d=path length of the light in the material, and $\epsilon(\lambda)$=molar extinction coefficient.

Assuming that 99% of the incident light is absorbed, i.e. $I/I_0=0.01$ or $-\log(I/I_0)=2$, and neglecting reflections and assuming a value of c=5 mol/l (typical solids concentration of metal complexes or compositions which are the subject-matter of the present invention) and d=100 nm (thickness of the light-absorption layer in an OSC), the requisite molar extinction coefficients can be estimated as at least $10^4$ l mol$^{-1}$ cm$^{-1}$ to $10^5$ l mol$^{-1}$ cm$^{-1}$.

However, the $\epsilon(\lambda)$ values of the transition-metal complexes used to date as OSC materials are typically only $10^3$ l mol$^{-1}$ cm$^{-1}$ to $10^4$ l mol$^{-1}$ cm$^{-1}$ (measured at the maximum of the absorption band in the visible region).

Accordingly, the present invention was based on the object of providing substances, in particular emitter substances for OLEDs or absorption dyes for OSCs, with which the disadvantages of the prior art can be overcome, or with which, in particular, OLEDs having high radiation power and low degradation and OSCs having high absorption can be produced.

Pt(II) centres with square-planar or quasi-square-planar coordination have a strong tendency to form Pt—Pt interactions and frequently form columnar structures, which are also known as oligomers or aggregates [1-5]. This behaviour can be observed both in the case of neutral (for example in the case of (RNC)$_2$Pt(CN)$_2$ complexes), and also in the case of charged complexes (for example [Pt(CN)$_4$]$^{2-}$). In the latter, these columnar structures form even in spite of the similar charges of the complex anions [5].

Compounds of this type exhibit intense emissions and very intense absorptions (at somewhat higher energies) in the solid state, which correspond to the electronic states resulting from Pt—Pt interactions [5-10]. The emission and absorption wavelengths are determined predominantly by the Pt—Pt separations in the columnar structures, and these can be controlled specifically in the case of charged complexes by variation of the counterion or in the case of neutral complexes by variation of the ligands or the substitutes on the ligands.

The inventors have surprisingly found that a modification of the emission and absorption properties can also be achieved by simple mixing (combination) of neutral transition-metal complexes, in particular Pt(II) complexes. To this end, two or more neutral transition-metal complex compounds, for example Pt(II) complex compounds, are simultaneously evaporated in vacuo and deposited on a surface, for example as emission layer or absorption layer of an opto-electronic component. This gives a build-up of the compounds or compositions as columnar structures (which are also known as aggregates or oligomers by the person skilled in the art), which have different metal-metal separations (for example Pt—Pt separations) compared with the respective pure compounds. Thus, the emission wavelength can be varied through a suitable choice of the compounds and the mixing ratios thereof. Any desired number of substances in all possible mixing forms can be deposited in the emission layer of the opto-electronic component.

Essential advantages of these mixtures are, inter alia, the possible variation or adaptation of the emission or absorption wavelength and the possibility of achieving particularly high emission intensities.

The object on which the invention is based is achieved by the use of a composition for opto-electronic components, in particular in the emitter or absorber layer thereof, which comprises a first neutral transition-metal complex and a second neutral transition-metal complex which is different from the first neutral transition-metal complex, or which consists of a first neutral transition-metal complex and a second neutral transition-metal complex which is different from the first neutral transition-metal complex. Further neutral transition-metal complexes may also be present in the composition in any desired number, or the composition may also comprise further neutral transition-metal complexes in any desired number, preferably in total up to five, particularly preferably two, three or four different transition-metal complexes of the type described here. In addition, further compounds which do not contain transition metals may be present.

The composition thus serves for the conversion of electrical energy into light energy or the conversion of light energy into electrical energy.

In accordance with the invention, the first transition-metal complex and the second transition-metal complex are of such a nature that both have a square-planar structure or a quasi-square-planar structure and/or that together they form a columnar structure. The term columnar structure is known to the person skilled in the art. Structures of this type are also known as aggregates or oligomers in the literature [1-5] The presence of a columnar structure can be determined experimentally by determining the metal-metal separation in the X-ray structure. If this is less than 3.7 Å and in particular less than about 3.5 Å in the case of platinum complexes, it can be concluded that a columnar structure is present. A further method for the determination of the presence of a columnar structure is the measurement of the photoluminescence spectrum. To this end, this spectrum is measured in solution in various concentrations. If the maximum of the photoluminescence spectrum shifts at higher concentration, it can be concluded that a columnar structure is present. If the transition-metal complexes do not have adequately high solubility for measurement in solution, the measurement can also be carried out in a film in various concentrations in a matrix material. Since the different methods can result in a slight deviation of the results from one another, the shift in the maximum of the photoluminescence spectrum as a function of the concentration in a film together with an inert matrix material which does not itself participate in the emission should, in particular, be understood for the purposes of this application.

The columnar structure may also be interrupted. Accordingly, the composition according to the invention need not have a continuous columnar structure, but instead may have a columnar structure in sections.

The first transition-metal complex and the second transition-metal complex of the composition according to the invention have a square-planar structure or a quasi-square-planar structure. The columnar structure here is characterised by overlapping of an (occupied) d orbital of the first transition-metal complex with an (occupied) d orbital of the second transition-metal complex and equally by overlapping of the (unoccupied) p orbitals along the longitudinal direction of the columns (of the oligomer). This model enables the metal-metal interactions in a structure of this type to be described.

For the purposes of this application, a square-planar structure is taken to mean a structure in which the metal and the four coordinating atoms of the ligands are in a plane. For the purposes of this application, a quasi-square-planar structure is taken to mean a structure in which the metal and the four coordinating atoms of the ligands are approximately in a plane. However, this can be distorted slightly towards a tetrahedron or square-pyramidal structure. For the purposes of this application, a deviation of up to 30° from the planar structure will still be referred to as a quasi-planar structure. The precise geometry of the complexes can be determined by quantum-mechanical calculation (geometry optimisation using the Gaussian 2003 program and the Hartree-Fock/LanL2MB method).

In a preferred embodiment of the invention, the first transition-metal complex and the second transition-metal complex have a $d^8$ electron structure. These complexes generally have a square-planar or quasi-square-planar geometry.

In a particularly preferred embodiment of the invention, the square-planar transition-metal complex and/or the quasi-square-planar transition-metal complex have a monovalent, divalent or trivalent metal centre.

In a further preferred embodiment of the invention, the first transition-metal complex and the second transition-metal complex are selected from Pt(II) complexes, Rh(I) complexes, Ir(I) complexes, Au(III) complexes, Pd(II) complexes, Au(I) complexes and Ag(I) complexes. Most of these complexes have a $d^8$ electron structure.

In particular, square-planar or quasi-square-planar transition-metal complexes of this type have, in accordance with the invention, a structure of a general formulae I to VI:

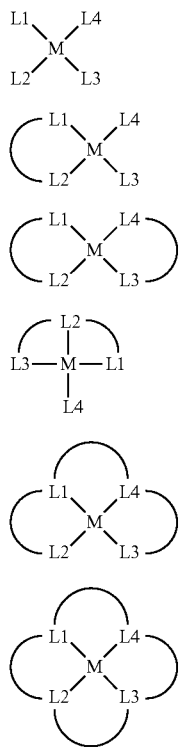

where

M is Pt(II), Pd(II), Rh(I), Ir(I) or Au(III), and

L1-L4 are, independently of one another, a suitable ligand of any type, which may be neutral or negatively or positively charged, where the transition-metal complex as a whole must be neutral.

The ligands L1 to L4 must be designed in such a way that the formation of a transition-metal complex of the formulae I to VI is possible. In particular, L1 to L4 must cause low steric hindrance, so that the formation of metal-metal interactions between the centres of the transition-metal complexes, i.e. the formation of the columnar structure, is not hindered. In accordance with the formulae I to VI indicated above, the ligands may be mono-, bi-, tri- or tetradentate. Examples of suitable ligands are shown below.

The bonding atom of the ligands L1 to L4 preferably has $sp^2$ or sp hybridisation, since ligands of this type are very flat and do not hinder the formation of columns. These ligands accordingly have π electrons in the stack direction. Examples of ligands having $sp^2$ hybridisation are imines (R—N=CR'R'') and aromatic imines (for example pyridine); preferred ligands containing $sp^2$ carbon atoms are biphenyl or deprotonated secondary amines (for example pyrazole). Examples of preferred ligands having sp hybridisation are R—C≡N|, R—C≡C|⁻ and R—N≡C|. The radicals R which are not in the vicinity of the coordinated atom may cause somewhat greater steric hindrance (for example ᵗBu—N≡C|). Accordingly, ligands having $sp^3$ hybridisation at the bonding atom (for example amines, phosphines, etc.) are less preferred. However, they are possible if a transition-metal complex of one of the formulae I to VI having a square-planar or quasi-square-planar structure is able to form, and the complexes are able to form columnar structures.

Examples of neutral monodentate ligands are imines, carbonyls, isonitriles, nitriles, amines, phosphines, arsines, $R_2S$, $R_2Se$ and N-heterocyclic carbenes (in particular Arduengo carbenes). L1 and L2 are preferably connected to one another and form a bidentate ligand (L1∩L2, see II). Particularly suitable for this purpose are α-diimines, diamines, diisonitriles, dinitriles, aromatic N-oxides or combinations of monodentate ligands.

Particular preference is given to α-diimine ligands, which advantageously have the following structure VII, where the nitrogen in each case coordinates to the metal:

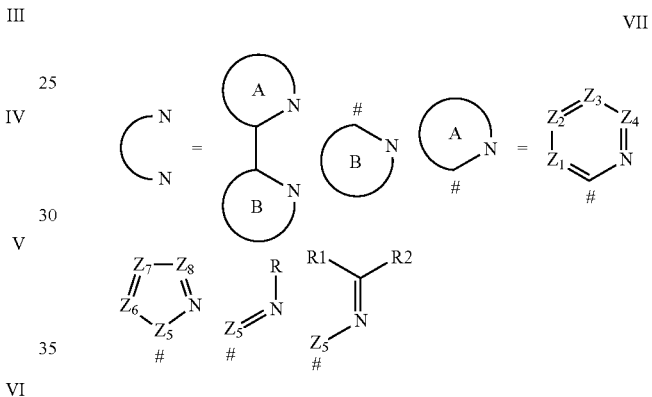

α-Diimine ligands can consist of either five- or six-membered rings, whose constituents $Z_1$-$Z_4$ and $Z_6$-$Z_8$ are either the fragments CR(X) (where R(X)=organic groups, which may be identical to or independent of one another, where R is defined as indicated below) or N, in the case of $Z_6$-$Z_8$ may additionally also be NR, O or S. $Z_5$ is either C or N. These definitions also include the possibility that the units A and B do not form a ring, but instead are open-chain. In the above representation, "#" denotes the atom which is connected to the second unit.

The units A and B may also be bonded by an additional bridge, so that a new aromatic or aliphatic ring is formed.

The above representation of α-diimine ligands in terms of formulae is illustrated by the following examples.

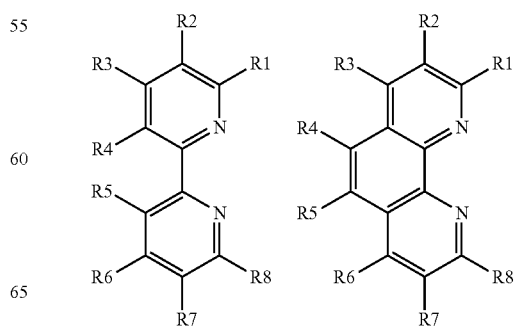

-continued

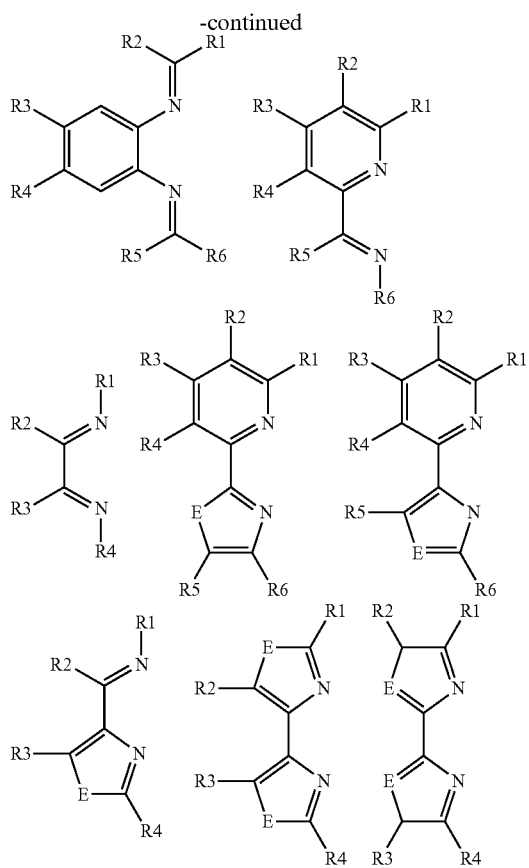

E = O, S, NR

R1-R8 are each substituents, which may be identical to or independent of one another. These are selected from the group consisting of: H, D, F, Cl, Br, I, CHO, C(=O)Ar$^1$, P(=O)(Ar$^1$)$_2$, S(=O)Ar$^1$, S(=O)$_2$Ar$^1$, CR$^2$=CR$^2$Ar$^1$, CN, NO$_2$, Si(R$^2$)$_3$, B(OR')$_2$, B(R')$_2$, B(N(R')$_2$)$_2$, OSO$_2$R', a straight-chain alkyl, alkenyl, alkynyl, alkoxy or thioalkoxy group having 1 to 40 C atoms or a branched or cyclic alkyl, alkenyl, alkynyl, alkoxy or thioalkoxy group having 3 to 40 C atoms, each of which may be substituted by one or more radicals R$^2$, where one or more non-adjacent CH$_2$ groups may be replaced by R'C=CR', C≡C, Si(R')$_2$, Ge(R')$_2$, Sn(R')$_2$, C=O, C=S, C=Se, C=NR', P(=O)(R'), SO, SO$_2$, NR', O, S or CONR' and where one or more H atoms may be replaced by F, Cl, Br, I, CN or NO$_2$, or an aromatic or heteroaromatic ring system having 5 to 60 aromatic ring atoms, which may in each case be substituted by one or more radicals R', or an aryloxy or heteroaryloxy group having 5 to 60 aromatic ring atoms, which may be substituted by one or more radicals R', or a combination of these systems; two or more adjacent substituents here may also form a mono- or polycyclic, aliphatic or aromatic ring system with one another.

Ar$^1$ stands on each occurrence, identically or differently, for an aromatic or heteroaromatic ring system having 5 to 40 aromatic ring atoms, which may be substituted by one or more radicals R'. Furthermore, R' on each occurrence, identically or differently, stands for H, D, CN or an aliphatic, aromatic and/or heteroaromatic hydrocarbon radical having 1 to 20 C atoms, in which, in addition, H atoms may be replaced by F; two or more adjacent substituents here may also form a mono- or polycyclic, aliphatic or aromatic ring system with one another.

In an embodiment of the invention, the ligands L1 to L4 can be neutral monodentate ligands. However, the complex as a whole must, in accordance with the invention, be neutral. These are preferably selected from carbon monoxide, isonitriles, such as, for example, tert-butyl isonitrile, cyclohexyl isonitrile, adamantyl isonitrile, phenyl isonitrile, mesityl isonitrile, 2,6-dimethylphenyl isonitrile, 2,6-diisopropylphenyl isonitrile, 2,6-di-tert-butylphenyl isonitrile, amines, such as, for example, trimethylamine, triethylamine, morpholine, phosphines, such as, for example, trifluorophosphine, trimethylphosphine, tricyclohexylphosphine, tri-tert-butylphosphine, triphenylphosphine, tris(pentafluorophenyl)phosphine, phosphites, such as, for example, trimethyl phosphite, triethyl phosphite, arsines, such as, for example, trifluoroarsine, trimethylarsine, tricyclohexylarsine, tri-tert-butylarsine, triphenylarsine, tris(pentafluorophenyl)arsine, stibines, such as, for example, trifluorostibine, trimethylstibine, tricyclohexylstibine, tri-tert-butylstibine, triphenylstibine, tris(pentafluorophenyl)stibine, and nitrogen-containing heterocycles, such as, for example, pyridine, pyridazine, pyrazine, pyrimidine, triazine.

In a further embodiment of the invention, the ligands L1 to L4 can be negatively charged monodentate ligands. However, the complex as a whole must, in accordance with the invention, be neutral. These are preferably selected from hydride, deuteride, the halides F, Cl, Br and I, alkylacetylides, such as, for example, methyl-C≡C$^-$, tert-butyl-C≡C$^-$, arylacetylides, such as, for example, phenyl-CC, cyanide, cyanate, isocyanate, thiocyanate, isothiocyanate, aliphatic or aromatic alkoxides, such as, for example, methoxide, ethoxide, propoxide, isopropoxide, tert-butoxide, phenoxide, aliphatic or aromatic thioalkoxides, such as, for example, thiomethoxide, thioethoxide, thiopropoxide, thioisopropoxide, tert-thiobutoxide, thiophenoxide, amides, such as, for example, dimethylamide, diethylamide, diisopropylamide, morpholide, carboxylates, such as, for example, acetate, trifluoroacetate, propionate, benzoate, aryl groups (for example phenyl: C$_6$H$_5^-$), alkenyl groups, CH$_3^-$, NO$_3^-$ or NO$_2^-$ and anionic, nitrogen-containing heterocycles, such as pyrrolide, imidazolide, pyrazolide. The alkyl groups in these groups are preferably C$_1$-C$_{20}$-alkyl groups, particularly preferably C$_1$-C$_{10}$-alkyl groups, very particularly preferably C$_1$-C$_4$-alkyl groups. An aryl group is also taken to mean heteroaryl groups. These groups are defined as above.

Preferred di- or trianionic ligands are O$^{2-}$, S$^{2-}$, nitrenes, which lead to coordination in the form R—N=M, where R generally stands for a substituent, or N$^{3-}$.

For the purposes of the invention, it is possible for an uncharged and a negatively charged ligand also to be combined to form a bidentate singly negatively charged ligand ((L1∩L2)$^-$ or (L3∩L4)$^-$). This class of ligands is defined more precisely below.

Possible bidentate neutral, singly or doubly negatively charged ligands (as ligands (L1∩L2)$^{0, 1-, 2-}$ and/or (L3∩L4)$^{0, 1-, 2-}$ in the above formulae II and III) are preferably selected from diamines, such as, for example, ethylenediamine, N,N,N',N'-tetramethylethylenediamine, propylenediamine, N,N,N',N'-tetramethylpropylenediamine, cis- or trans-diaminocyclohexane, cis- or trans-N,N,N',N'-tetramethyldiaminocyclohexane, imines, such as, for example, 2-[(1-(phenylimino)ethyl]pyridine, 2-[(1-(2-methylphenylimino)ethyl]-pyridine, 2-[(1-(2,6-diisopropylphenylimino)ethyl]pyridine, 2-[(1-(methylimino)ethyl]pyridine, 2-[(1-(ethylimino)ethyl]pyridine, 2-[(1-(isopropylimino)ethyl]pyridine, 2-[(1-(tert-butylimino)ethyl]pyridine, diimines, such as, for example, 1,2-bis(methylimino)ethane, 1,2-bis(ethylimino)ethane, 1,2-bis(isopropylimino)ethane, 1,2-bis(tert-butylimino)ethane, 2,3-bis(methylimino)butane, 2,3-bis(ethylimino)butane, 2,3-bis(isopropylimino)butane, 2,3-bis(tert-butylimino)butane, 1,2-bis(phenylimino)ethane, 1,2-bis(2-methylphenylimino)ethane, 1,2-bis(2,6-diisopropylphenylimino)ethane, 1,2-bis(2,6-di-tert-butylphenylimino)ethane, 2,3-bis(phenylimino)butane, 2,3-bis(2-methylphenylimino)butane, 2,3-bis(2,6-diisopropylphenylimino)butane, 2,3-bis(2,6-di-tert-butylphenylimino)butane, heterocycles containing two nitrogen atoms, such as, for example, 2,2"-bipyridine, o-phenanthroline, diphosphines, such as, for example, bis-diphenylphosphinomethane, bisdiphenylphosphinoethane, bis(diphenylphosphino)propane, bis(dimethylphosphino)methane, bis(dimethylphosphino)ethane, bis(dimethylphosphino)propane, bis(diethylphosphino)methane, bis(diethylphosphino)ethane, bis(diethylphosphino)propane, bis(di-tert-butylphosphino)methane, bis(di-tert-butylphosphino)ethane, bis(tert-butylphosphino)propane, 1,3-diketonates derived from 1,3-diketones and nitrogen homologues thereof, such as, for example, acetylacetone, benzoylacetone, 1,5-diphenylacetylacetone, dibenzoylmethane, bis(1,1,1-trifluoro-acetyl)methane, 3-ketonates derived from 3-ketoesters, such as, for example, ethyl acetoacetate, carboxylates derived from aminocarboxylic acids, such as, for example, pyridine-2-carboxylic acid, quinoline-2-carboxylic acid, glycine, N,N-dimethylglycine, alanine, N,N-dimethylaminoalanine, salicyliminates derived from salicylimines, such as, for example, methyl-salicylimine, ethyl-salicylimine, phenyl-salicylimine, dialcoholates derived from dialcohols, such as, for example, ethylene glycol, 1,3-propylene glycol, dithiolates derived from dithiols, such as, for example, 1,2-ethylenedithiol, 1,3-propylenedithiol, dicarboxylates, such as, for example, oxalate, $SO_4^{2-}$, diaryl groups, such as, for example, 2,2'-biphenylene, dialkynyls, dialkenyl groups, bis(pyrazolyl)borates, bis(imidazolyl)borates, 8-hydroxyquinolinates or combinations of the said monodentate ligands.

The following structural formulae show examples of ligands of this type, where the atoms denoted by an asterisk are those which form the bond to the metal.

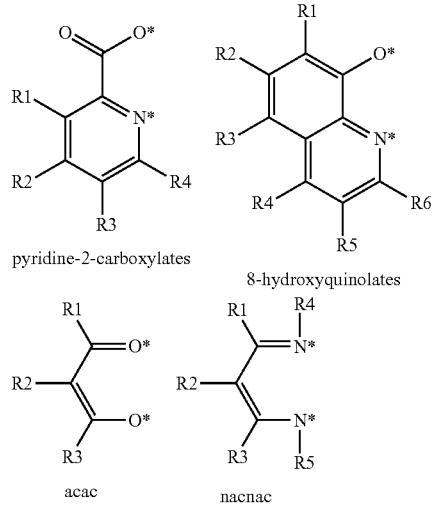

pyridine-2-carboxylates 8-hydroxyquinolates acac nacnac

Preference is furthermore given to bidentate monoanionic ligands which, with the metal, contain a cyclometallated five-membered ring having at least one metal-carbon bond. These are, in particular, ligands as generally used in the area of phosphorescent metal complexes for organic electroluminescent devices, i.e. ligands of the phenylpyridine, naphthylpyridine, phenylquinoline, phenylisoquinoline, etc., type, each of which may be substituted by one or more of the above-mentioned radicals. A multiplicity of ligands of this type is known to the person skilled in the art in the area of phosphorescent electroluminescent devices, and he will be able to select further ligands of this type as ligand for the complexes depicted above without an inventive step.

In accordance with the above formula IV, the monodentate ligands L1, L2, and L3 can, in an embodiment of the invention, be combined to form a tridentate ligand, where, for example, L1 and L2 are neutral and L3 represents a singly negatively charged ligand. So-called pincer complexes are thus obtained. In addition, it is also possible to use pincer complexes containing one tridentate doubly negatively charged ligand, for example (L1 and L2 each singly negatively charged, L3 neutral). The following examples are shown for formula IV:

[M(II)(L1∩L2∩L3)⁻(L4), for example

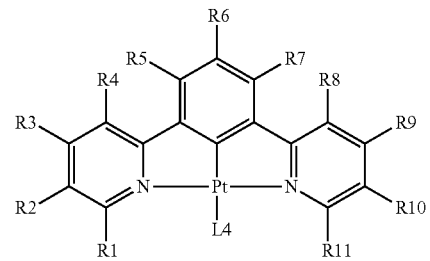

[M(II)(L1∩L2∩L3)⁻(L4)⁻], for example

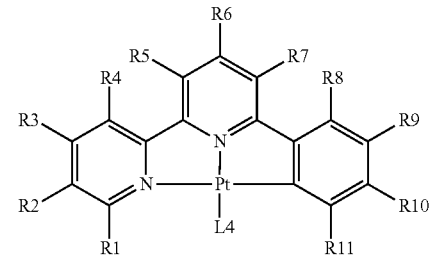

[M(II)(L1∩L2∩L3)²⁻(L4)], for example

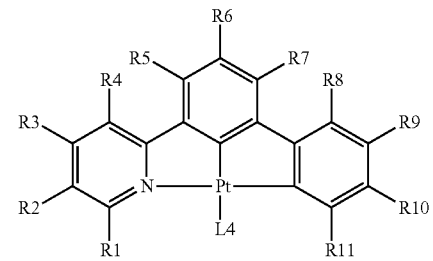

[M(II)(L1∩L2∩L3)²⁻(L4)], for example

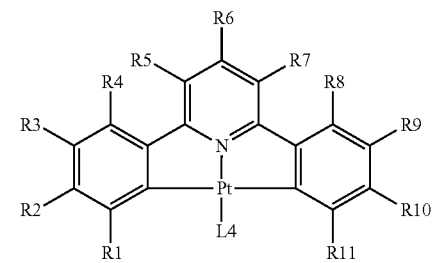

Formula III is present in formula I if the combinations (L1∩L2) and (L3∩L4) are used. The two bidentate ligands (L1∩L2) and (L3∩L4) in the complexes may be either identical or different. The ligands must be designed in such a way that an electrically neutral complex results.

The above-mentioned cyclometallating ligands are distinguished, as bidentate, singly negatively charged ligands, in particular by the fact that they 1) bond on the one hand via an $sp^2$ carbon atom and on the other hand via a nitrogen atom (see the formula below). The units A and B can consist either of five- or six-membered rings or may be open-chain. The constituents $Z_1$-$Z_4$, $Z_6$-$Z_8$, $Z_9$-$Z_{12}$ and $Z_{14}$-$Z_{16}$ consist either of the fragment CR(X) (R(X)=organic groups, which may be identical or independent of one another) or N, in the case of constituents $Z_6$-$Z_8$ and $Z_{14}$-$Z_{16}$ additionally also of NR, O and S. $Z_5$ and $Z_{13}$ are either C or N. The atom which forms the bond to the metal is denoted by "*". The atom which is connected to the second unit is denoted by "#".

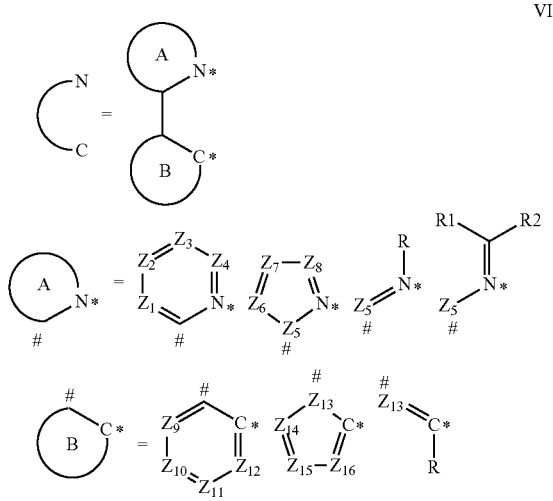

VIII

Examples of cyclometallating ligands of this type are shown below.

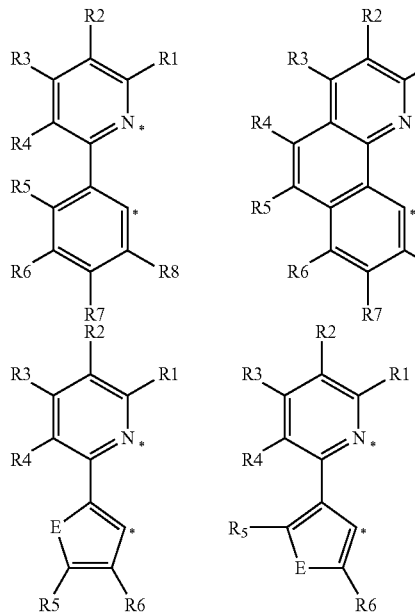

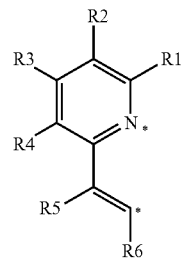

R1-R8 are each substituents, which may be identical to or independently different from one another. These are selected from the substituent groups mentioned above for R1-R8.

2) bond on the one hand via an $sp^2$ carbon atom and on the other hand via a carbene carbon atom (see the formulae below). The unit B can consist of a five- or six-membered ring, but may also be open-chain. The constituents $Z_1$-$Z_4$ and $Z_5$-$Z_7$ consist either of the fragment CR(X) (R(X)=organic groups, which may be identical to or independent of one another) or N. In the case of constituents $Z_5$-$Z_7$, they may additionally also consist of NR, O and S. "*" denotes the atom which forms the bond to the metal. "#" denotes the atom which is connected to the second ring. Compounds of this type can be defined as follows:

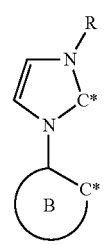

IX

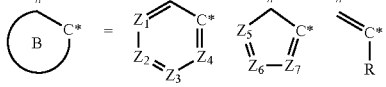

Examples of cyclometallating ligands of this type are shown below.

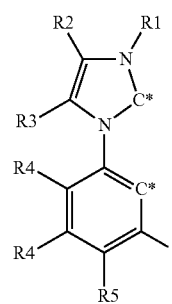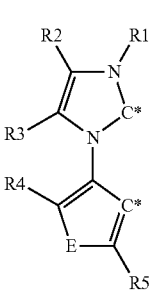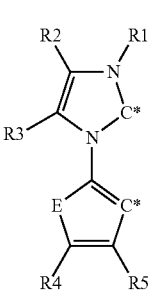

-continued

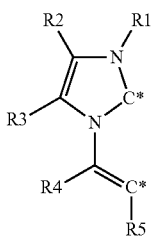

E = O, S, NR

R1-R6 are each substituents, which may be identical to or independently different from one another. These are selected from the substituent groups mentioned above for R1-R6.

Since the states leading to emission essentially result from the metal-metal interaction, the ligands of the transition-metal complexes which are part of the compositions according to the invention have, in one embodiment of the invention, no chromophoric π systems.

In the following formulae,

NL1-NL3=neutral monodentate ligands, and

AL1-AL3=anionic monodentate ligands.

Examples of neutral, monodentate ligands are, for example, carbonyl CO, nitriles NCR', isonitriles CNR" and oxazoles. It is also possible to use nitriles or isonitriles which are substituted by a large organic group R (as defined above). Suitable neutral ligands are also compounds which coordinate via N, P, S, O, As or Se.

Anionic, monodentate ligands are, for example, cyanide CN⁻, chloride Cl⁻, bromide Br⁻, iodide I⁻, RS⁻, RO⁻, SCN⁻, OCN⁻, aryl groups, alkenyl groups, alkynyl groups or borates.

Particularly preferred neutral transition-metal complexes of the composition are mentioned below by way of example. In a preferred embodiment of the invention, the composition according to the invention comprises at least one, preferably at least two, of the transition-metal complexes mentioned below. Particular preference is furthermore given to metal complexes containing a tetradentate ligand, such as, for example, the complexes disclosed in WO 05/042550.

Ir(I) complexes

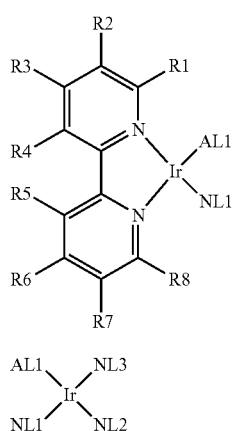

-continued

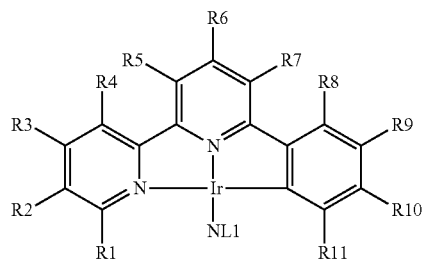

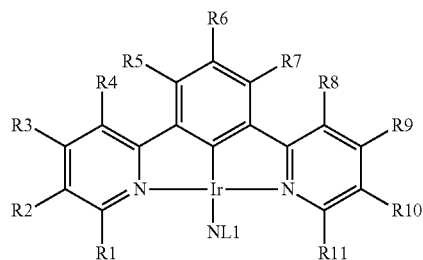

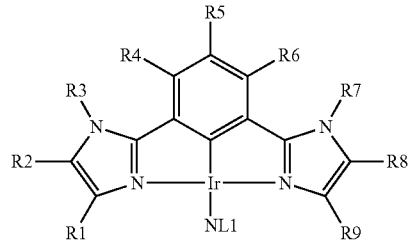

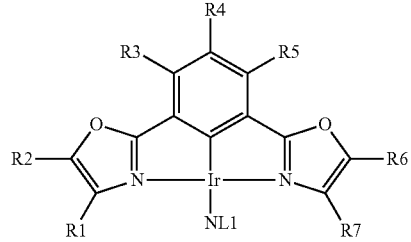

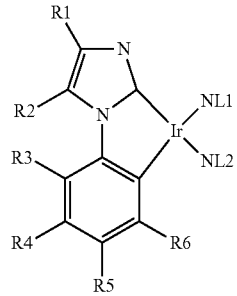

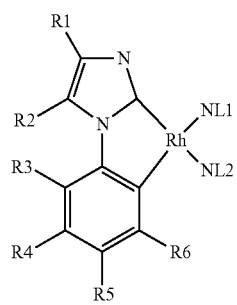

Rh(I) complexes
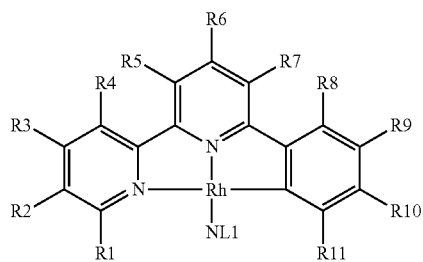
9
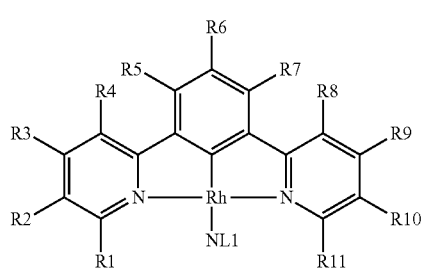
10
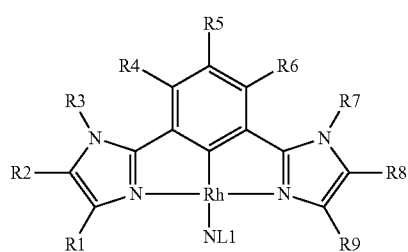
11
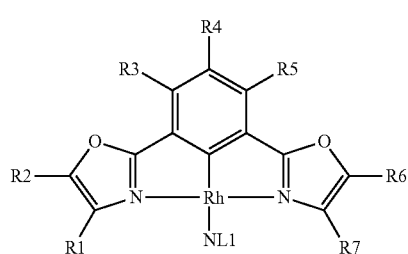
12
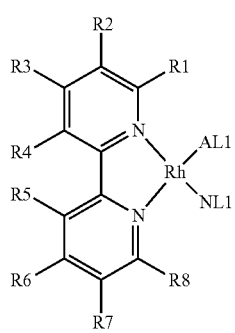
13
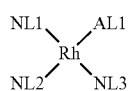
14
Pt(II) complexes
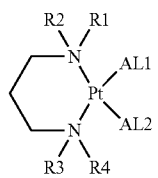
15
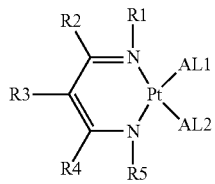
16
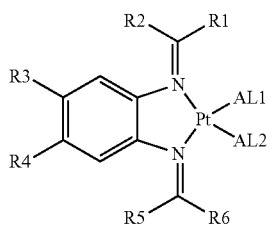
17
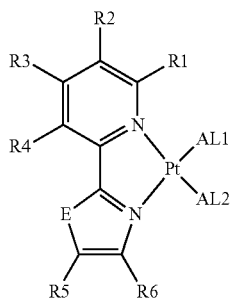
18
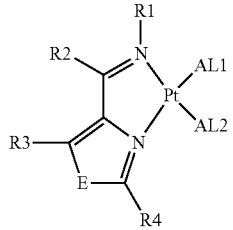
19
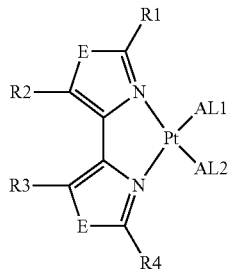
20

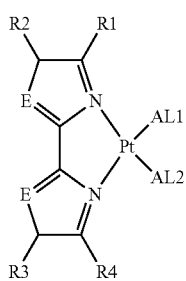
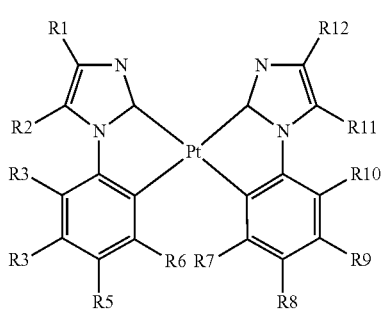
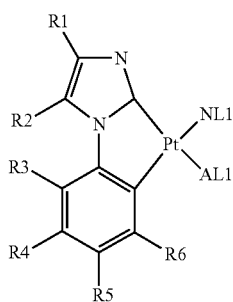
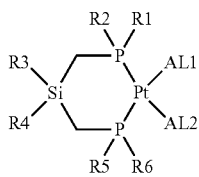
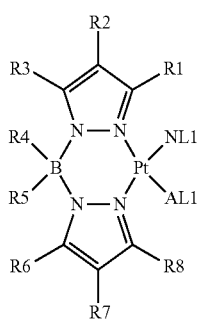
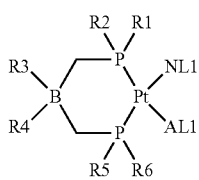
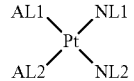
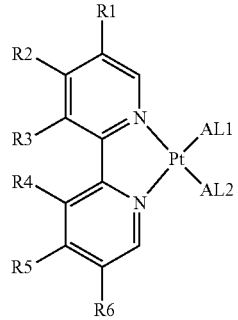
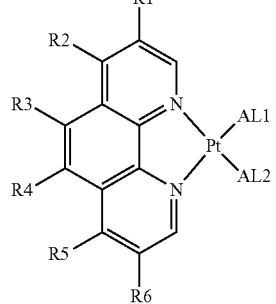
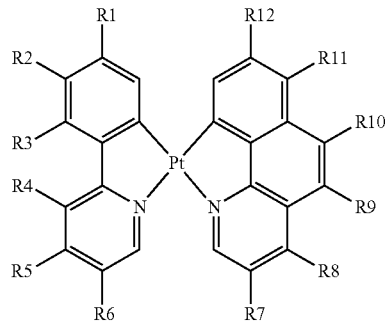
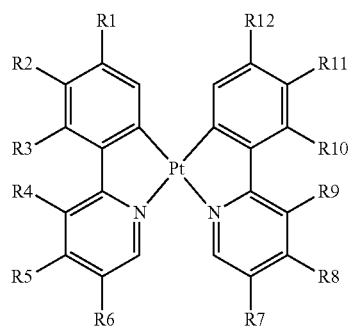

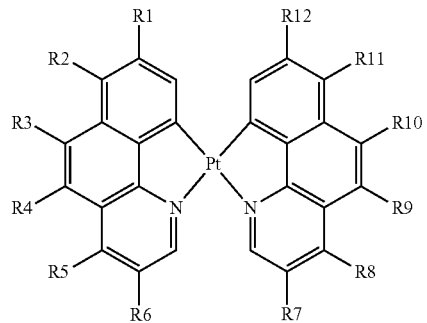
32
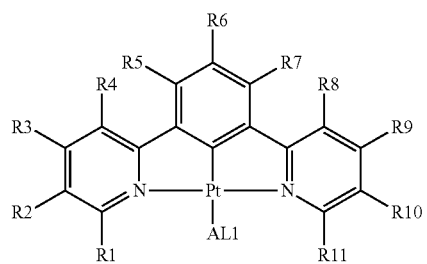
33
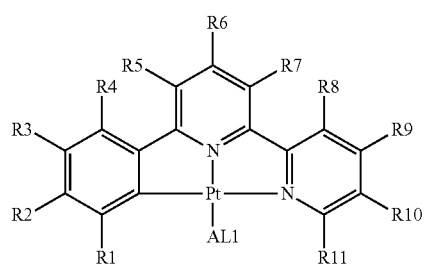
34
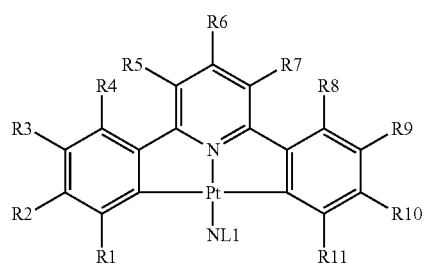
35
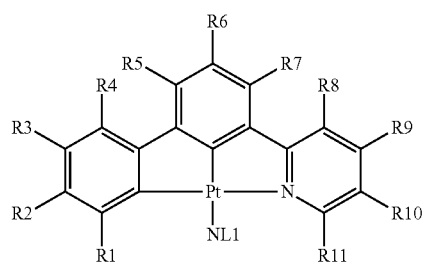
36
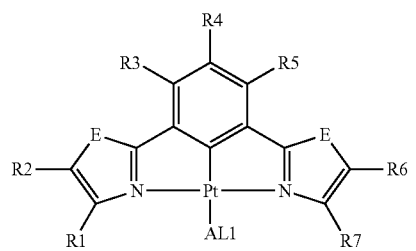
37
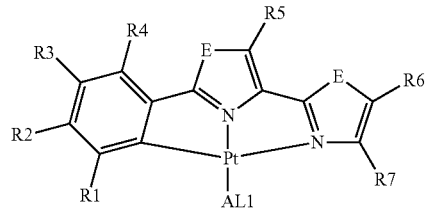
38
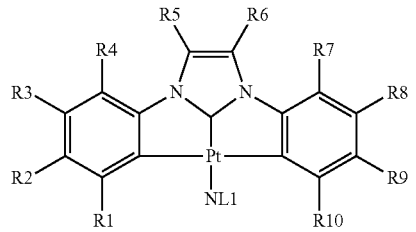
39
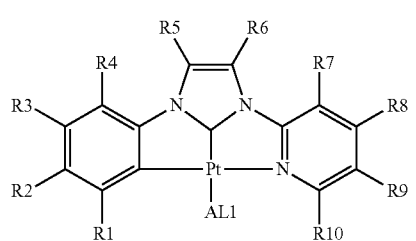
40
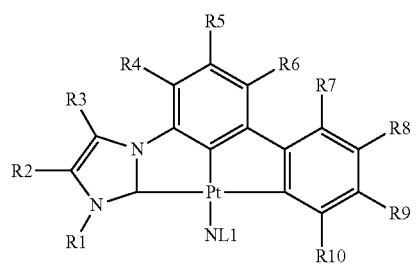
41
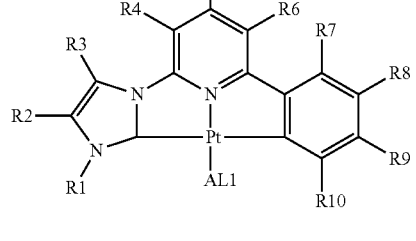
42
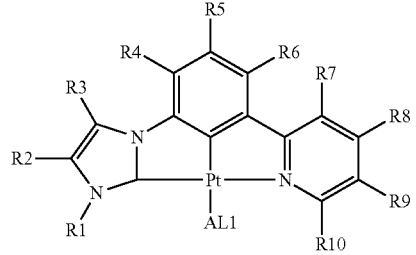
43

44
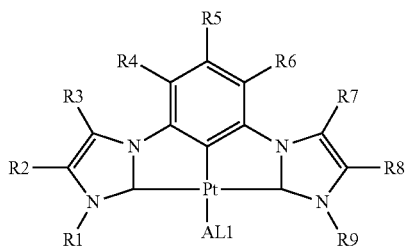
45
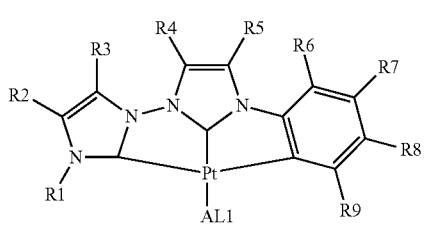
46
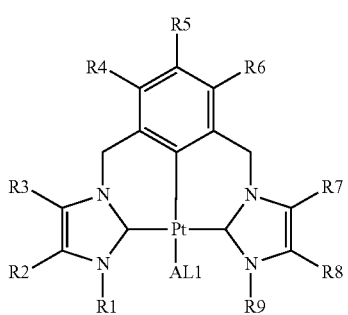
47
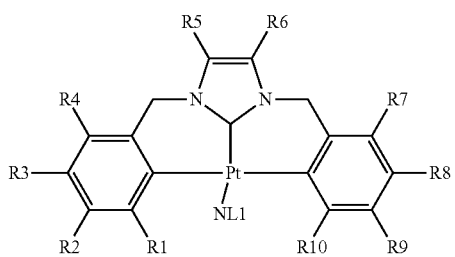
48
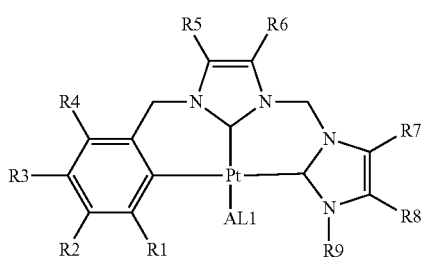
49
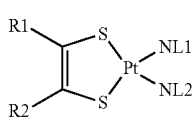
50
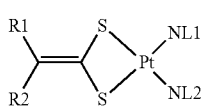
51
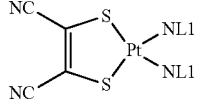
52
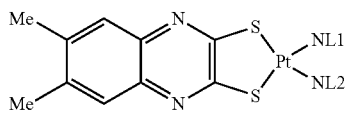
53
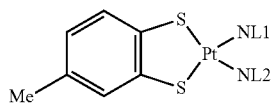
54
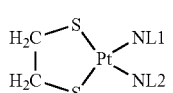
55
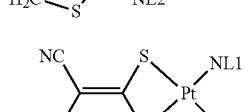
56
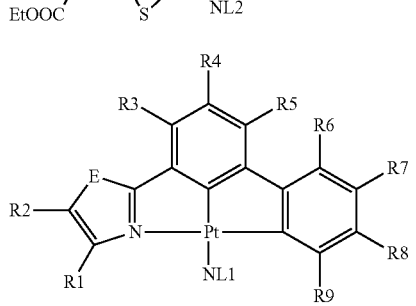
57
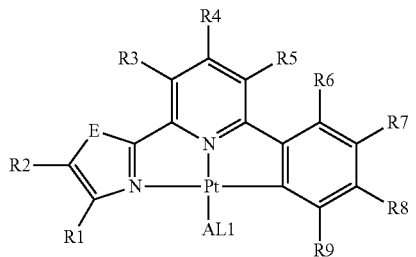
58
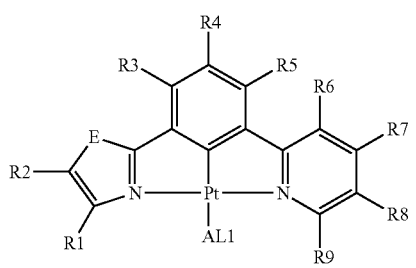
59
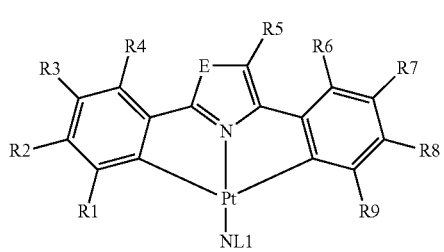

23
-continued
60
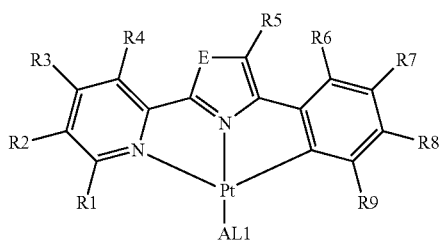
61
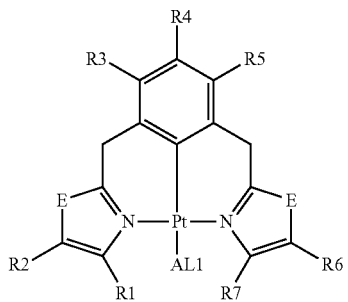
62
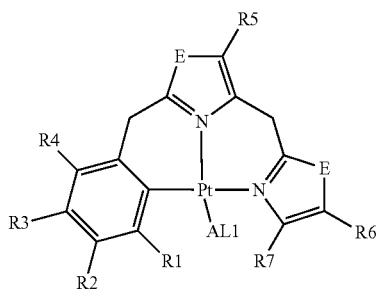
63
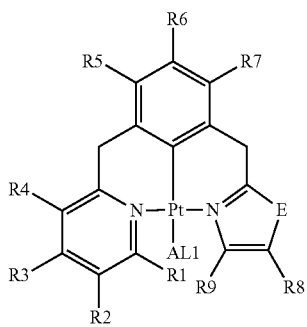
64
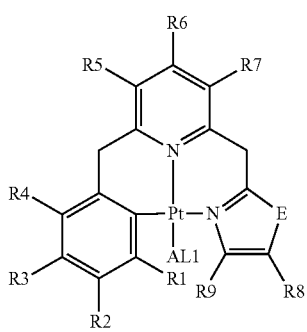
24
-continued
65
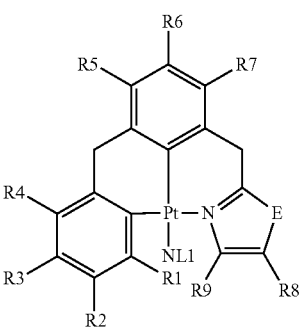
66
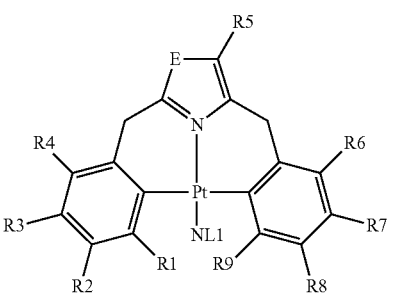
67
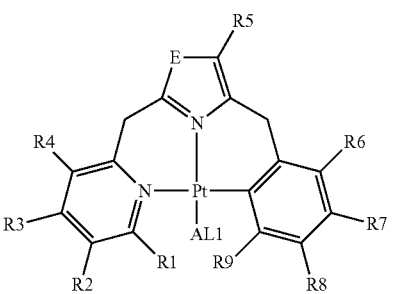
68
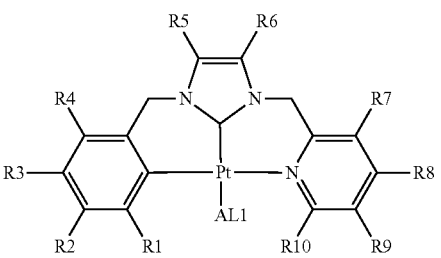
69
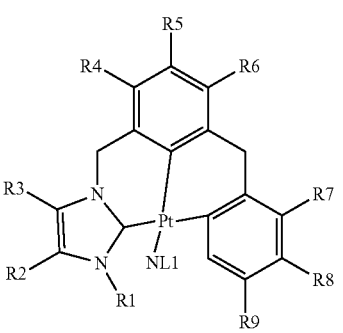

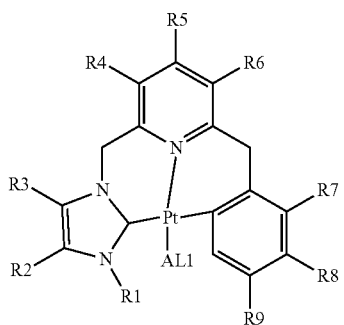
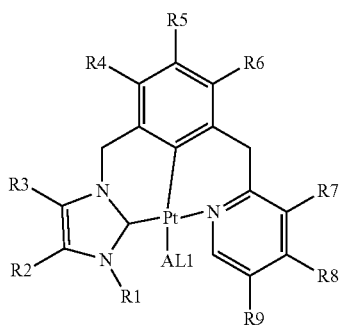
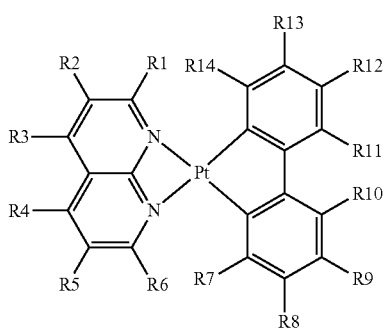
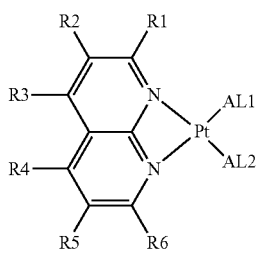
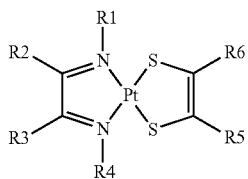
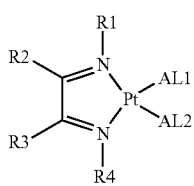
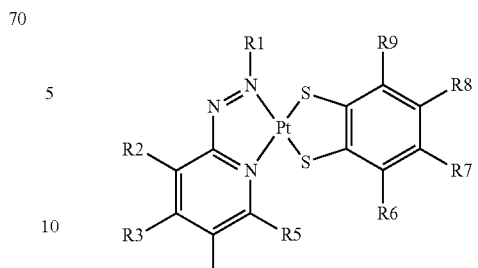
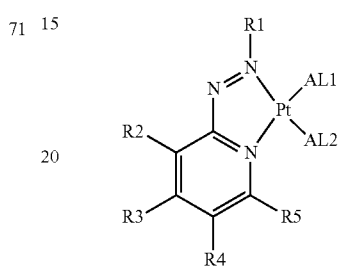
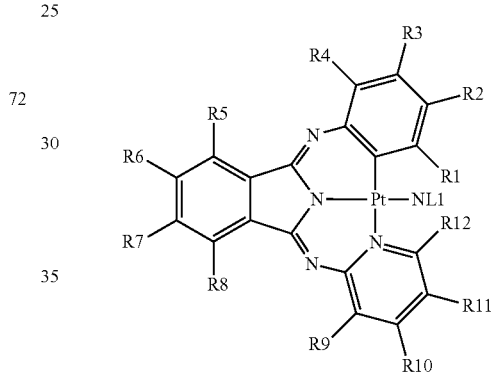
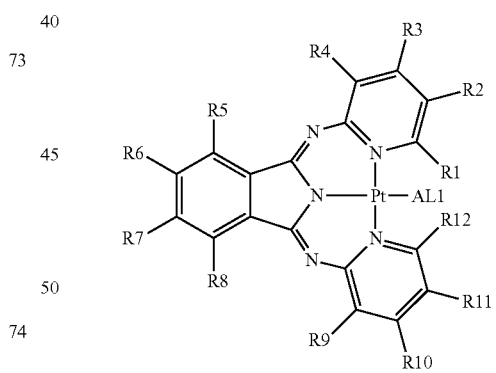
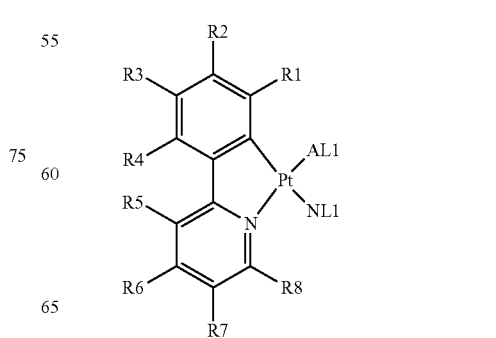

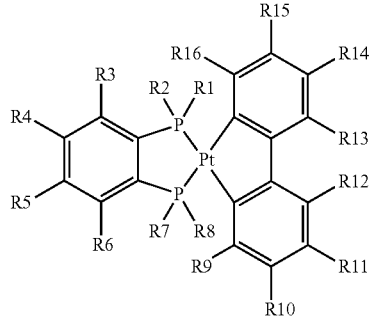
81
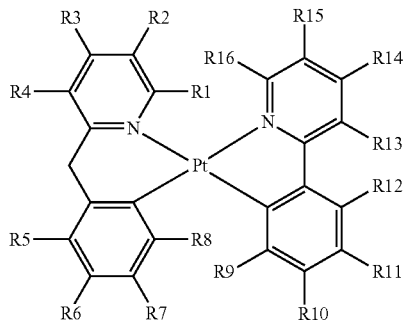
87
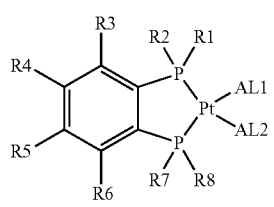
82
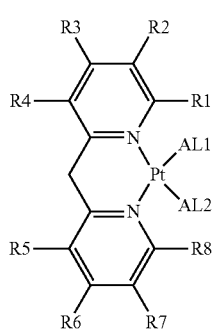
88
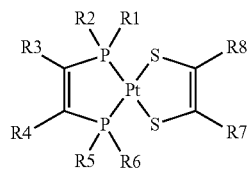
83
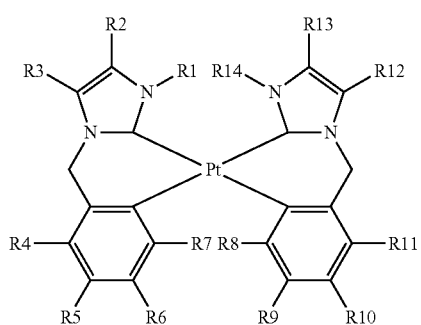
89
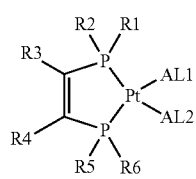
84
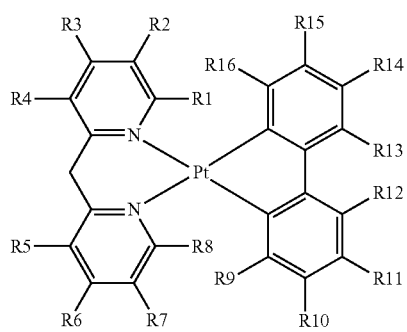
85
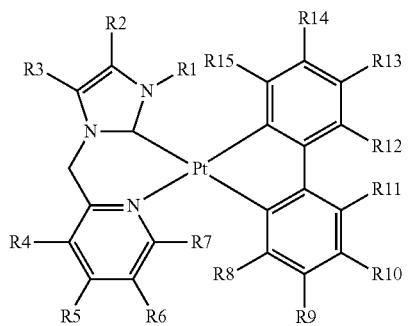
90
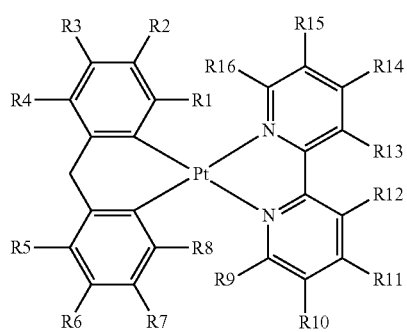
86
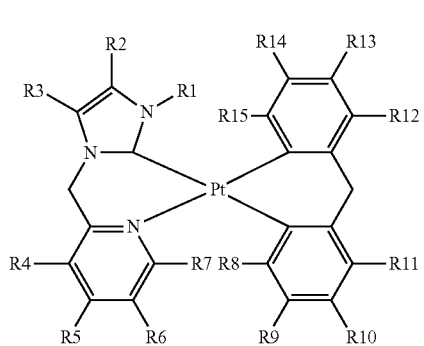
91

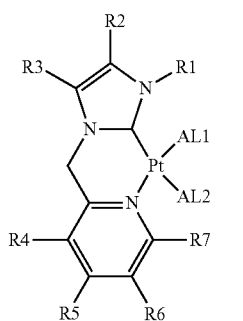
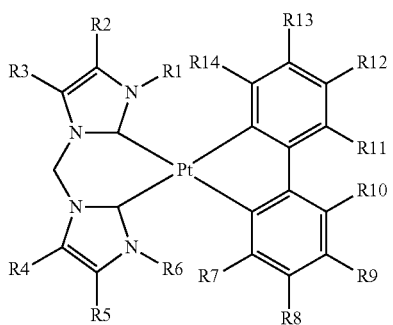
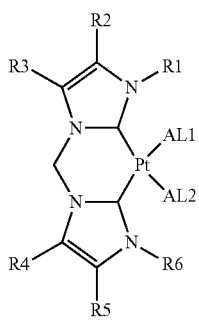
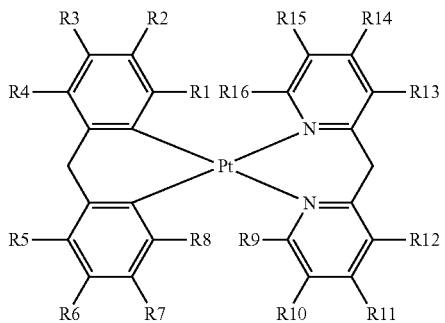
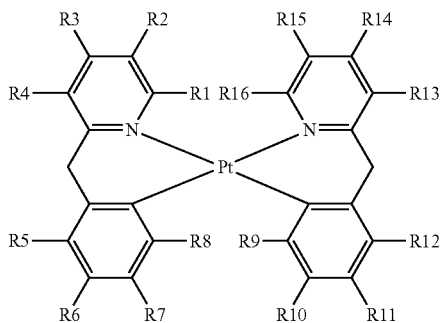
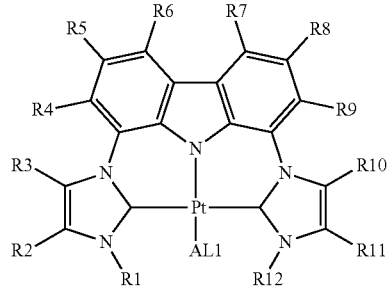
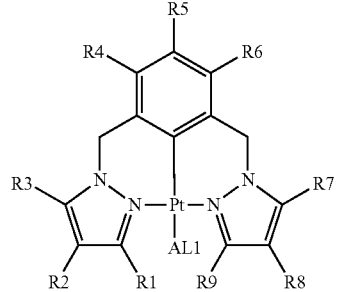
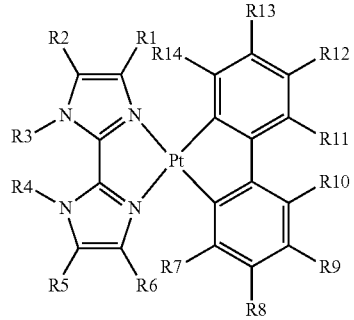
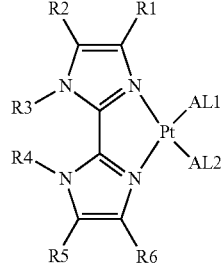
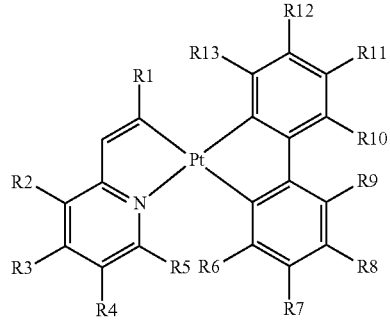

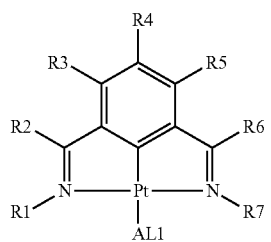
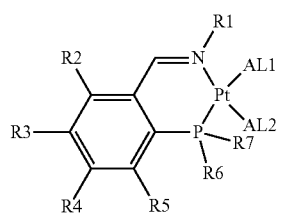
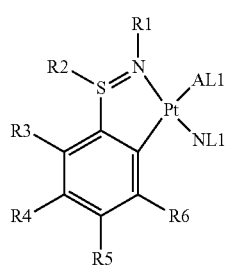
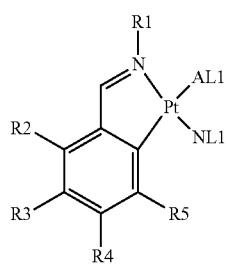
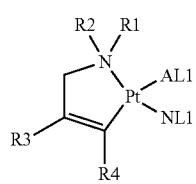
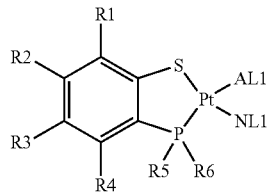
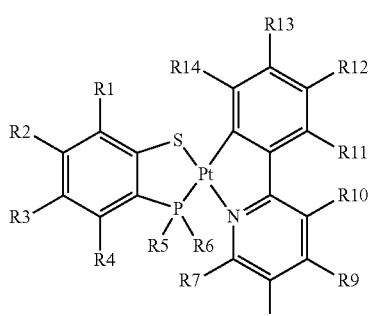
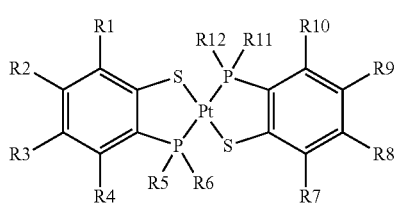
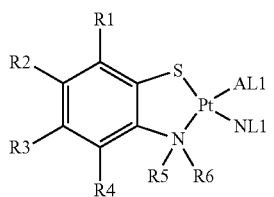
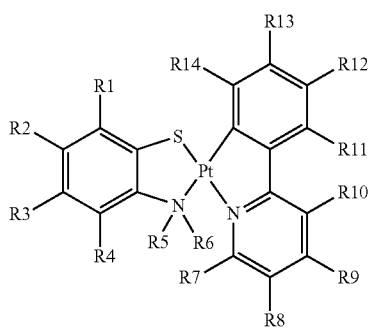
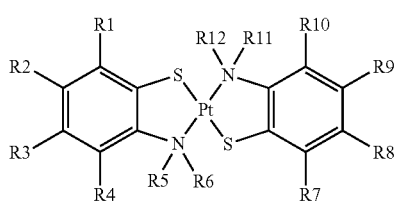
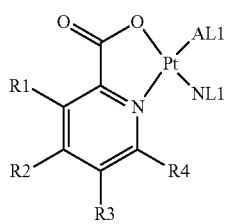

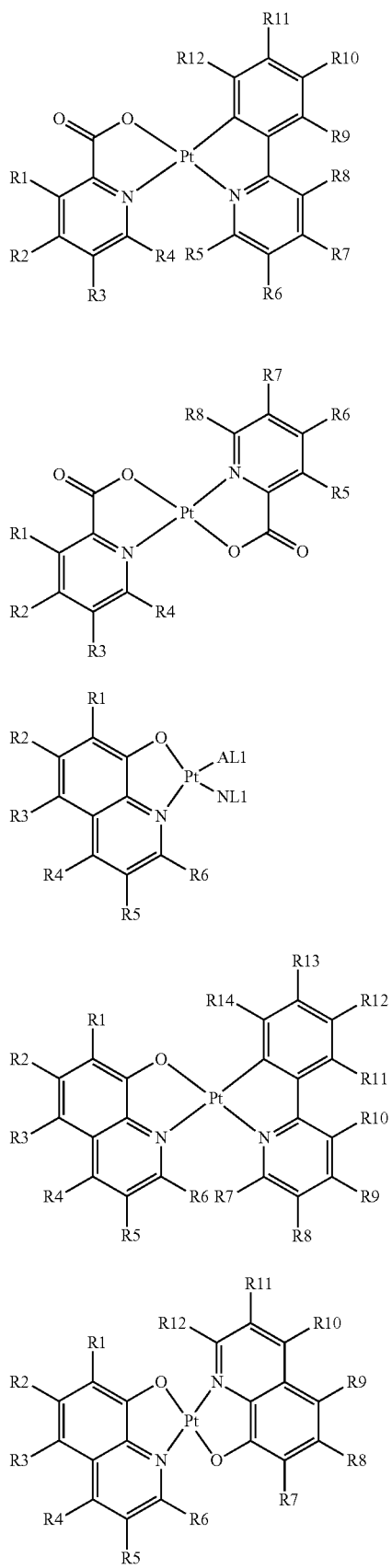
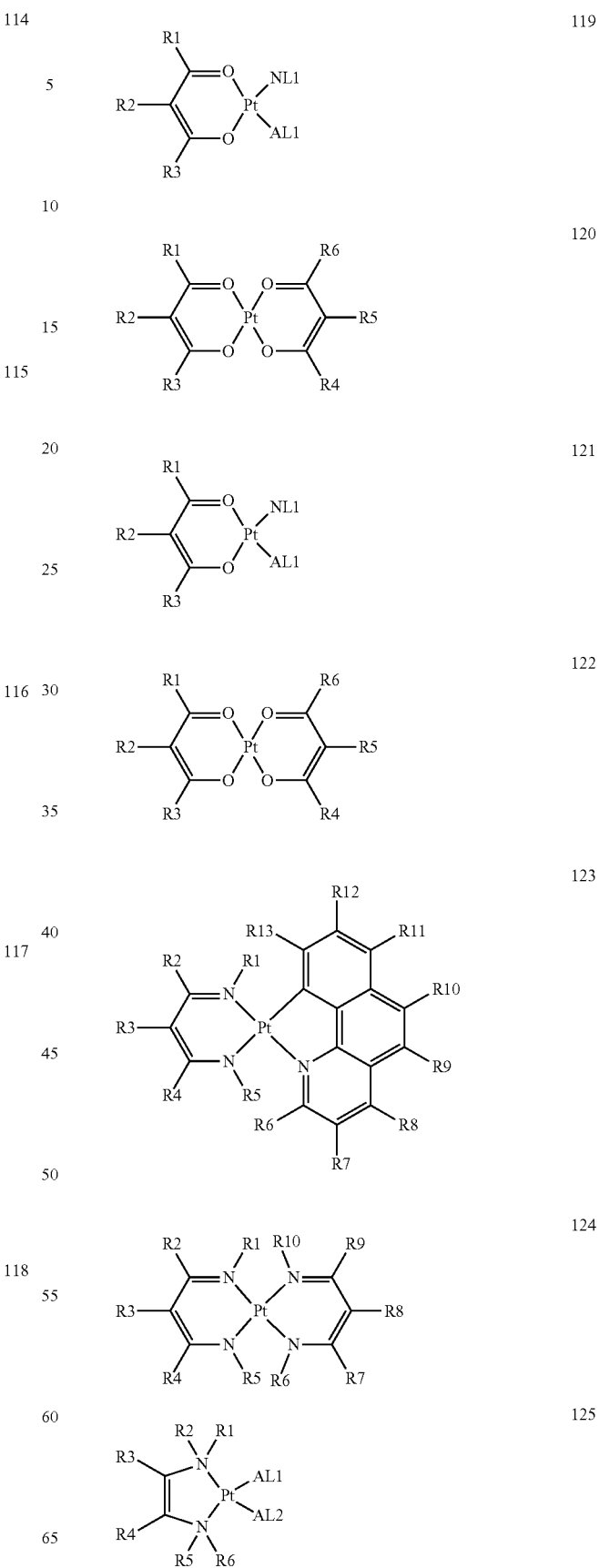

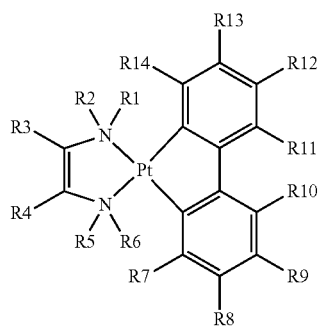
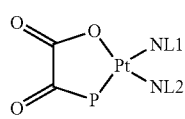
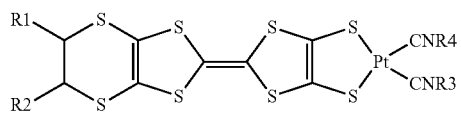
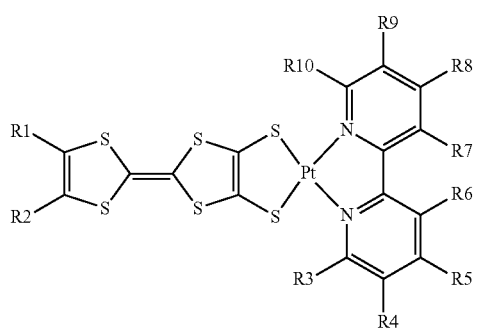
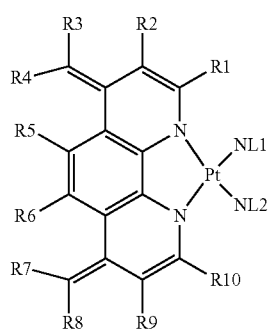
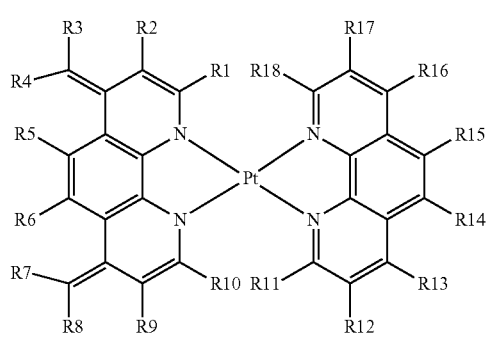
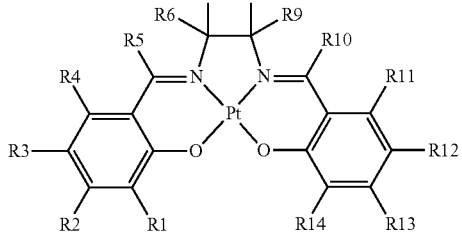
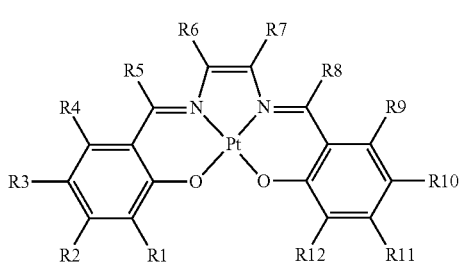
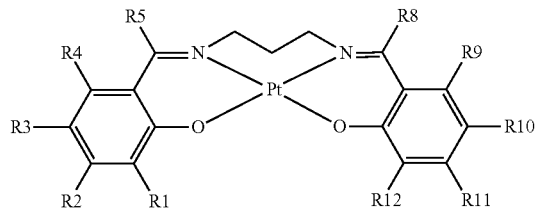
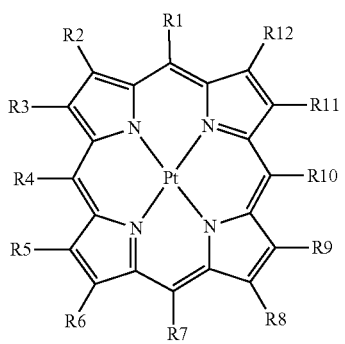
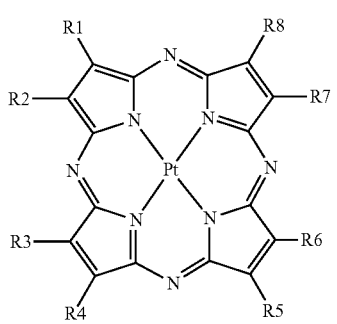

Pd(II) complexes
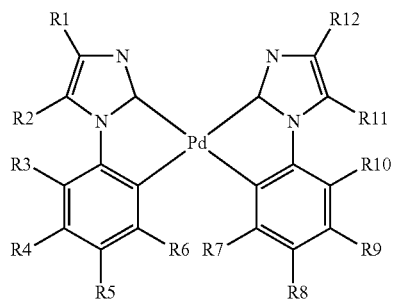
137
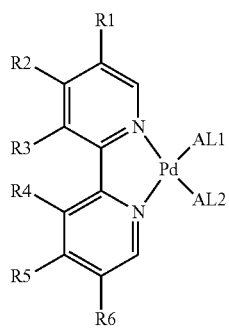
138
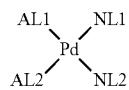
139
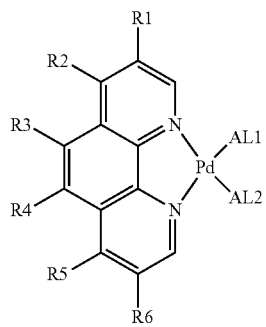
140
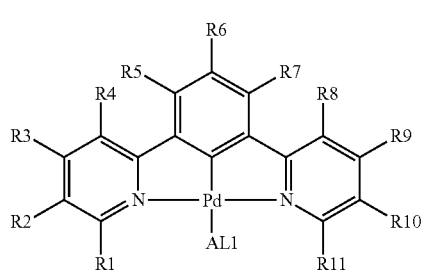
141
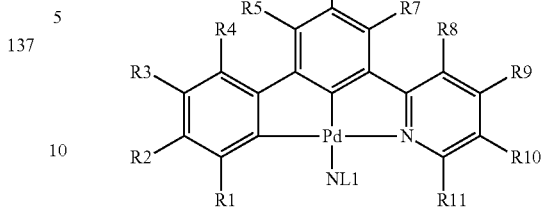
142
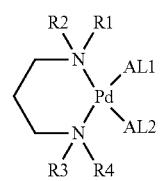
143
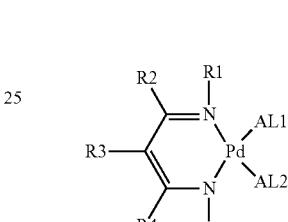
144
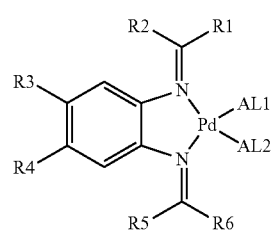
145
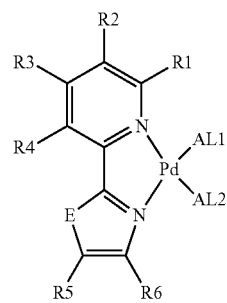
146
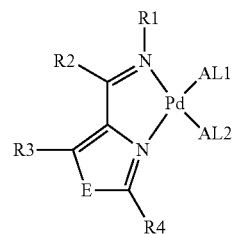
147

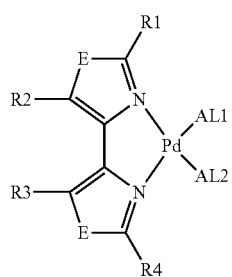
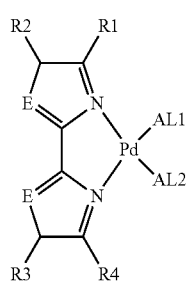
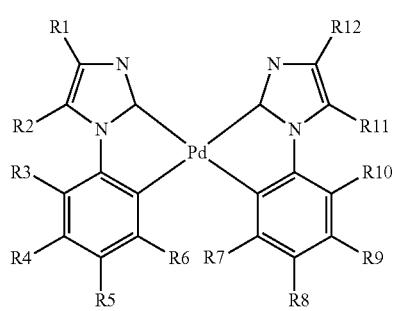
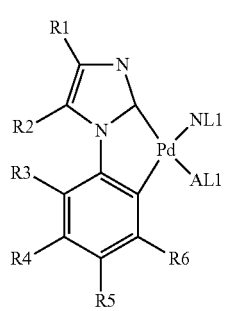
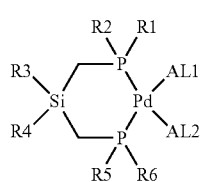
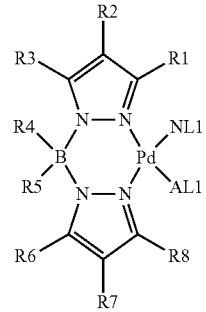
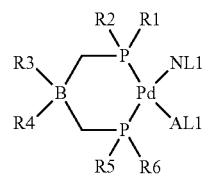
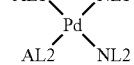
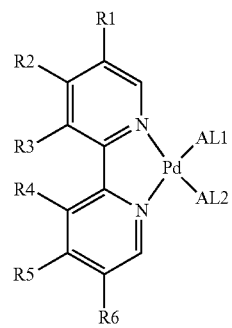
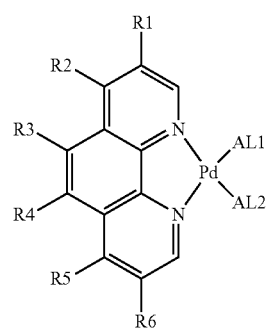
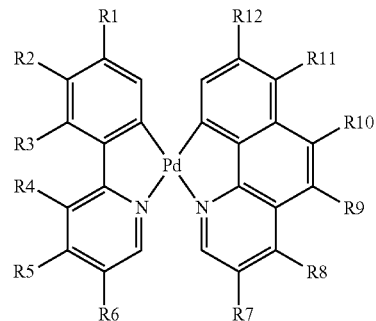

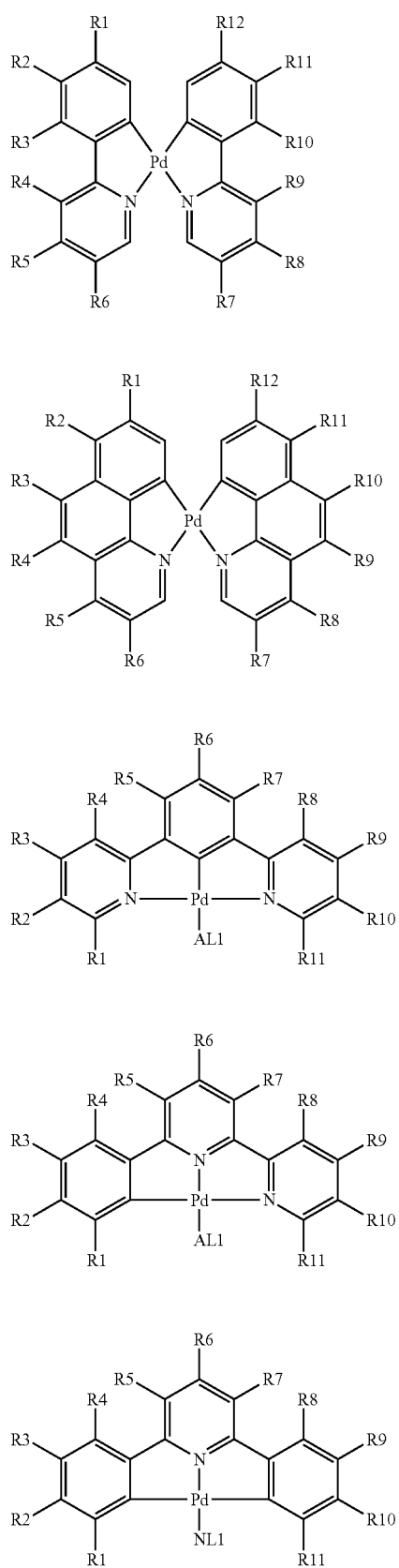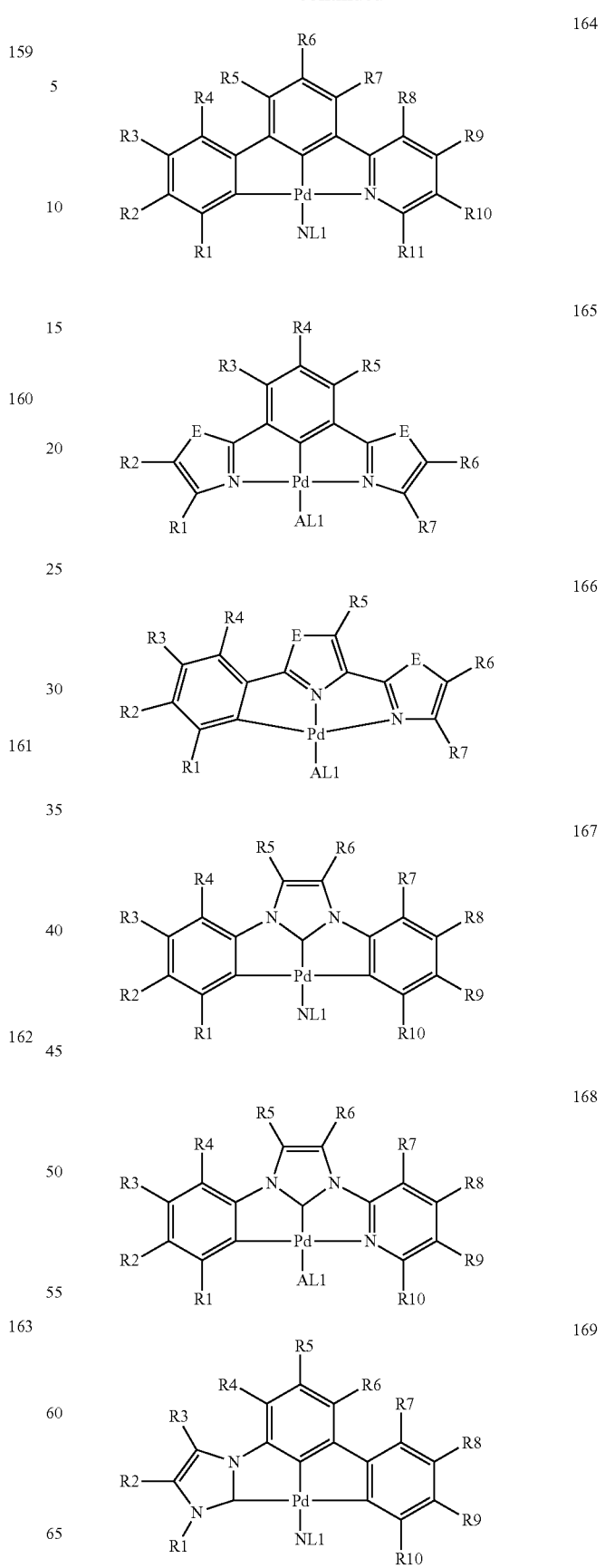

170 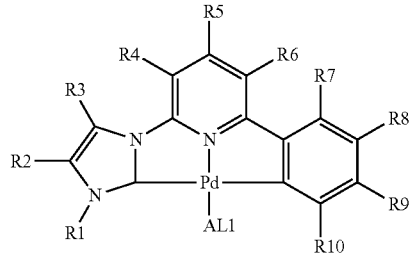
171 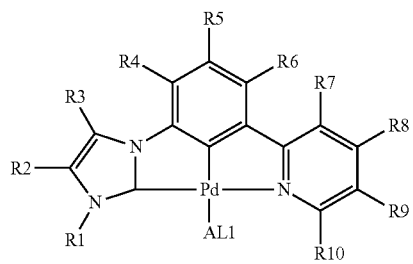
172 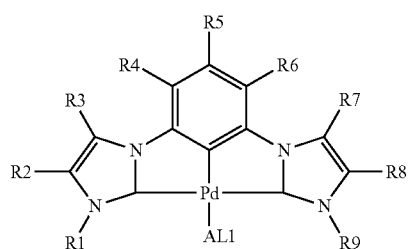
173 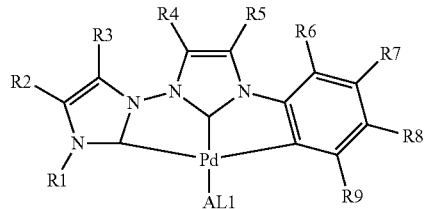
174 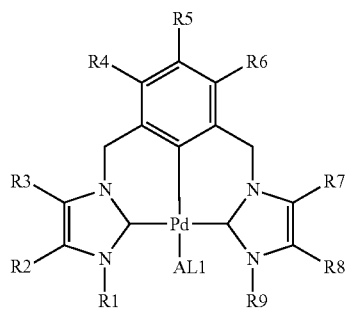
175 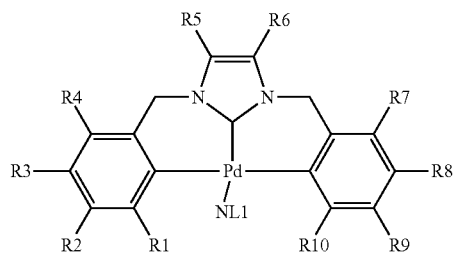
176 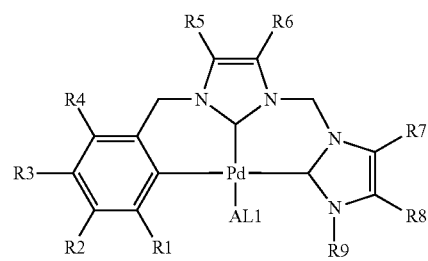
177 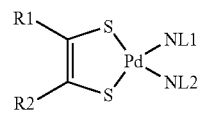
178 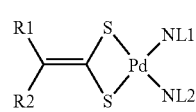
179 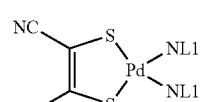
180 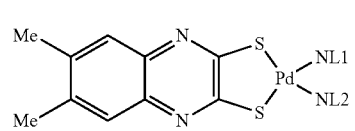
181 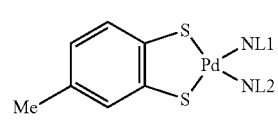
182 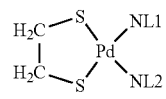
183 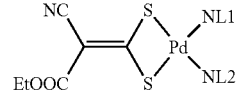
184 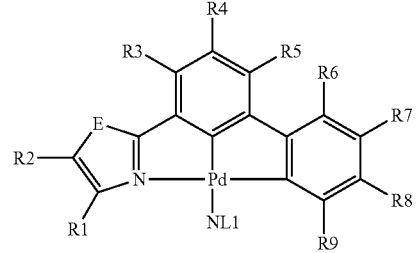
185 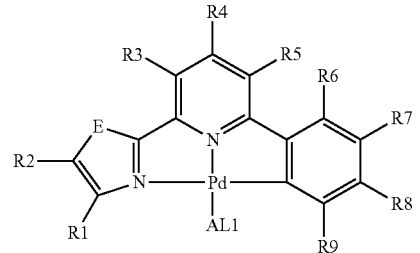

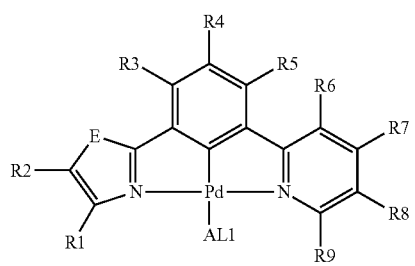
186
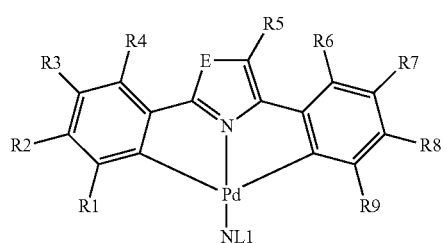
187
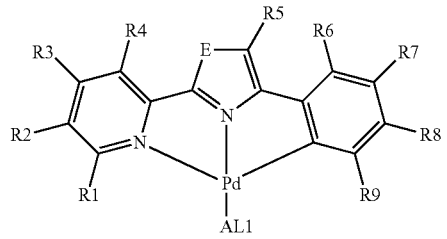
188
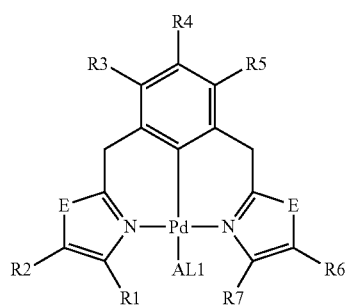
189
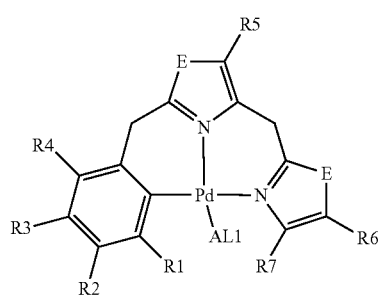
190
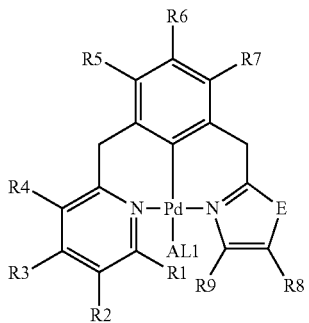
191
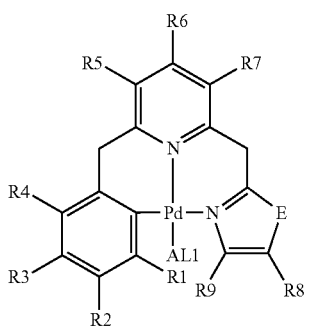
192
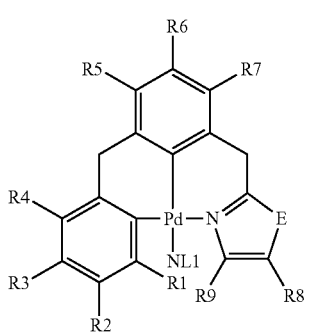
193
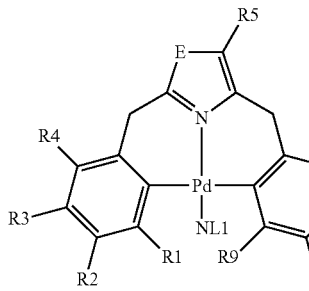
194
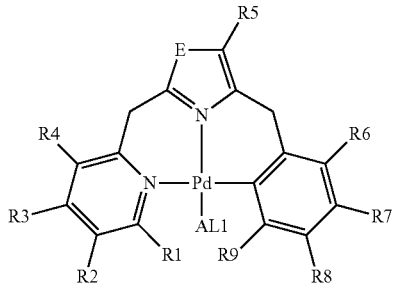
195

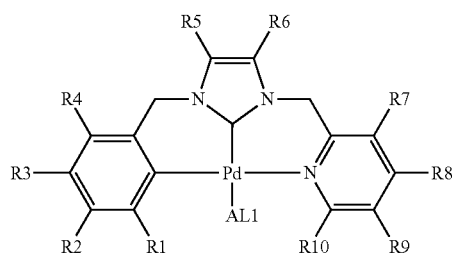
196
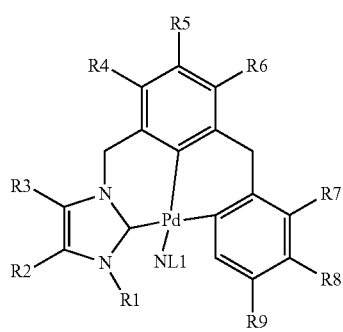
197
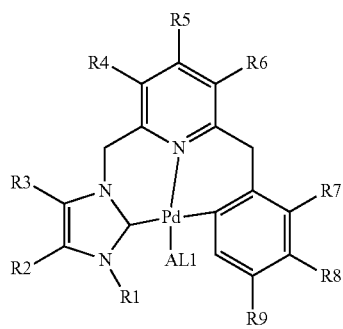
198
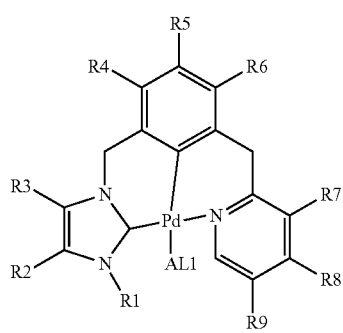
199
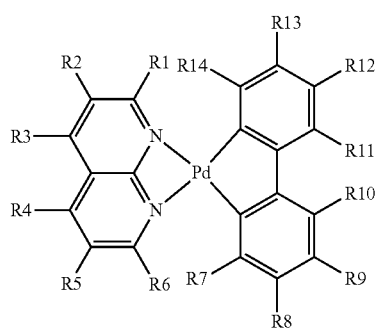
200
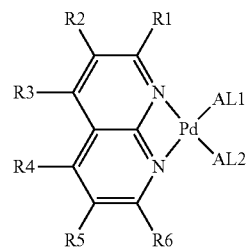
201
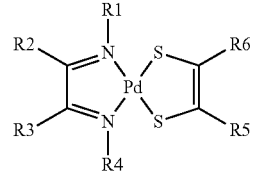
202
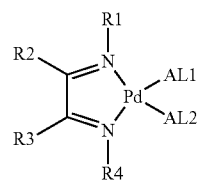
203
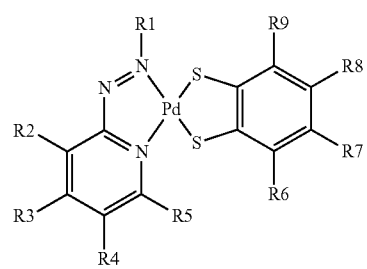
204
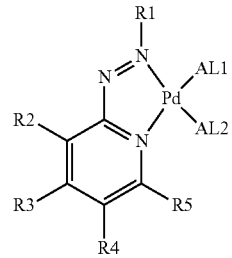
205
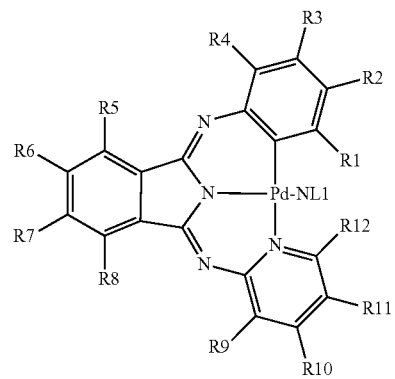
206

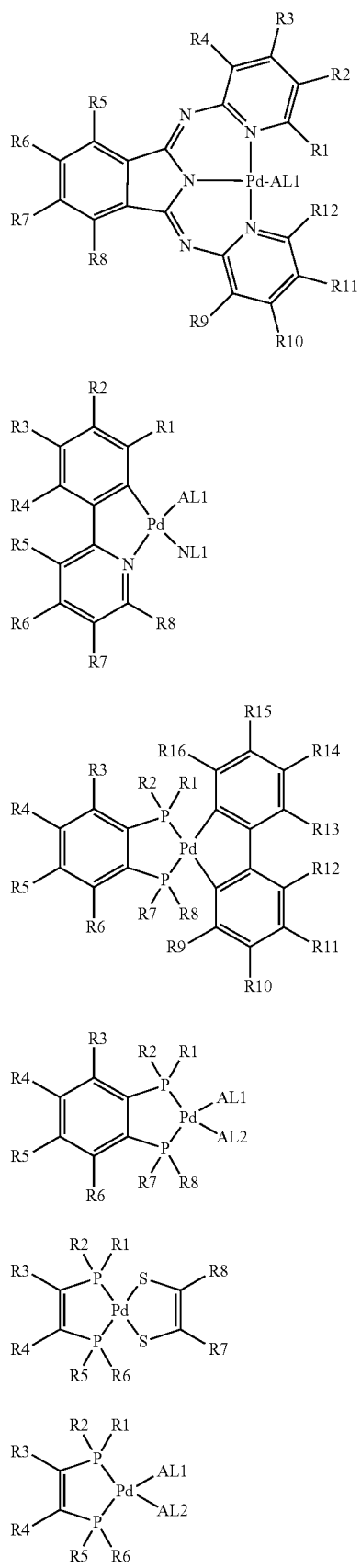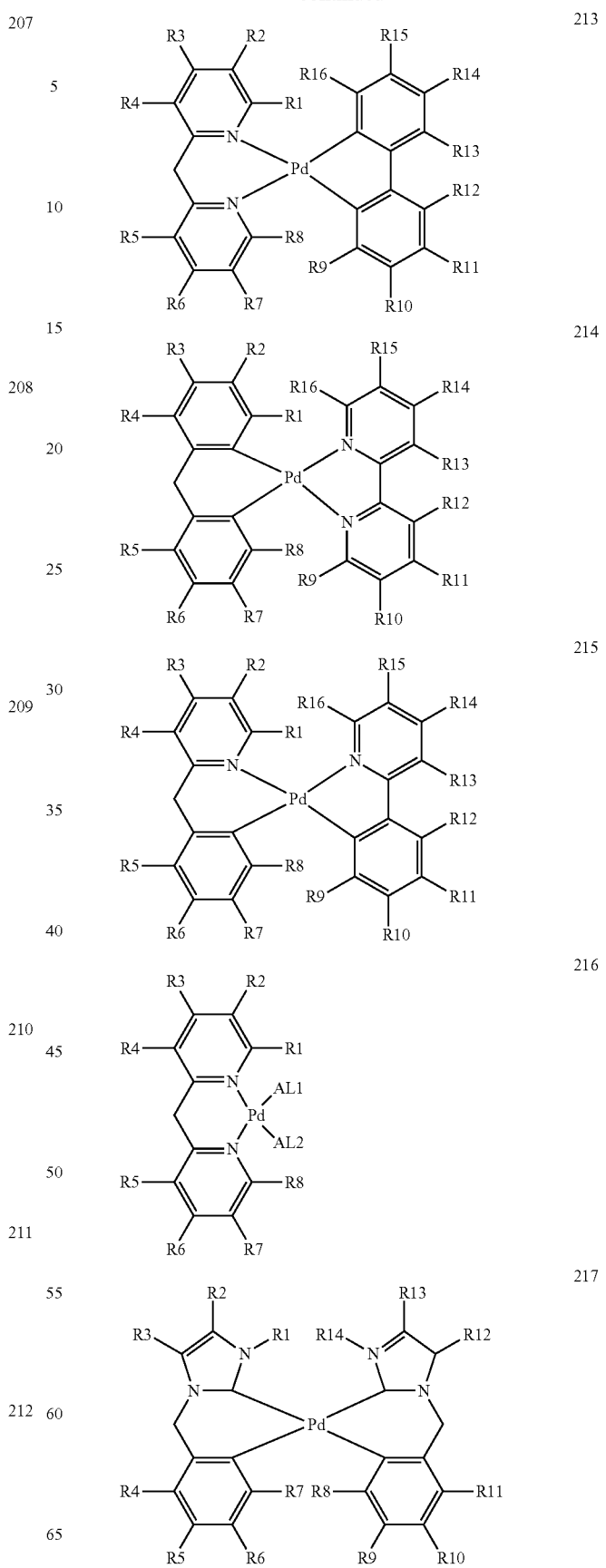

51
-continued
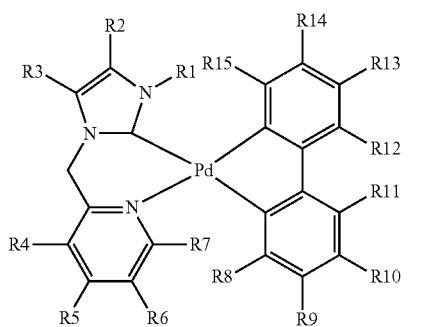
218
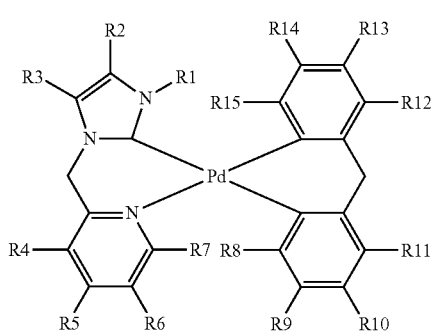
219
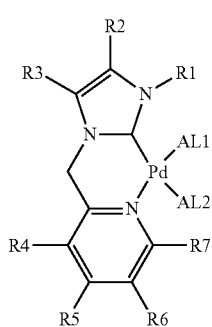
220
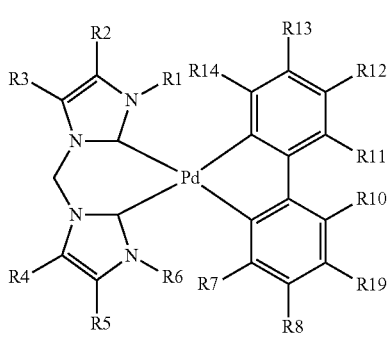
221
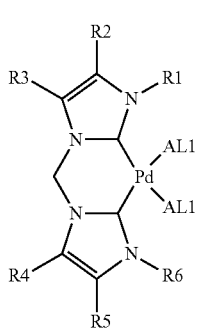
222
52
-continued
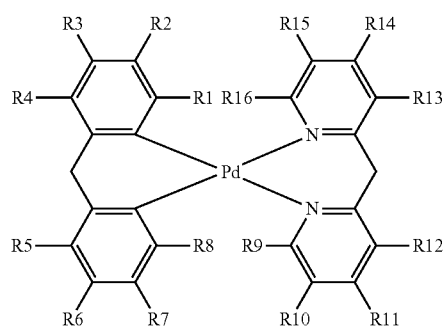
223
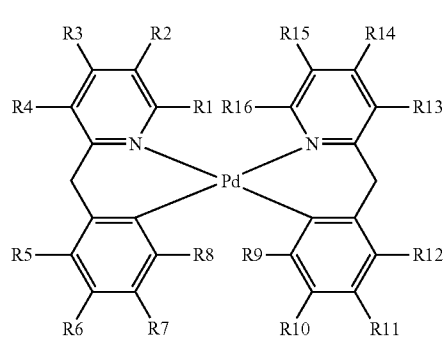
224
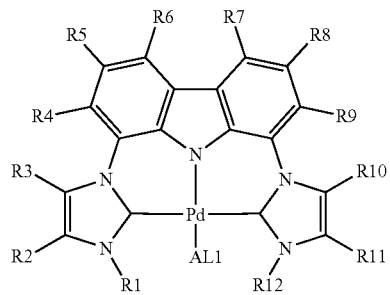
225
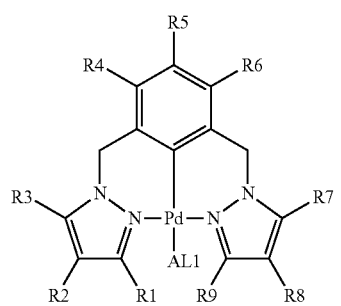
226
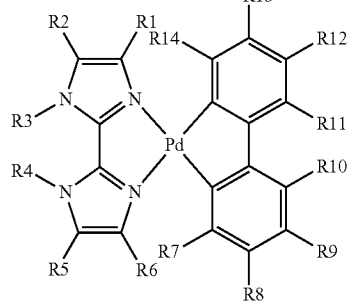
227

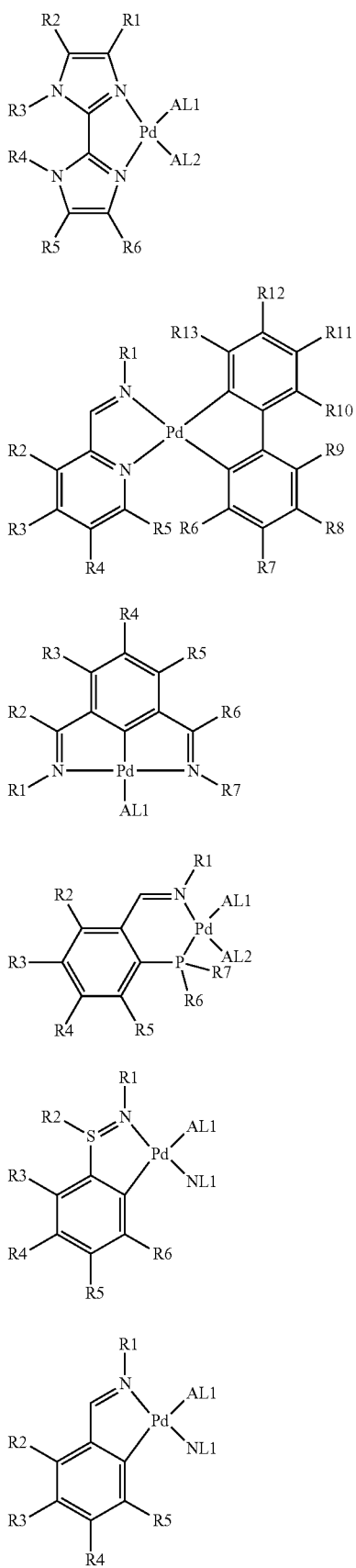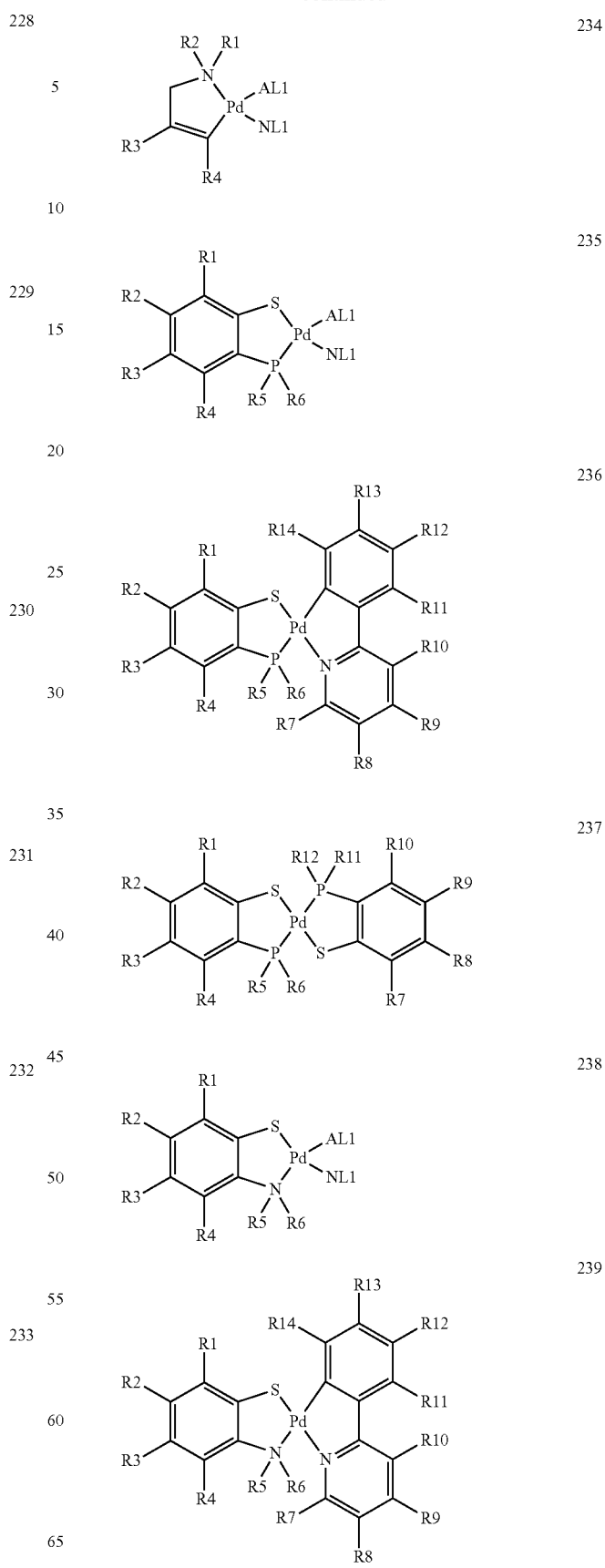

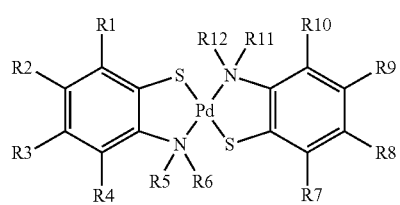
240
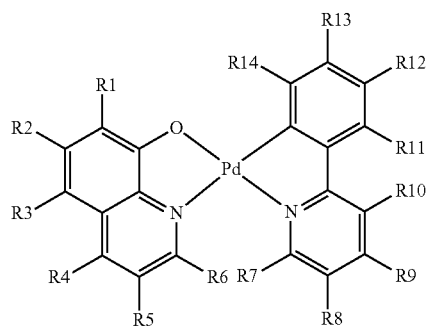
245
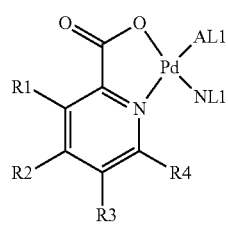
241
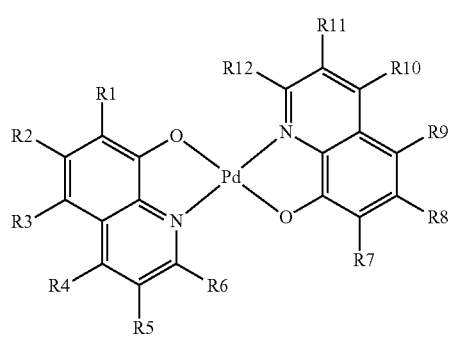
246
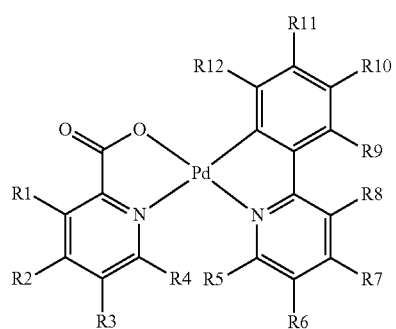
242
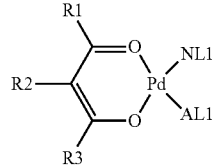
247
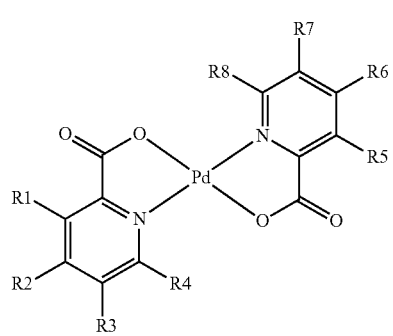
243
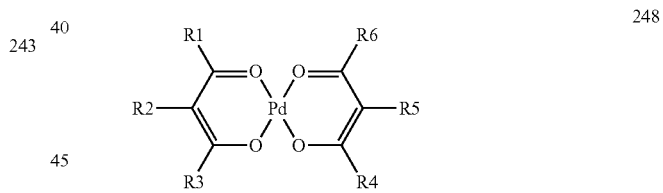
248
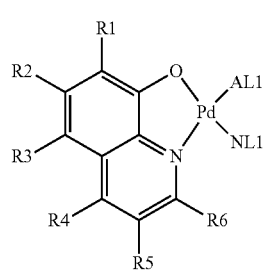
244
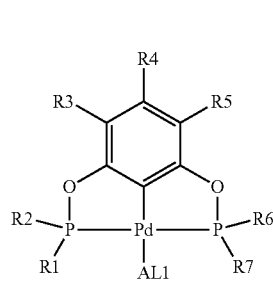
249
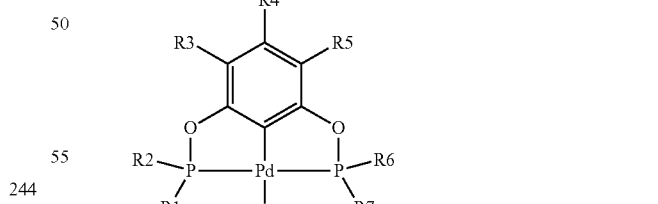
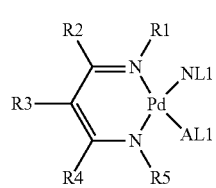
250

251 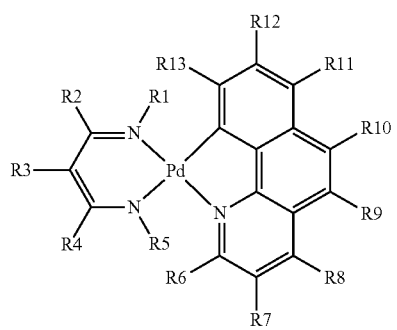
252 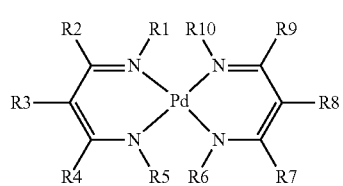
253 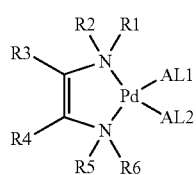
254 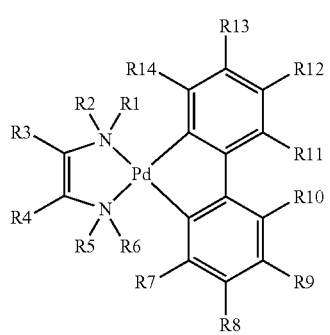
255 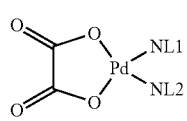
256 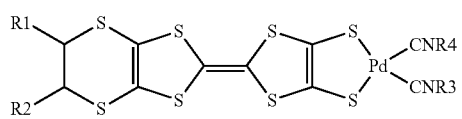
257 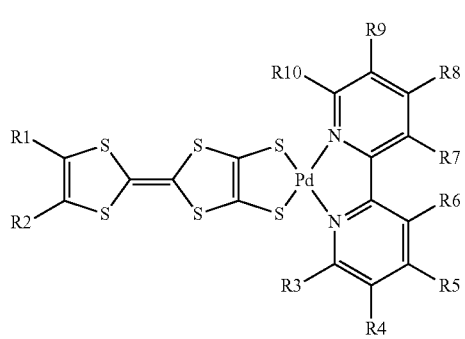
258 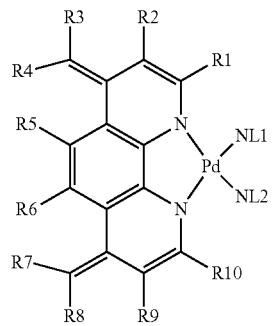
259 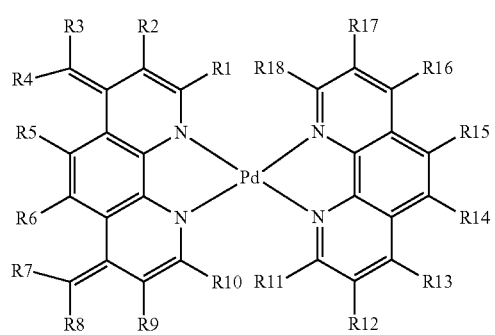
260 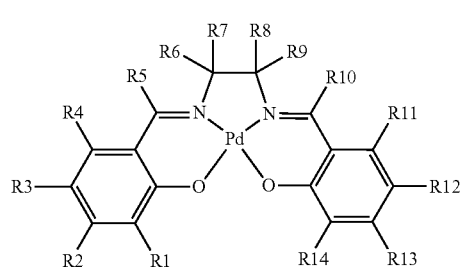
261 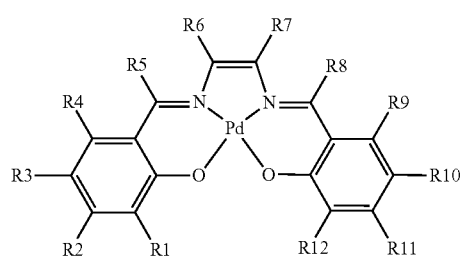
262 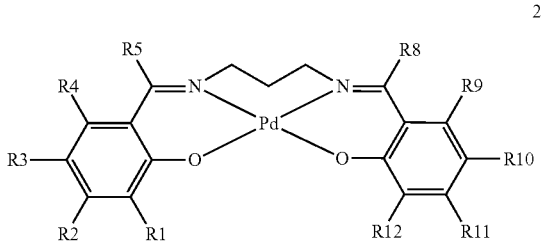

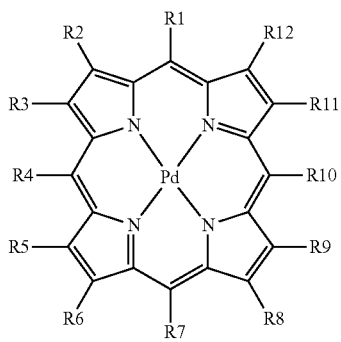

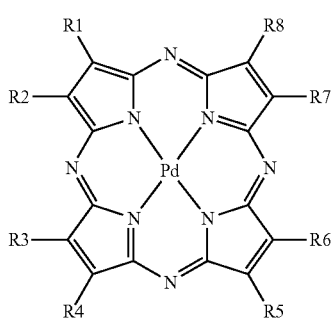

Au(III) complexes

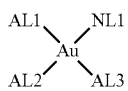

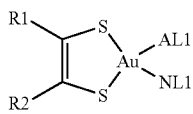

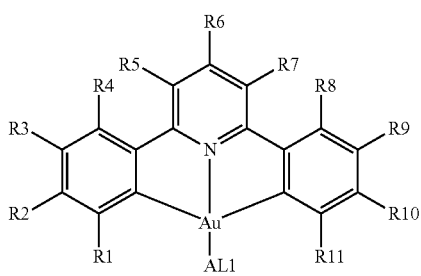

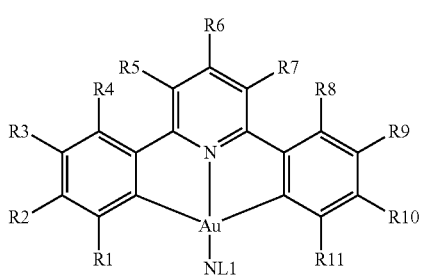

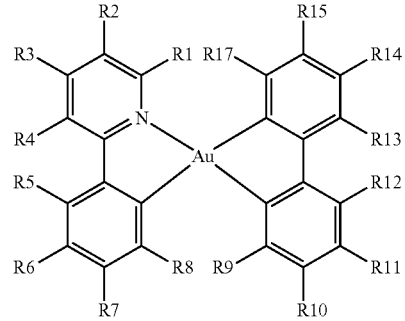

263

264

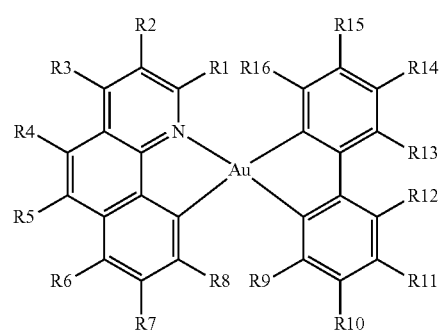

269

270

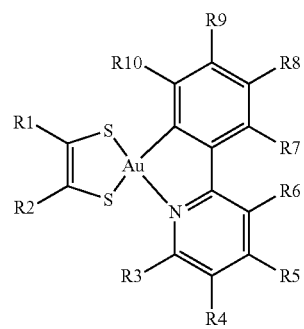

271

The radicals in the structures depicted above have the same meaning as described above for the radicals R1 to R8.

In the use according to the invention, the first neutral transition-metal complex of the composition is preferably one of compounds 1 to 271 mentioned above. In a further embodiment, the second neutral transition-metal complex of the composition is also compounds 1 to 271 mentioned above. If the composition comprises a third, fourth and/or fifth transition-metal complex, this is also preferably one of compounds 1 to 271 mentioned above. However, it can in principle be any neutral transition-metal complex, in particular in the forms described above, so long as it has a square-planar or quasi-square-planar structure and/or is capable of the formation of a columnar structure.

In a further preferred embodiment of the invention, the composition according to the invention consists exclusively (to the extent of 100%) of the first transition-metal complex and the second transition-metal complex, without further components being present. The ratio of these two components is usually as desired, i.e. can be, for example, 0.001%:99.999%, 10%:90%, 20%:80%, 30%:70%, 40%:60%, 50%:50%, 60%:40%, 70%:30%, 80%:20%, 90%:10% or 99.999%:0.001%. A ratio of the two components of 40%:60% to 60%:40%, in particular 50%:50%, is preferred. The optimum ratio for the respective transition-metal complexes used can easily be determined by a person skilled in the art by means of routine experiments. A person skilled in the art will usually optimise in accordance with emission colour, emission lifetime, absorption energy and/or absorption strength.

In a further embodiment of the invention, the proportion of the first transition-metal complex and of the second transition-metal complex together on use of the composition is 1% to less than 100%, preferably 10% to 90%, particularly preferably 20% to 80%. The remainder to 100% then consists of at least one further (third, fourth and/or fifth) neutral transition-metal complex and/or of a further constituent, for example a dopant or a host material.

In a further aspect, the invention relates to an electronic component which comprises a composition which comprises a first neutral transition-metal complex and a second neutral transition-metal complex, where the first transition-metal complex and the second transition-metal complex together form a columnar structure.

A component of this type can be formed or implemented as a component selected from the group consisting of an organic light-emitting component, an organic diode, an organic solar cell, an organic transistor and an organic light-emitting device.

If the component is in the form of an organic solar cell (OSC), the composition is arranged in an absorber layer or is part of the absorber layer. The first transition-metal complex and the second transition-metal complex here together preferably make up 10% to 100% of the composition. The remaining 90% to 0% is matrix material of the OSC, which serves for transport of holes or electrons. The composition may also comprise further transition-metal complexes, where the proportion of the composition in the absorber layer of the OSC is at least 10%, preferably 20% to 50%, particularly preferably greater than 50%.

If the component is in the form of an organic electroluminescent device (OLED), the composition is arranged in an emission layer or is part of the emitter layer. In an embodiment of an OLED of this type, the first transition-metal complex and the second transition-metal complex together make up 1% to 100% of the composition, without further components being present. The ratio of these two components is usually as desired, i.e. can be, for example, 10%:90%, 20%:80%, 30%:70%, 40%:60%, 50%:50%, 60%:40%, 70%:30%, 80%:20% or 90%:10%. A distribution of 0.001%:99.999% or vice versa is also possible. The optimum ratio for the respective transition-metal complexes used can easily be determined by a person skilled in the art by means of routine experiments.

In an alternative embodiment of an OLED according to the invention, the first transition-metal complex and the second transition-metal complex together make up 1% to less than 100% of the composition, preferably 1% to 10% of the composition. The 1% to 99% missing from 100% is matrix material of the OLED, which serves for transport of holes or electrons. The matrix material may also be inert, since the substance compositions according to the invention have good hole- and electron-transport properties. The composition may also comprise further transition-metal complexes, where the proportion of the composition in the emission layer of the OLED is at least 1%, preferably at least 10% to 50%, particularly preferably greater than 50%. The emission colours and the other emission properties are determined by the modifications of the components of the transition-metal complex composition.

Suitable matrix materials are selected from ketones, for example in accordance with WO 04/013080, WO 04/093207, WO 06/005627 or the unpublished application DE 102008033943.1, triarylamines, carbazole derivatives, for example CBP(N,N-biscarbazolylbiphenyl) or the carbazole derivatives disclosed in WO 05/039246, US 2005/0069729, JP 2004/288381, EP 1205527 or WO 08/086,851, indolocarbazole derivates, for example in accordance with WO 07/063, 754 or WO 08/056,746, azacarbazoles, for example in accordance with EP 1617710, EP 1617711, EP 1731584, JP 2005/347160, bipolar matrix materials, for example in accordance with WO 07/137,725, silanes, for example in accordance with WO 05/111172, azaboroles or boronic esters, for example in accordance with WO 06/117052, triazine derivatives, for example in accordance with the unpublished application DE 102008036982.9, WO 07/063,754 or WO 08/056,746, or zinc complexes, for example in accordance with the unpublished application DE 102007053771.0, or mixtures of these materials.

In a preferred embodiment of an OLED according to the invention, the first transition-metal complex is a Pd(II) complex, and the second transition-metal complex is a complex selected from the group consisting of Pt(II) complexes, Ir(I) complexes, Rh(I) complexes and Au(III) complexes. It is particularly preferred here for the proportion of the first transition-metal complex to be 90% to 99.999% and for the proportion of the second transition-metal complex to be 10% to 0.001%. Thus, for example, a blue emission colour can be achieved.

In a further preferred embodiment of the OLED, the first transition-metal complex is a Pd(II) complex of the formulae 137 to 264, and the second transition-metal complex is a complex selected from the group consisting of the Pt(II) complexes of the formulae 15 to 136, the Ir(I) complexes of the formulae 1 to 7, the Rh(I) complexes of the formulae 8 to 14 and the Au(III) complexes of the formulae 265 to 271. It is particularly preferred here for the proportion of the first transition-metal complex to be 90% to 99.999% and for the proportion of the second transition-metal complex to be 10% to 0.001%. Irrespective of the number of different transition-metal complexes in the composition, the proportion of the composition in the emitter layer of the OLED in accordance with this embodiment is preferably between 10% and 0.001%, where the remainder to 100% is made up by matrix material and/or dopants.

In a further aspect, the invention relates to a process for the production of a said electronic component. A process of this type is distinguished by the application of a composition in accordance with the above description to a solid support material. The application can be carried out by wet-chemical methods by combining solutions, by means of colloidal suspension and/or by means of vacuum sublimation. The doping can also be carried out as part of this process. Details on the performance of processes of this type are known to the person skilled in the art.

In particular, non-sublimable complexes can be processed from solution. To this end, a mixture of the compounds in the desired mixing ratio is dissolved in a suitable solvent and applied to a substrate (component, device) as a thin layer by standard methods (spin coating, ink-jet printing, doctor blading). Insoluble compositions according to the invention can be applied by means of a colloidal suspension, which may comprise as many components as desired. The oligomer strands of the columnar structures of the compositions according to the invention can be shortened to the desired length before suspension with ultrasound treatment and filtration through suitable nanofilters.

The following processes are generally preferred for the production:

Preference is furthermore given to an organic opto-electronic component, characterised in that one or more layers are applied by means of a sublimation process. The materials are vapour-deposited here in vacuum sublimation units at a pressure below $10^{-5}$ mbar, preferably below $10^{-6}$ mbar. However, it should be stated that the pressure may also be even lower, for example less than $10^{-7}$ mbar.

Preference is likewise given to an organic opto-electronic component, characterised in that one or more layers are applied by means of the OVPD (organic vapour phase deposition) process or with the aid of carrier-gas sublimation. The materials are applied here at a pressure between $10^{-5}$ mbar and 1 bar. A special case of this process is the OVJP (organic vapour jet printing) process, in which the materials are applied directly through a nozzle and thus structured (for example M. S. Arnold et al., *Appl. Phys. Lett.* 2008, 92, 053301).

Preference is furthermore given to an organic opto-electronic component, characterised in that one or more layers are produced from solution, such as, for example, by spin coating, or by means of any desired printing process, such as, for example, screen printing, flexographic printing or offset printing, but particularly preferably LITI (light induced thermal imaging, thermal transfer printing) or ink-jet printing. Soluble compounds are necessary for this purpose. High solubility can be achieved through suitable substitution of the compounds. It is not only possible here to apply solutions of individual materials, but also solutions which comprise a plurality of compounds, for example matrix materials and dopants.

The organic electroluminescent device can also be produced as a hybrid system by applying one or more layers from solution and vapour-depositing one or more other layers.

In a further aspect, the invention relates to a process for the modification of the emission and/or absorption properties of a composition or of a compound. This is achieved in accordance with the invention by mixing various transition-metal complexes of the type described above or the introduction of a dopant into a composition or compound in accordance with the above description.

The invention relates to a composition comprising at least one first neutral transition-metal complex and a second neutral transition-metal complex in accordance with the above description which have a square-planar or quasi-square-planar structure and/or form a columnar structure, in particular for use in an electronic component, such as an OSC or an OLED.

The features of the invention disclosed in the description, the claims and the drawing may be of importance both individually and also in any desired combination for achieving the invention in its various embodiments.

FIGURES

The invention is now described in greater detail with reference to the drawings of the figures, in which:

FIG. 5 shows an example of an OLED device having an emitter layer according to the invention, which can be applied by wet-chemical methods (the layer-thickness data are illustrative values);

FIG. 6 shows the general construction principle for an OSC device; and

FIG. 7 shows an example of an OSC device having an absorption layer according to the invention (the layer-thickness data are illustrative values).

FIG. 1

Figure 1:
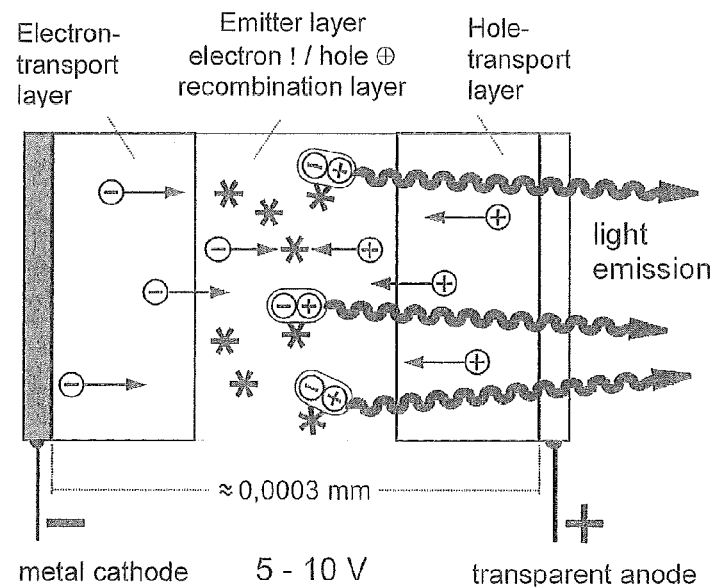
FIG. 1 shows a diagrammatic representation of the functioning of an organic light-emitting device (OLED)

The organic light-emitting device (OLED) shown diagrammatically in FIG. 1 and illustrating the principle consists predominantly of organic layers. The OLED shown has (from left to right) a metal cathode, which is adjacent to an electron-transport layer, on which is in turn arranged an emitter layer, followed by a hole-transport layer. The hole-transport layer is connected to a transparent, conductive anode.

At a voltage of, for example, 5 V to 10 V, negative electrons exit from a conductive metal layer, for example in the form of a magnesium/silver or aluminium cathode, into a thin electron-transport layer and migrate in the direction of the positive anode. This consists, for example, of a transparent, but electrically conductive, thin indium tin oxide layer, from which positive charge carriers, so-called holes, migrate into an organic hole-transport layer. These holes move in the opposite direction compared with the electrons, more precisely to the negative cathode. In a central layer, the emitter layer, which likewise consists of an organic material, are additionally located particular emitter molecules or the substance compositions according to the invention, at which or in the vicinity of which the two charge carriers recombine and result in neutral, but energetically excited states of the emitters. The excited states then release their energy as bright light emission, for example in blue, green or red colour. If desired, an independent emitter layer can also be omitted if the emitter molecules are located in the hole- or electron-transport layer. Of crucial importance for the construction of highly efficient OLEDs are the light-emitting materials (emitters) used. The compositions described here are particularly suitable for use as emitters in OLEDs.

FIG. 2

Figure 2:
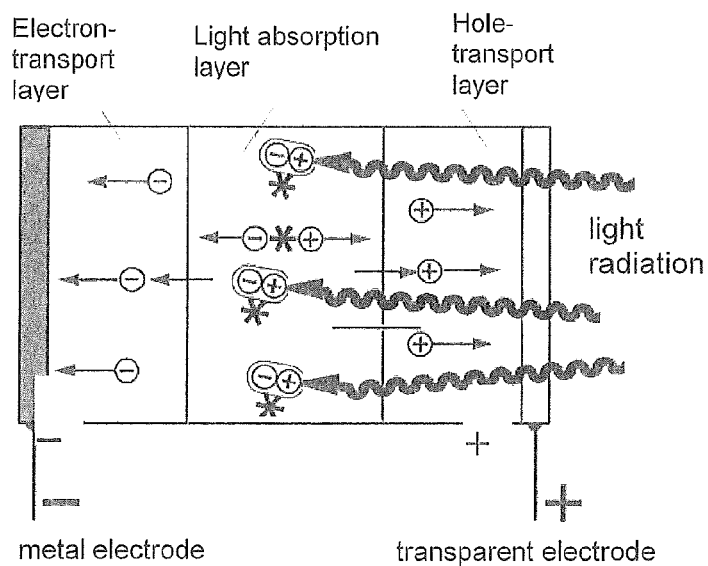
FIG. 2 shows a diagrammatic representation of the functioning of an organic solar cell (OSC)

The structure of an organic solar cell (OSC) is similar to that of an OLED, as can be seen from FIG. 2. The OSC shown has (from left to right) a metal electrode (cathode), an electron-transport layer, a light-absorption layer, a hole-transport layer and a transparent electrode (anode). The efficient conversion of solar energy into electrical energy in organic solar cells is based on the use of absorption dyes (absorbers) in the light-absorption layer. The compositions according to the invention represent the absorbers.

For the OSCs known to date, the lack of materials having high absorption in the spectral region from the visible to the near IR (for effective absorption of the sunlight that reaches the earth's surface) should be noted. These materials should equally have high exciton diffusion lengths in order to achieve effective transfer to the interface or the dissociation region within the absorption layer after light absorption, i.e. it must be possible for the exciton migration to be sufficiently fast and far in order to achieve exciton dissociation.

The cell shown here is manufactured in a sandwich geometry, where the positive electrode used is a transparent semiconductor layer, usually consisting of indium tin oxide (ITO). One or more organic layers are applied to this electrode:

hole-transport layer, light-absorption layer, electron-transport layer and the final negative metal electrode.

The process which leads to the generation of the photocurrent in an organic solar cell composed of a plurality of layers proceeds in summary as follows: a photon of the incident light is absorbed by a dye molecule in the absorption layer. The dye molecule is thus electronically excited. Since the molecule has different redox properties in the excited state (exciton) than in the ground state, electrical charge separation occurs within the absorption layer or at one of the layer boundaries in the case of suitably selected HOMO and LUMO positions of the matrix material or of the hole-transport and electron-transport layers relative to the HOMO/LUMO positions of the absorption layer. The electrons and holes thus formed migrate through the electron- and hole-transport layers respectively in the direction of the electrodes, causing an electrical voltage to form at the electrodes.

A number of techniques and component architectures have already been proposed in order to achieve OSCs. A distinction is made between three different types of OSC:

1) OSCs in which the organic layers consist of so-called small molecules (SM solar cells are generally produced by vacuum deposition)
2) OSCs in which the organic layers consist of polymers (polymer solar cells are produced by spin coating or ink-jet printing)
3) Dye-sensitised solar cells, which have a highly porous electron-transport layer of $TiO_2$.

The latter are produced by sintering $TiO_2$ and coating it with the dye (so-called Grätzel cell).

In addition to these three different OSC types, OSCs can also differ in their functional principle. In general, absorption of the photon is followed by separation of the electrical charges, followed by migration of the resultant hole or electron to the respective electrodes. The separation of the charge carriers is achieved in different ways depending on the functional principle.

In a Grätzel cell, the dye molecule located on the surface of the electrode acts as photosensitiser. After absorption of a photon, electron transfer from the excited dye molecule to the $TiO_2$-coated electrode takes place. The oxidised dye molecule is subsequently reduced further by the redox-active substances present in the electrolyte.

In solid-state solar cells (heterojunction, bulk heterojunction and p-i-n solar cells), the charge carriers (electrons and holes) are separated at an interface between different layers of the component. The exciton here can either be formed directly at the interface between the hole- and electron-transport layers (heterojunction solar cell), or an additional photoactive layer is introduced (p-i-n solar cell). In the latter case, the exciton is generated in the interior of this photoactive layer by absorption of the photon and then migrates in the direction of the hole- or electron-transport layer, where charge separation then occurs at the interface due to heterogeneous electron/hole transfer. The photoactive layer can also be implemented in the form of a bulk heterojunction, which is a mixture of hole- and electron-transport material.

FIG. 3

Figures 3, 4:
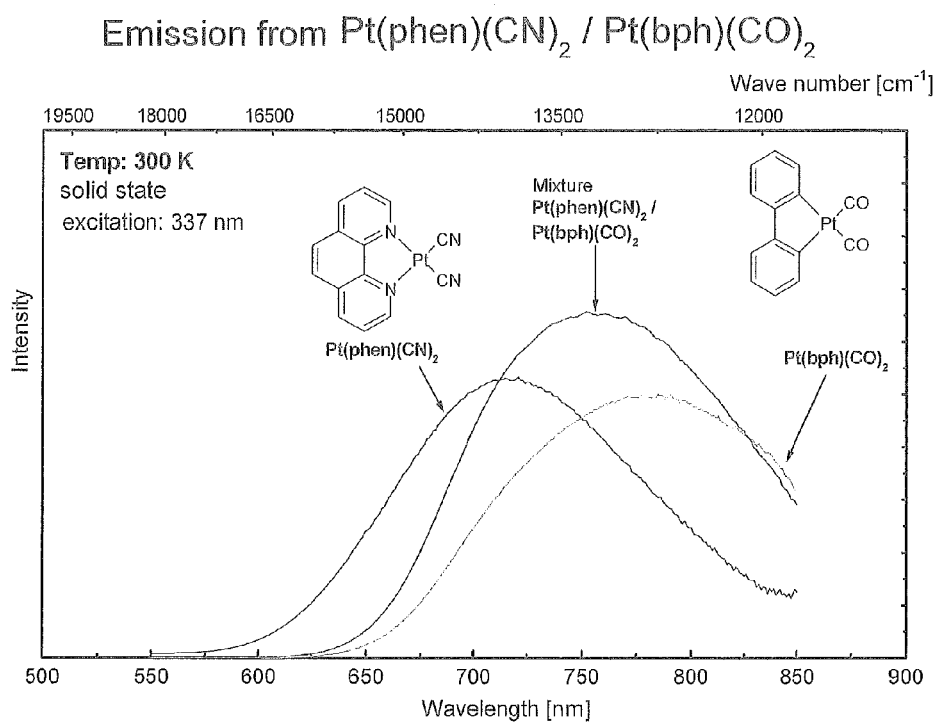
FIG. 3 shows emission spectra of the pure oligomers of Pt(phen)(CN)$_2$ and Pt(bph)(CO)$_2$, and the emission spectrum of a mixture of Pt(phen)(CN)$_2$ and Pt(bph)(CO)$_2$ (the deposition of the thin layers was carried out on a glass surface by vacuum sublimation at 200° C.)
FIG. 4 shows an example of an OLED device having an emitter layer according to the invention, which can be applied by vacuum sublimation (the layer-thickness data are illustrative values)

FIG. 3 shows the measurement results of the experiment described in the example. The measured intensity is plotted against the wavelength or wave number (for two pure compounds and the composition thereof, in a 50%:50% mixture).

FIG. 4

The electronic component in the form of an OLED shown in FIG. 4 is described briefly below with reference to layers 1 to 8 of the component.

1. The support material used can be glass or any other suitable solid or flexible transparent material.
2. ITO=indium tin oxide
3. HIL=hole injection layer, CuPc=copper phthalocyanine
4. HTL=hole transport layer, α-NPD=N,N'-diphenyl-N,N'-bis(1-naphthyl)-1,1'-biphenyl-4,4'-diamine
5. Emitter layer, frequently abbreviated to EML, comprising emitter substances. The compounds are co-deposited by vacuum sublimation. This layer consists of or comprises the metal-complex mixtures according to the invention. The concentration of the metal-complexes in the composition can be 100%, i.e. this layer then consists exclusively of metal complex mixtures. However, the concentration can also be in the range from 1% to <100%. In this case, the metal complexes are located in a suitable, likewise co-evaporated matrix, which consists, for example, of a matrix material known in OLED technology (for example cf. M. E. Thompson et al., *Chem. Mater.*, 2004, 16, 4743).
6. ETL=electron transport material. For example, the vapour-depositable $AlQ_3$ can be used. Thickness, for example, 40 nm.
7. The very thin interlayer of, for example, CsF or LiF reduces the electron-injection barrier and protects the ETL layer. This layer is generally applied by vapour deposition. For a further-simplified OLED structure, the ETL and the CsF or LiF layer can optionally be omitted.
8. The conductive cathode layer is applied by vapour deposition. Al represents an example. It is also possible to use Mg:Ag (10:1) or other metals.

The voltage over the component is, for example, 3 V to 15 V.

FIG. 5

The electronic component in the form of an OLED which can be produced by wet-chemical methods and which is shown in FIG. 5 is described briefly below with reference to layers 1 to 7 of the component.

1. The support material used can be glass or any other suitable solid or flexible transparent material.
2. ITO=indium tin oxide
3. HTL=hole transport layer. PEDOT/PSS=polyethylenedioxythiophene/polystyrenesulfonic acid or novel HTL materials (for example DuPont). This is a water-soluble hole transport material,
4. Emitter layer (EML) comprising emitter substances. The compounds can be dissolved, for example, in organic solvents. This enables dissolution of the underlying PEDOT/PSS layer to be avoided. The compositions according to the invention in the form of metal-complex mixtures can be 1% to 100% (% by weight), depending on the application. The metal-complex mixtures according to the invention can also be introduced as suspensions in an emitter matrix material (for example PVK=polyvinyl-carbazole or GBP=4,4'-bis-N-carbazolylbiphenyl). These manufacturing variants can be employed if the metal-complex mixtures are insoluble.
5. ETL=electron transport layer. For example, the vapour-depositable $Alq_3$ can be used. Thickness, for example, 40 nm.
6. The very thin interlayer of, for example, CsF or LiF reduces the electron-injection barrier and protects the ETL layer. This layer is generally applied by vapour deposition. For a simplified OLED structure, the ETL and the CsF or LiF layer can optionally be omitted.
7. The conductive cathode layer is applied by vapour deposition. Al represents an example. It is also possible to use Mg:Ag (10:1) or other metals.

The voltage over the device is, for example, 3 V to 15 V.

An OLED of this type is produced in the manner known to the person skilled in the art. For example, good power efficiencies can be achieved in a typical OLED layer structure consisting of an ITO anode, a hole conductor (for example comprising PEDOT/PSS), the emitter layer comprising a composition according to the invention, optionally a hole-blocking layer, an electron-transport layer, a thin LiF or CsF interlayer for improving electron injection, and a metal electrode (cathode). These various layers having a total thickness of a few 100 nm can be applied, for example, to a glass substrate or another support material.

FIG. 6

FIG. 6 shows the construction principle for an OSC component in a general formulation (layers 1 to 6).

FIG. 7

FIG. 7 shows an example of an OSC component comprising a compound according to the invention. The layer thicknesses indicated are illustrative.

1. The support material used can be glass or any other suitable solid or flexible transparent material.
2. ITO=indium tin oxide
3. ETL=electron transport layer, for example a $C_{60}$ layer or an n-doped layer.
4. Light-absorption layer comprising an absorption material in the form of a composition according to the invention. Depending on the application, the proportion of the transition-metal complex(es) can be from 10% to 100%. In a first embodiment, the absorption layer consists of a pure metal-complex mixture which is introduced by vacuum sublimation (co-evaporation) of the metal-complex compounds. In a second embodiment, the metal-complex mixtures can be employed in wet-chemical form as a dispersion in a suitable matrix material. The matrix material employed can be a suitable electron- or hole-conducting substance (or also a mixture of the two). Examples of n- and p-conductor materials are given below.
5. HTL=hole transport layer, MeO–TPD=N,N,N',N'-tetrakis (4-methoxyphenyl)benzidine. The HTL matrix material can also be doped with a p-dopant, for example MeO–TPD+$F_4$-TCNQ (tetrafluorotetracyanoquino-dimethane).
6. The conductive metal layer is applied by vapour deposition. Besides the Au shown here, it is also possible to use other metals, as is known to the person skilled in the art.

Preferred compounds for n-conductor materials for OSCs are the following:

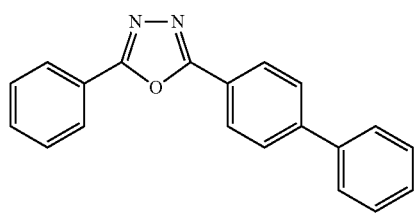

2-(4-Biphenyl)-5-phenyl-1,3,4-oxadiazole

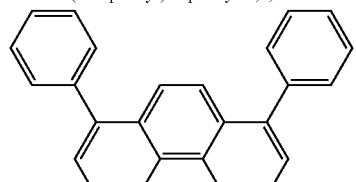

Bathocuproine

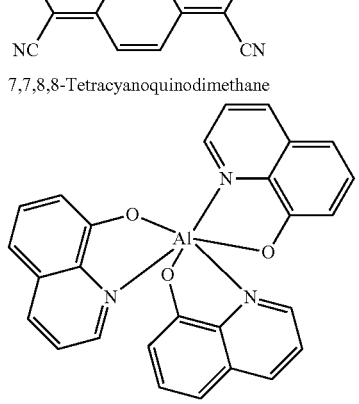

7,7,8,8-Tetracyanoquinodimethane

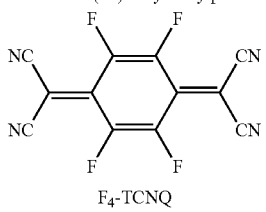

Al(III) 8-hydroxyquinolinate

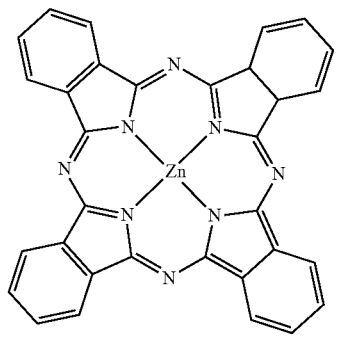

$F_4$-TCNQ

Preferred compounds for p-conductor materials for OSCs are the following:

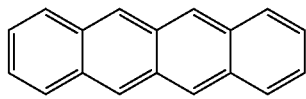

Zinc(II) phthalocyanine

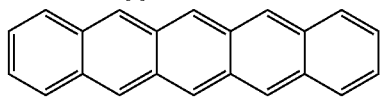

Benz[b]anthracene

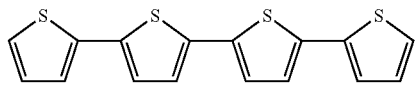

Pentacent

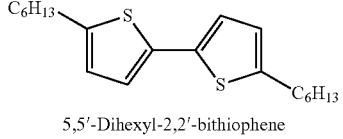

α-Quaterthiophene 5,5'-Dihexyl-2,2'-bithiophene

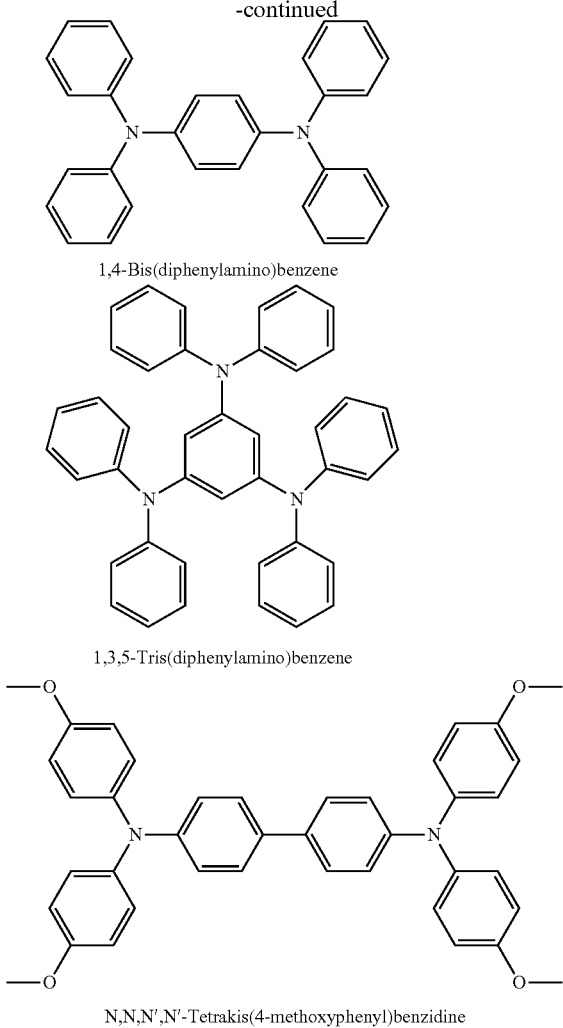

1,4-Bis(diphenylamino)benzene 1,3,5-Tris(diphenylamino)benzene

N,N,N',N'-Tetrakis(4-methoxyphenyl)benzidine

In one aspect, the invention relates to the use of a composition comprising a first transition-metal complex and a second transition-metal complex, in particular the use in an optoelectronic component, such as an OLED or OSC.

In a further aspect, the invention allows control of the absorption ranges (of an OSC) or control of the emission range (of an OLED) through the substance compositions of square-planar or quasi-square-planar transition-metal complexes.

It is possible in accordance with the invention to achieve modification of the absorption properties by mixing various neutral, for example Pt(II) complexes. In particular, the metal-metal separations, for example the Pt—Pt separations, in the columnar structures can be varied virtually as desired. The average chain lengths of these columnar structures can also be varied. The positions of the absorption bands can thus be controlled specifically over a large range, and it is possible to prepare substance compositions whose absorption extends over the visible spectral region as far as the near infrared region.

In particular, it is possible to produce OLEDs whose emission is in the white or blue or red or IR spectral region.

Such mixtures are also very highly suitable for use in OSCs. Examples thereof which can be utilised are all columnar structures built up from the transition-metal complexes (monomers) described above. In OSCs, it is also possible to use compositions in which the first and second transition-metal complexes are identical, in particular Pt(II) biphenyl complexes.

Pt(II) centres with square-planar or quasi-square-planar coordination have a very strong tendency to form metal-metal interactions. The resulting columnar structures have, compared with the monomer units, new electronic states and accordingly also new absorption bands. The corresponding extinction coefficients are extremely high and are in the c(X) range required above. In addition, depending on the substance composition selected, the absorptions can cover the entire visible region and in some cases extend into the near infrared region. On the other hand, for example, the columnar structures consisting of Pt(II) complexes exhibit very high exciton mobilities.

This invention is explained in greater detail by the following examples, without wishing to restrict it thereby.

EXAMPLES

Example 1

By simultaneous vacuum sublimation of the pure components Pt(phen)(CN)$_2$ [11] and Pt(bph)(CO)$_2$ [12-14] (phen=1,10-phenanthroline, bph=2,2'-biphenyl), which are already known from the prior art, a corresponding composition in the form of a mixed layer is applied to a glass substrate.

On excitation with light of wavelength 337 nm, the mixed layer emits at $\lambda_{max}$=753 nm. The emission maximum of this mixed layer is thus between the emission maxima of the pure substances, which are at $\lambda_{max}$=716 nm (Pt(phen)(CN)$_2$) and $\lambda_{max}$=782 nm (Pt(bph)(CO)$_2$). The measurement results are shown in FIG. 3.

The main advantages of these mixtures are, inter alia, the possibility of adaptation of the emission or absorption wavelength, and the possibility of achieving particularly high emission intensities.

Examples 2-4

Production and Characterisation of Organic Electroluminescent Devices Comprising the Compositions According to the Invention Electroluminescent devices according to the invention can be produced as described, for example, in WO 05/003253. The results for various OLEDs are compared here. For better comparability, the basic structure, the materials used and the layer thicknesses thereof are identical.

The first device example describes a comparative standard in accordance with the prior art, in which the emission layer consists of the host material bis(9,9'-spirobifluoren-2-yl) ketone and the guest material (dopant) TER for red emission. Furthermore, OLEDs according to the invention which comprise the compositions according to the invention are described. OLEDs having the following structure are produced analogously to the general process mentioned above:

Hole-injection layer (HIL) 20 nm of 2,2',7,7'-tetrakis(di-para-tolylamino)spiro-9,9'-bifluorene Hole-transport layer (HTL) 20 nm of NPB (N-naphthyl-N-phenyl-4,4'-diaminobiphenyl)

Emission layer (EML) 40 nm of matrix material: spiroketone (SK) (bis(9,9'-spirobifluoren-2-yl)ketone) dopant: TER=Ir(piq)$_2$acac (10% doping, vapour-deposited) or compositions according to the invention Electron-transport layer (ETL) 20 nm of AlQ$_3$ (tris(quinolinato)aluminium(III)) as comparison Cathode 1 nm of LiF, 150 nm of Al on top.

The structures of TER, spiroketone (SK) and compounds TER-1 and TER-2 according to the invention are shown below for reasons of clarity.

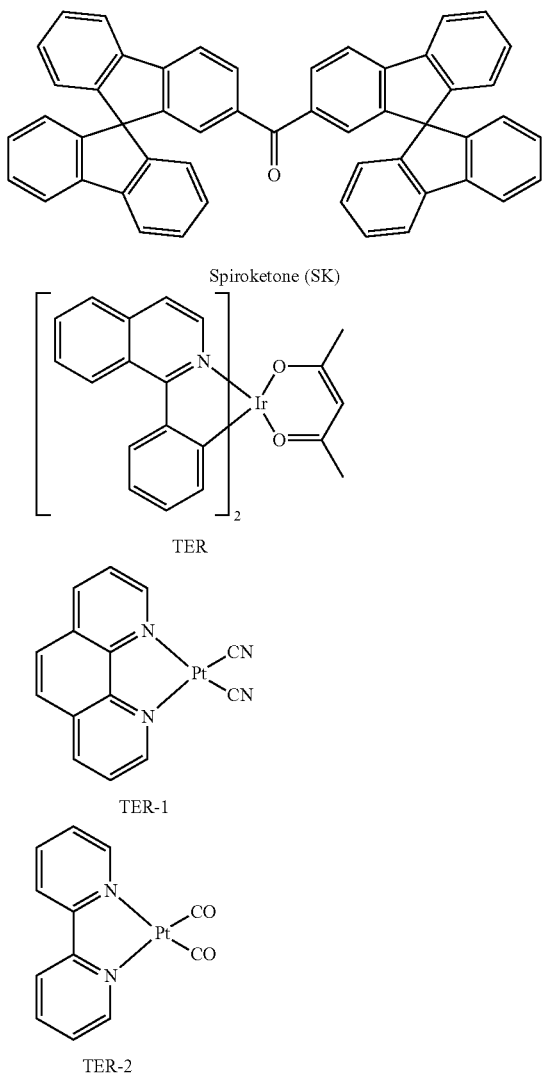

Spiroketone (SK)

TER

TER-1

TER-2

These still unoptimised OLEDs are characterised by standard methods; for this purpose, the electroluminescence spectra, the external quantum efficiency as a function of luminance, calculated from current-voltage-luminance characteristic lines (IUL characteristic lines), and the lifetime are determined. The results are shown in Table 1.

TABLE 1

Device results with compounds according to the invention with TER (as comparative example) and TER-1 and TER-2 as dopants

| Ex. | EML 40 nm | EQE [%] at 1000 cd/m² | Voltage [V] at 1000 cd/m² | $\lambda_{max}$ [nm] | Lifetime [h], initial luminance 1000 cd/m² |
|---|---|---|---|---|---|
| 2 comp. | SK: TER (10%) | 12 | 5.5 | 635 | 3000 |
| 3 | SK (90%): TER-1 (5%): TER-2 (5%) | 13 | 5.1 | 750 | 2000 |
| 4 | SK (90%): TER-1 (9%): TER-2 (1%) | 14 | 5.0 | 725 | 2500 |

References

1. G. Aullón, S. Alvarez, Chem. Eur. J. 1997, 3, 655.
2. W. B. Connick, R. E. Marsh, W. P. Schaefer, H. B. Gray, Inorg. Chem. 1997, 36, 913.
3. H. Isci, W. R. Mason, Inorg. Chem. 1974, 13, 1175.
4. H. Bois, N. G. Connelly, J. G. Crossley, J. C. Guillorit, G. R. Lewis, A. G. Orpen, P. Thornton, J. Chem. Soc., Dalton Trans. 1998, 2833.
5. G. Gliemann, H. Yersin, Structure and Bonding 1985, 62, 87.
6. A. E. Stiegman, S. F. Rice, H. B. Gray, V. M. Miskowski, Inorg. Chem. 1987, 26, 1112.
7. C.-M. Che, K.-T. Wan, L.-Y. He, C.-K. Poon, V. W.-W. Yam, J. Chem. Soc., Chem. Commun. 1989, 943.
8. J. R. Stork, M. M. Olmstead, A. L. Balch, Inorg. Chem. 2004, 43, 7508.
9. M. V. Puzyk, M. A. Ivanov, K. P. Balashev, Opt. Spectrosc. 2003, 95, 81.
10. J. W. Schindler, R. C. Fukuda, A. W. Adamson, J. Am. Chem. Soc. 1982, 104, 3596.
11. C. Lennartz, A. Vogler, V. Pawlowski, (BASF AG), WO 2005/056712 A1, 2005.
12. H. Yersin, U. Monkowius, R. Czerwieniec, WO 2007/118671 A1
13. S. R. Stoyanov, J. M. Villegas, D. P. Rillema, Inorg. Chem., 2003, 42, 7852.
14. G. Y. Zheng, D. P. Rillema, Inorg. Chem., 1998, 37, 1392.

The invention claimed is:

1. An electronic component comprising a composition which comprises
   (1) a first neutral transition-metal complex, and
   (2) a second neutral transition-metal complex,
   wherein said first transition-metal complex and said second transition-metal complex together form a columnar structure.

2. The electronic component of claim 1, wherein said first transition-metal complex and said second transition-metal complex have a square-planar structure or a quasi-square-planar structure.

3. The electronic component of claim 2, wherein either or both of said first transition-metal complex and said second transition-metal complex have a square-planar structure, wherein a $d^8$ electron structure arises and results in the formation of a columnar structure.

4. The electronic component of claim 2, wherein said square-planar transition-metal complex and/or said quasi-square-planar transition-metal complex have one of formulae I to VI:

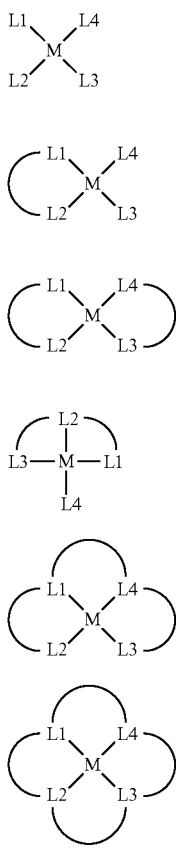

wherein
M is Pt(II), Rh(I), Ir(I), Au(III), or Pd(II), and L1, L2, L3, and L4 are suitable ligands.

5. The electronic component of claim 1, wherein said composition is employed as emitter or as absorber.

6. The electronic component of claim 1, wherein said first transition-metal complex and said second transition-metal complex are selected from the group consisting of Pt(II) complexes, Ir(I) complexes, Rh(I) complexes, Au(III) complexes, Pd(II) complexes, Au(I) complexes, and Ag(I) complexes.

7. The electronic component of claim 1, wherein the proportion together of said first transition-metal complex and said second transition-metal complex in said composition is 100% or from 1% to less than 100%.

8. The electronic component of claim 1, wherein said component is selected from the group consisting of organic light-emitting components, organic diodes, organic solar cells, organic transistors, and organic light-emitting diodes.

9. The electronic component of claim 1, wherein the proportion together of said first transition-metal complex and said second transition-metal complex in said composition is from 1 to 10%.

10. The electronic component of claim 1, wherein the proportion together of said first transition-metal complex and said second transition-metal complex in said composition is from 10 to 100%.

11. The electronic component of claim 1, wherein said first transition-metal complex is a Pd(II) complex and said second transition-metal complex is a complex selected from the group consisting of Pt(II) complexes, Ir(I) complexes, Rh(I) complexes, and Au(III) complexes.

12. The electronic component of claim 1, wherein the proportion of said first transition-metal complex in said composition is from 90% to 99.999%, and the proportion of said second transition-metal complex in said composition is from 10% to 0.001%.

13. The electronic component of claim 1, wherein said first transition-metal complex is a Pd(II) complex of formulae 137 to 264

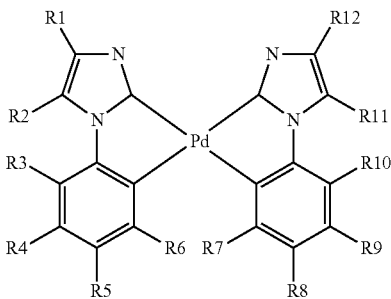

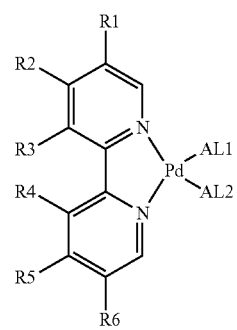

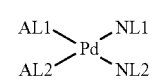

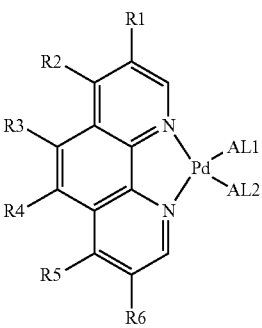

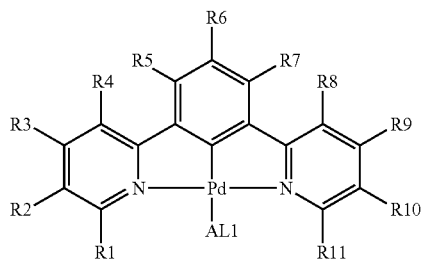

142
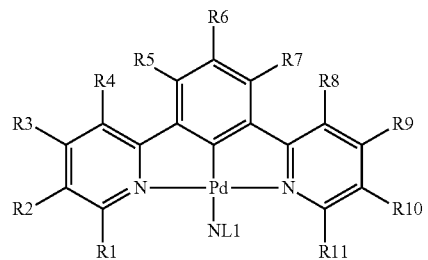
143
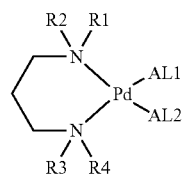
144
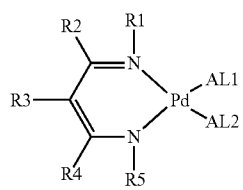
145
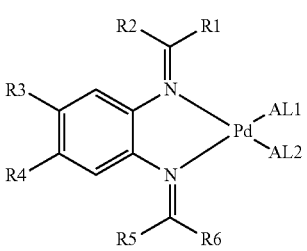
146
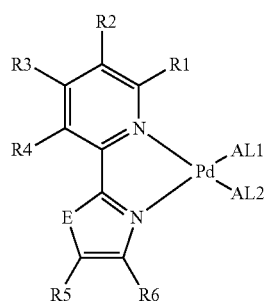
147
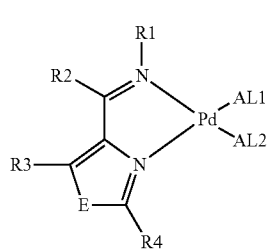
148
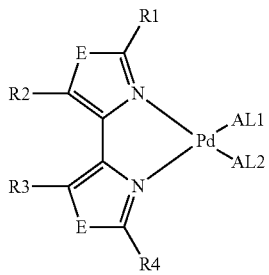
149
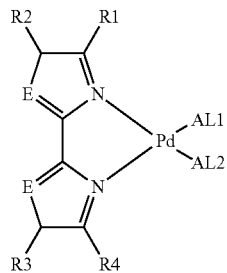
150
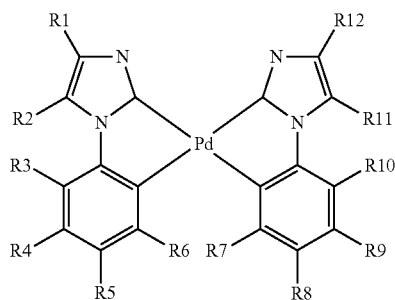
151
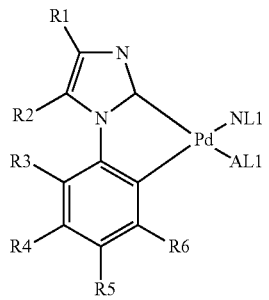
152
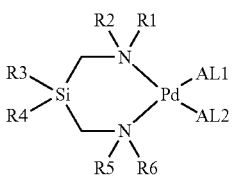
153
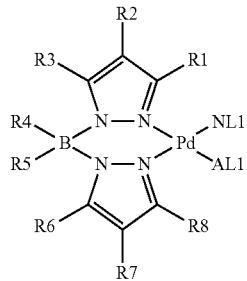

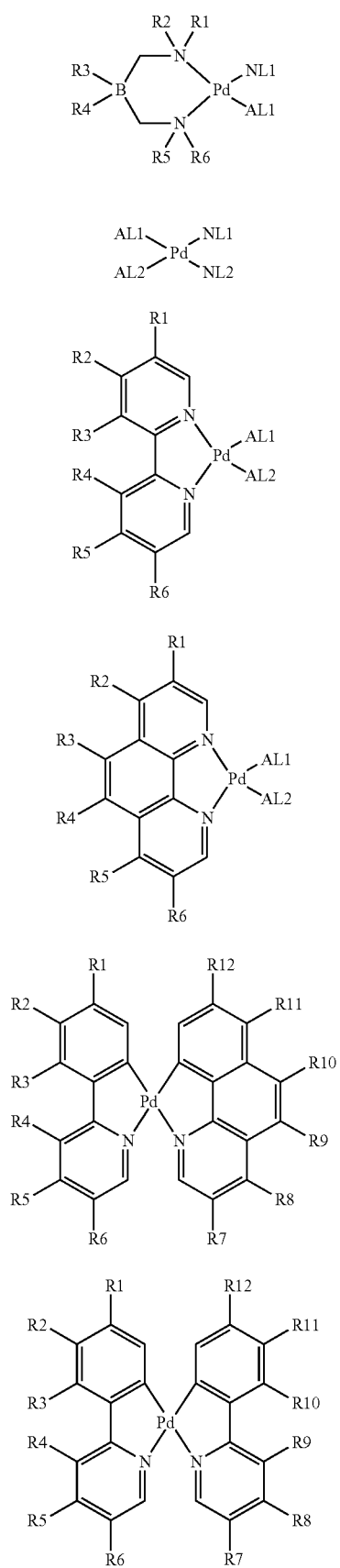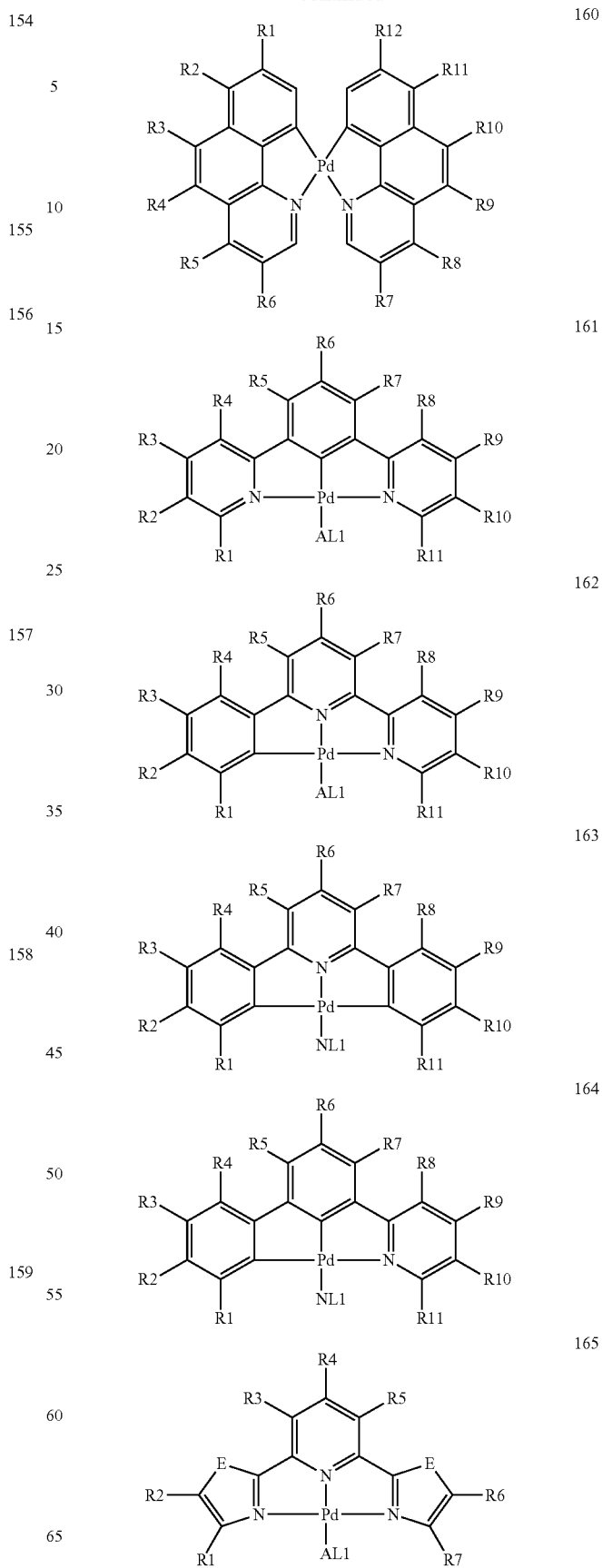

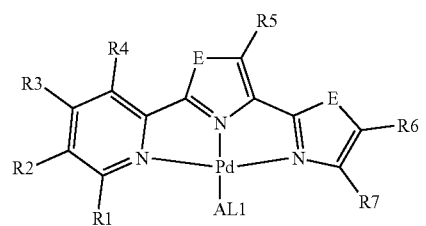
166
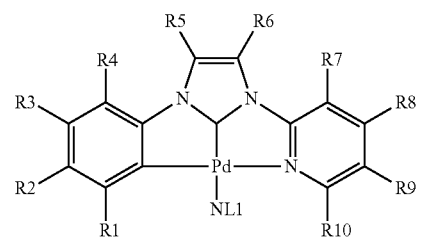
167
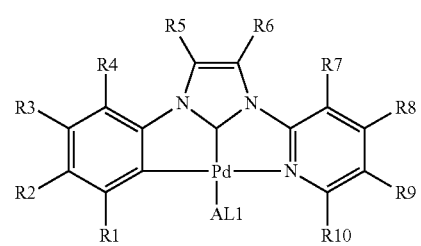
168
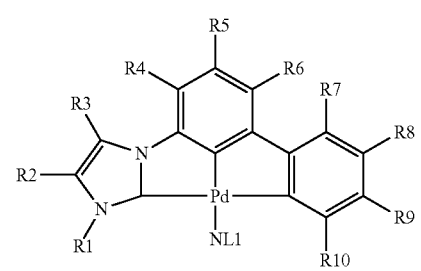
169
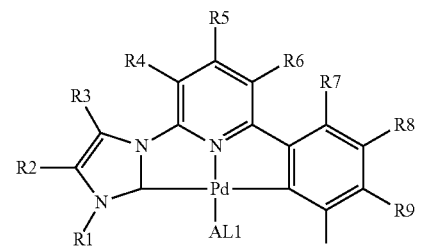
170
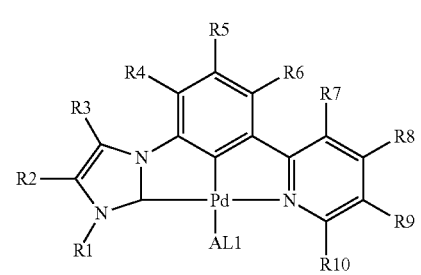
171
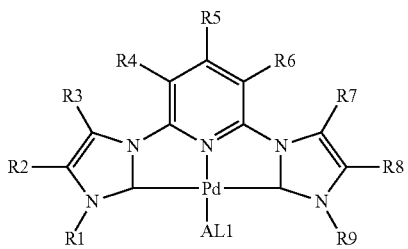
172
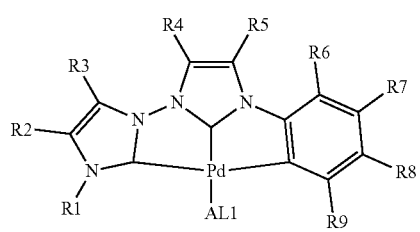
173
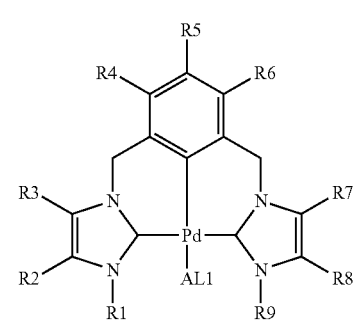
174
175
176
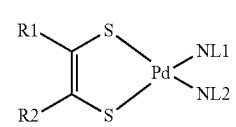
177
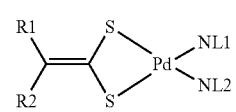
178

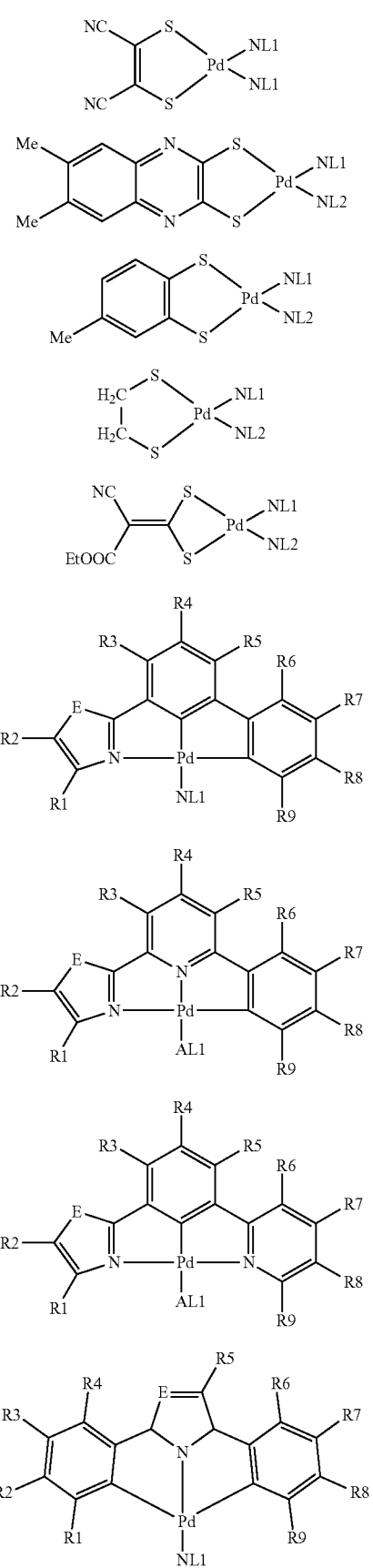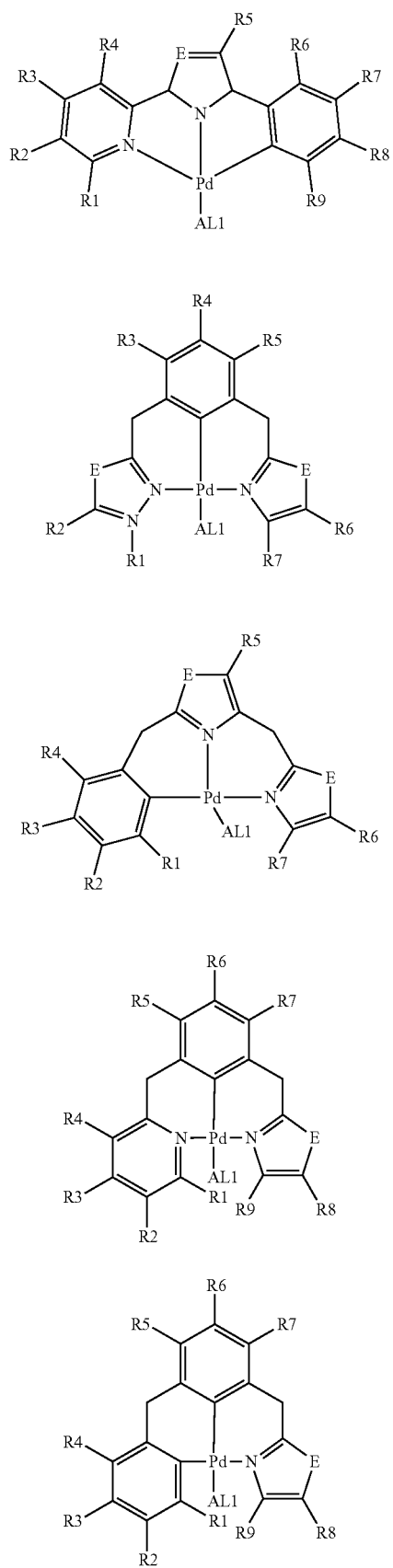

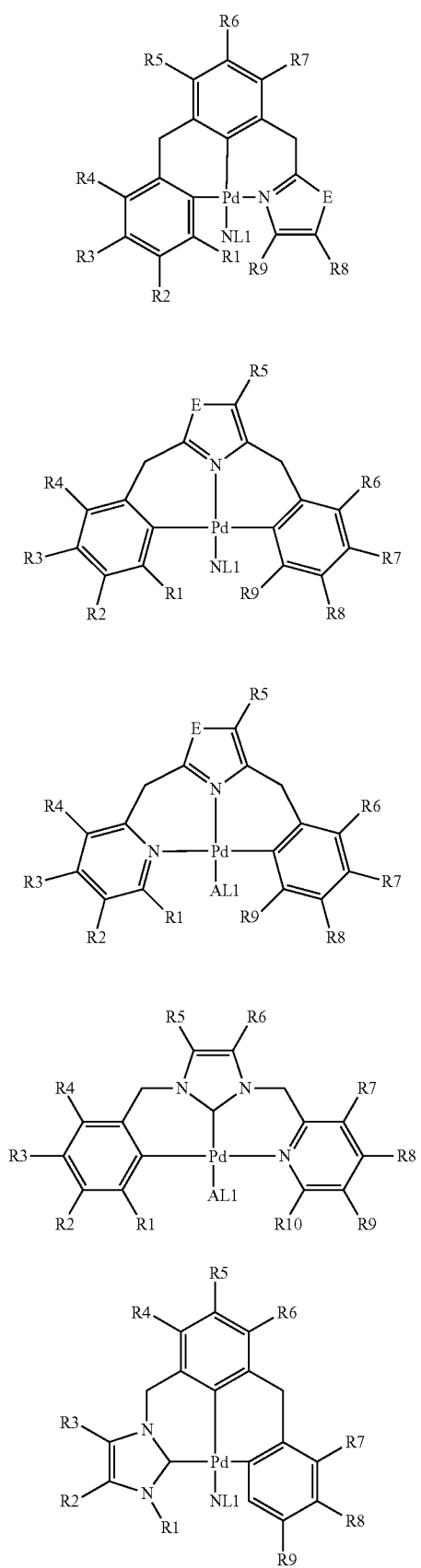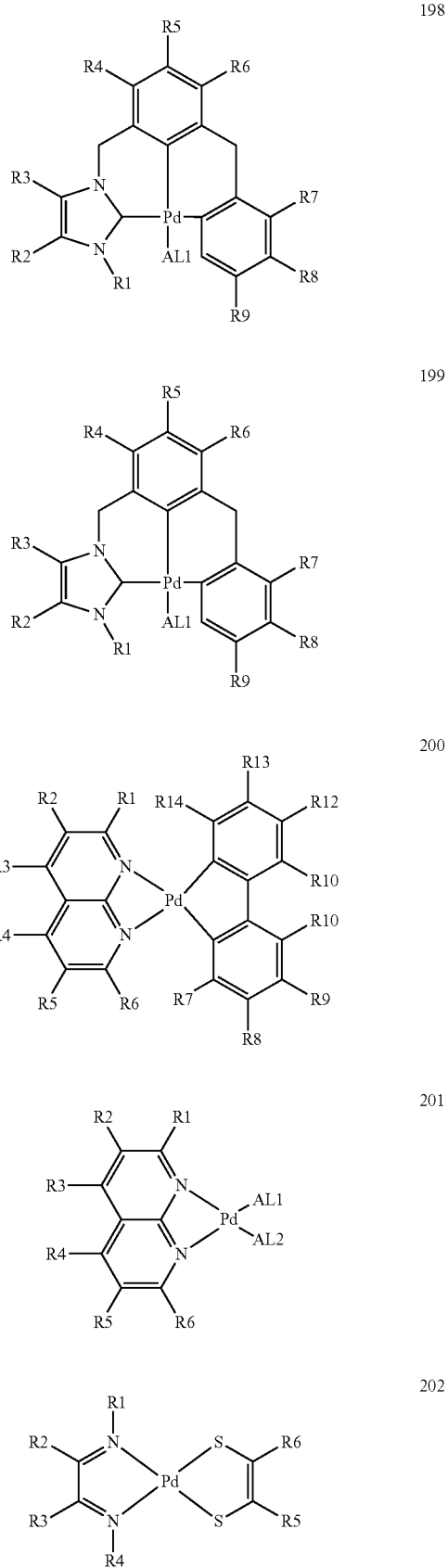

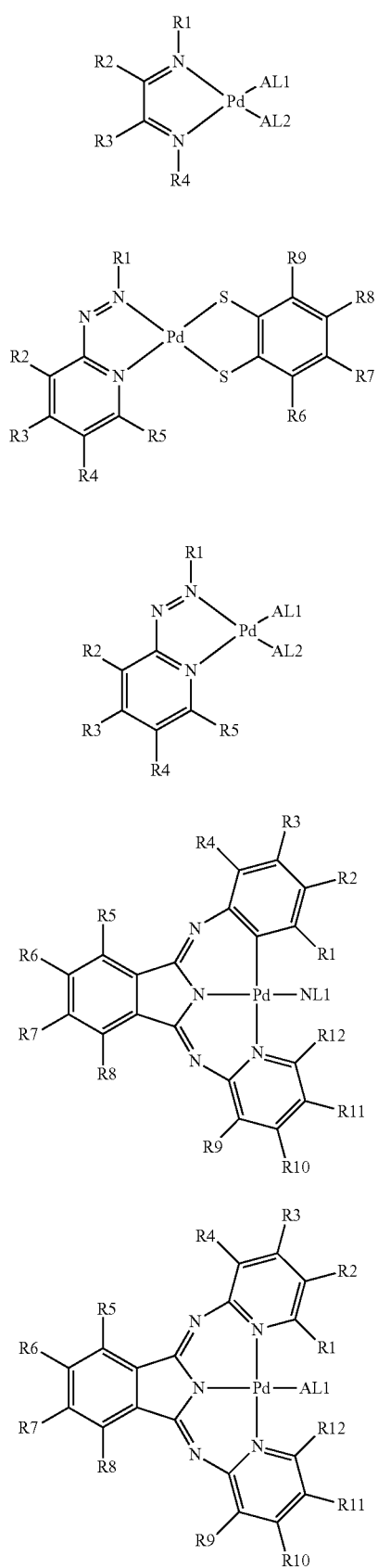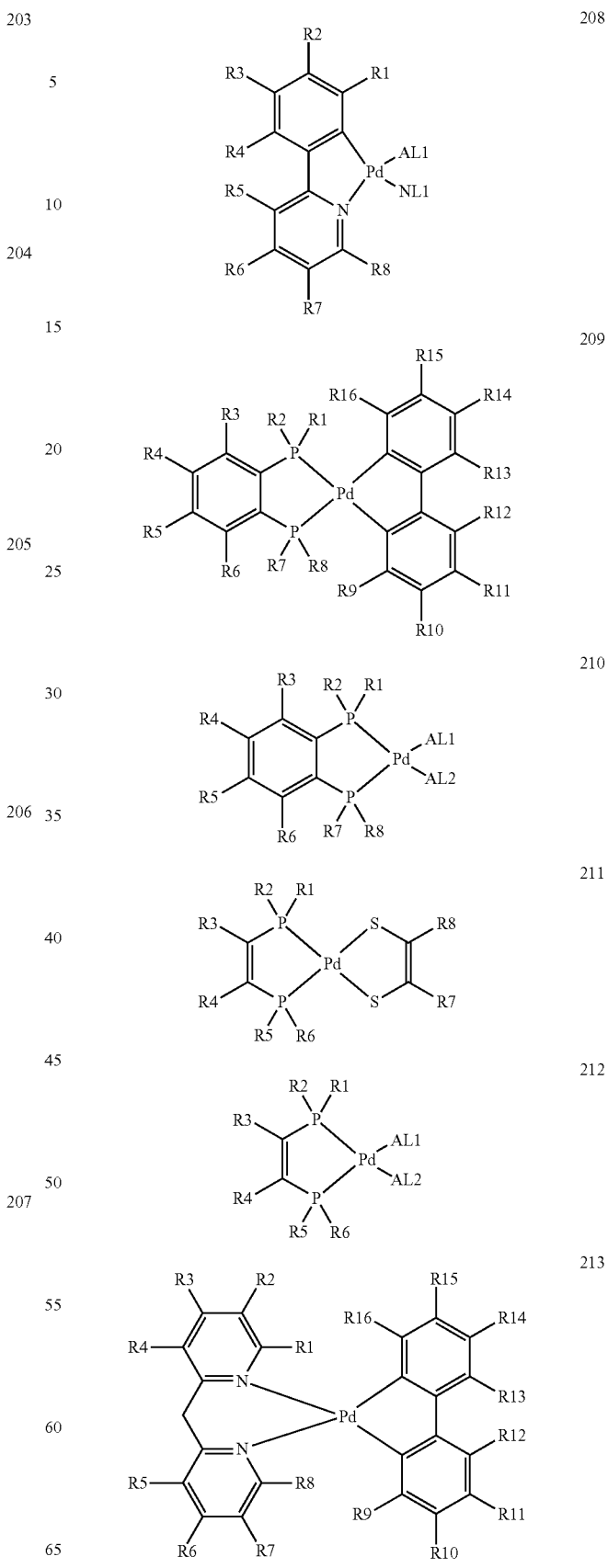

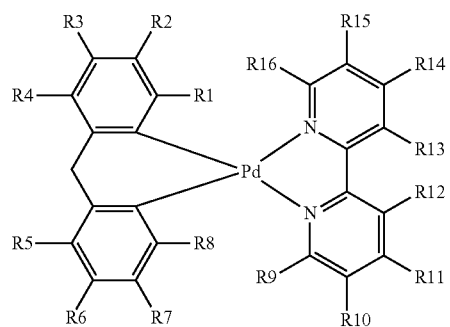
214
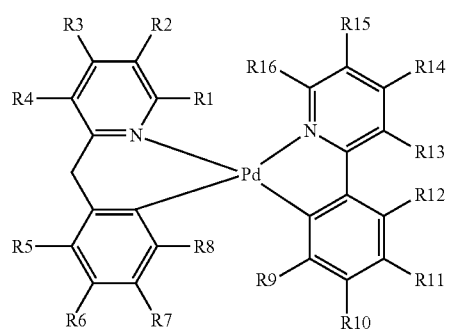
215
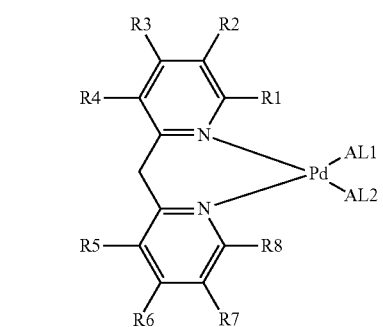
216
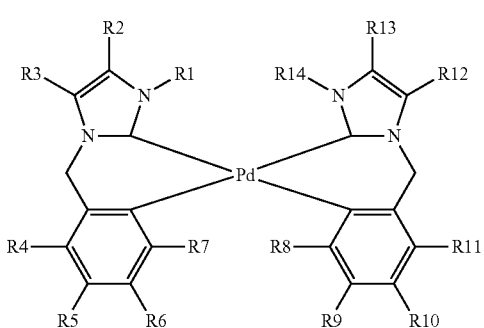
217
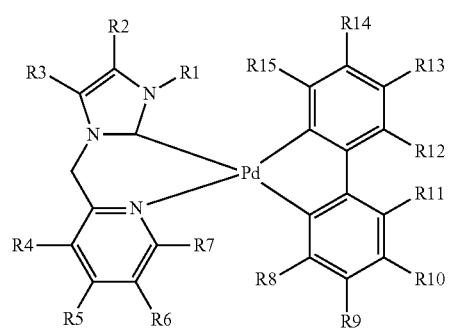
218
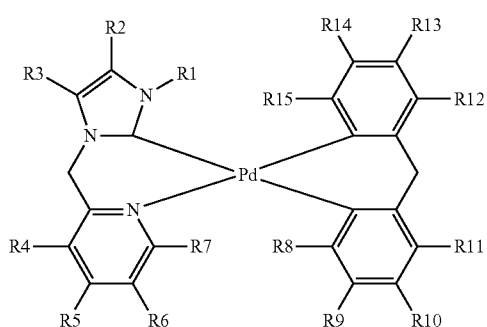
219
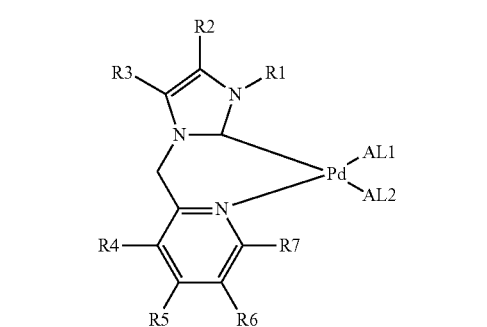
220
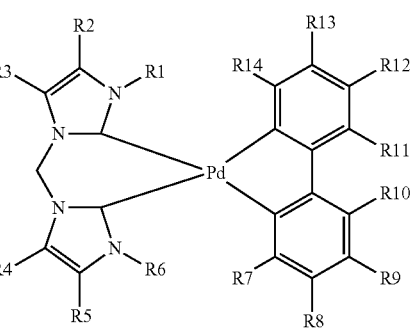
221
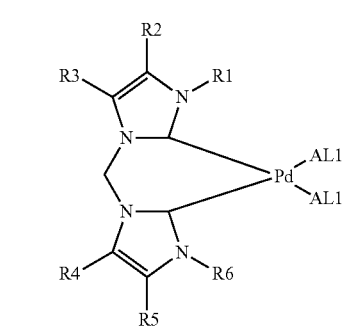
222
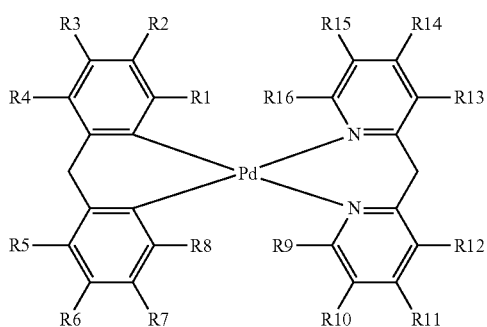
223

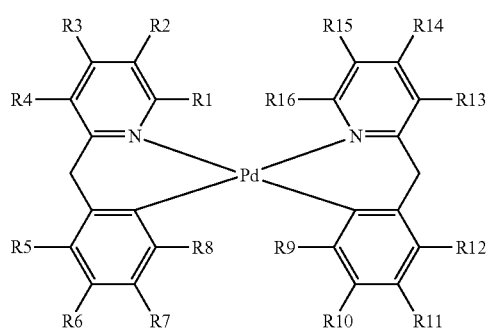
224
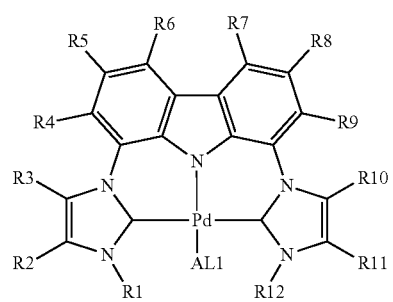
225
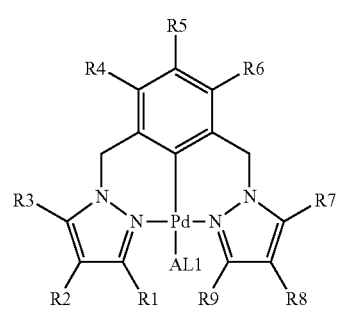
226
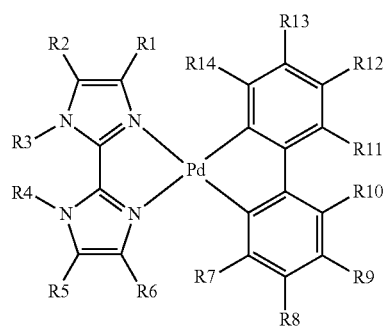
227
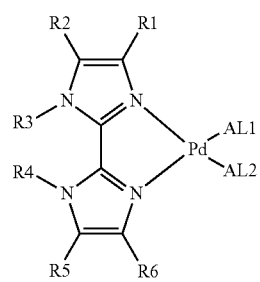
228
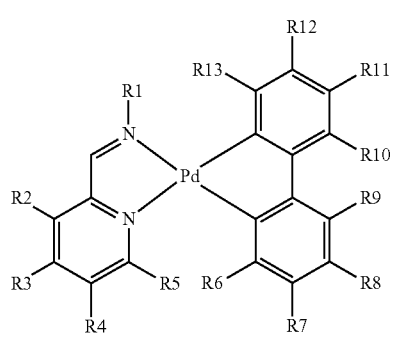
229
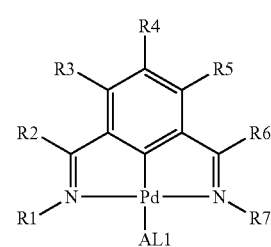
230
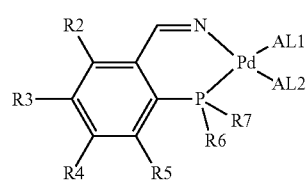
231
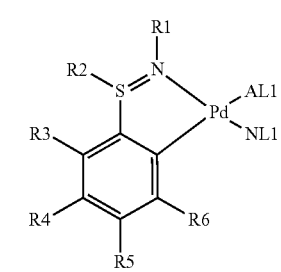
232
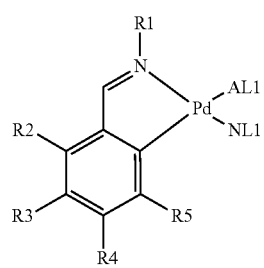
233
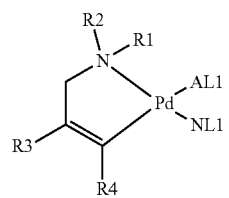
234

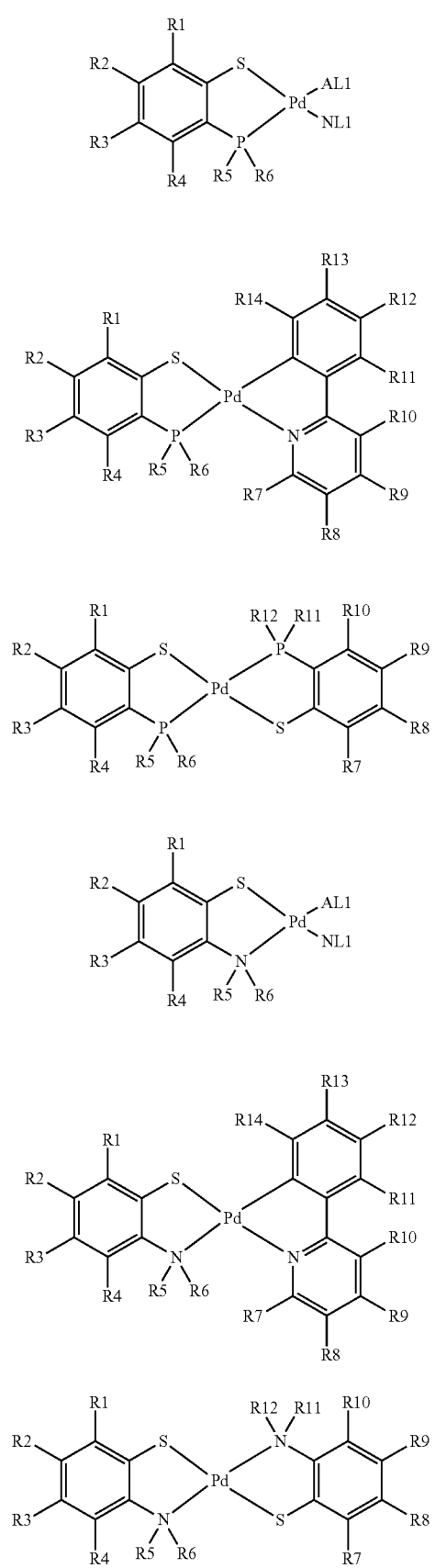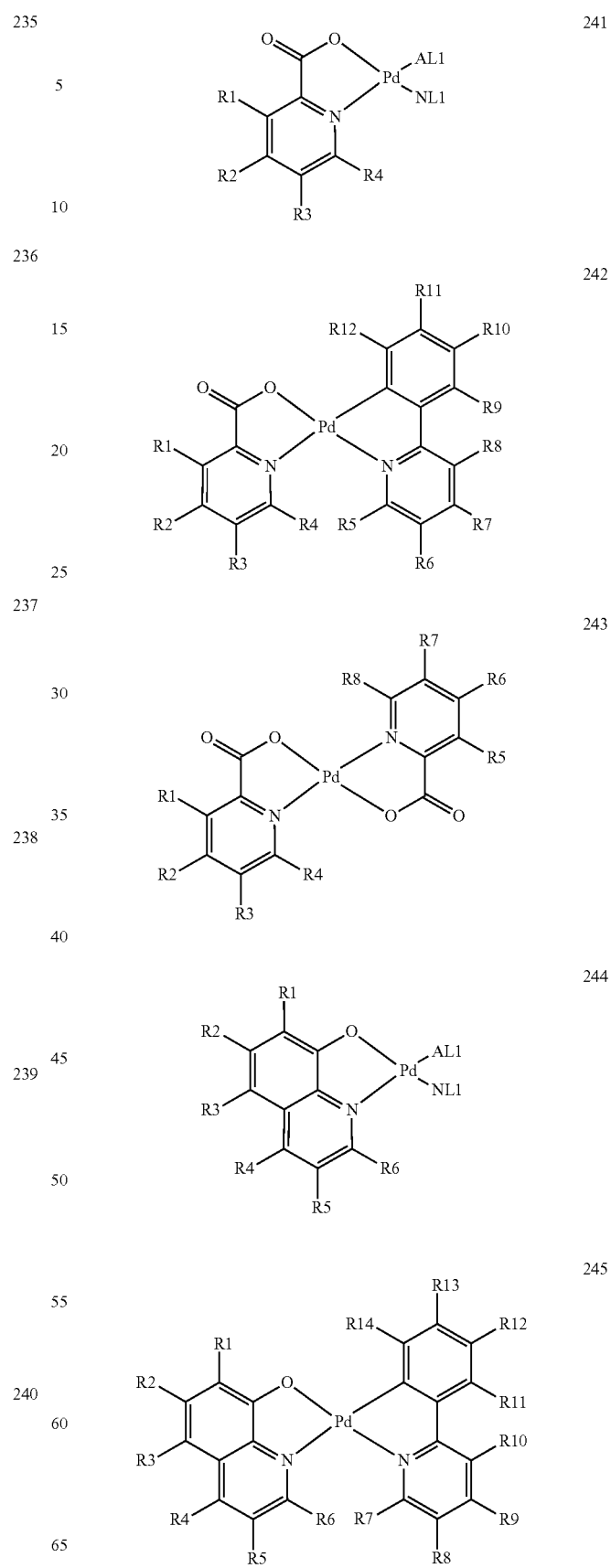

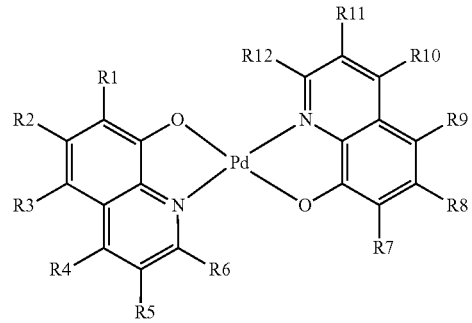
246
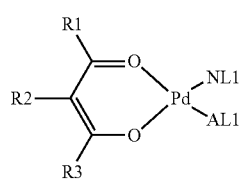
247
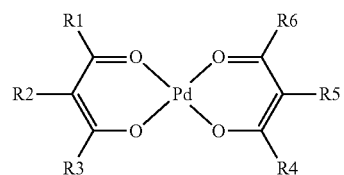
248
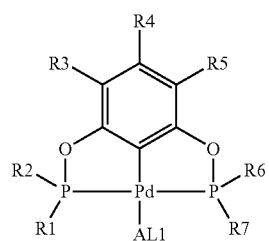
249
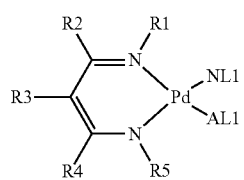
250
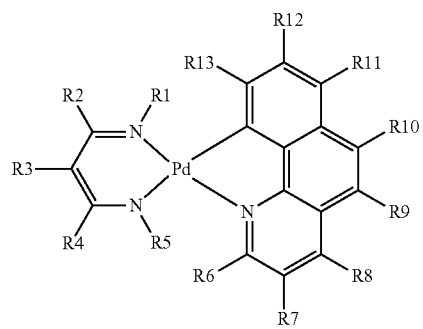
251
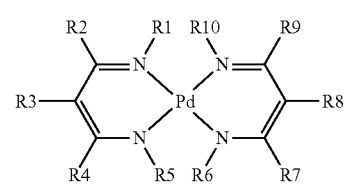
252
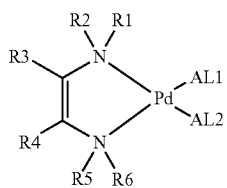
253
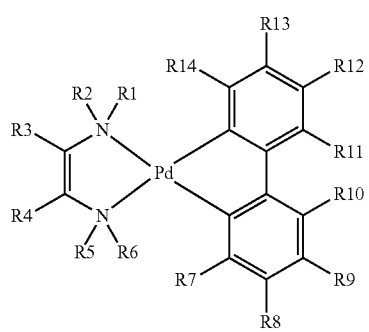
254
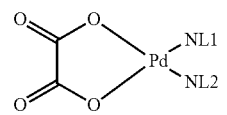
255
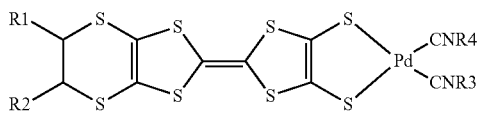
256
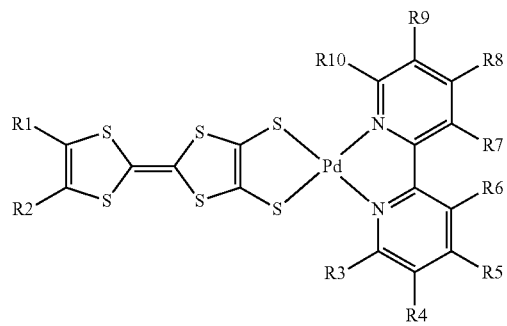
257
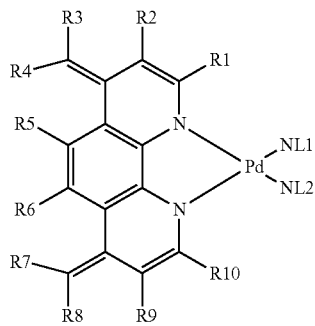
258

95
-continued
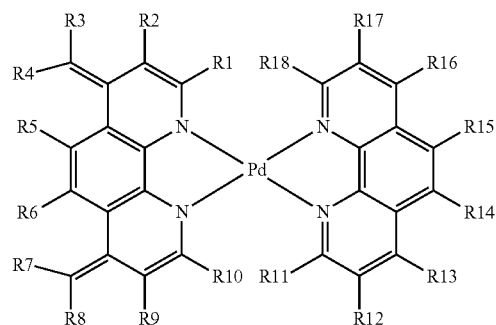
259
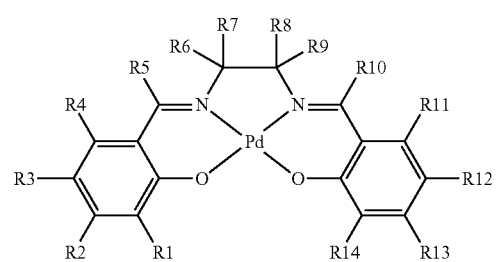
260
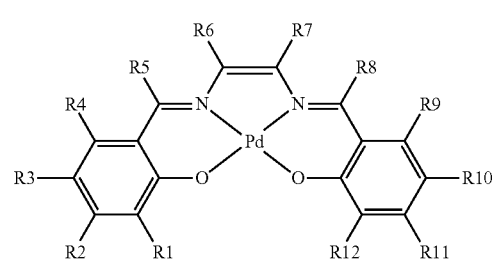
261
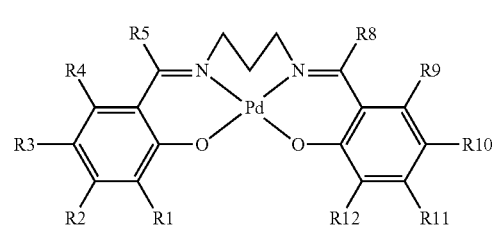
262
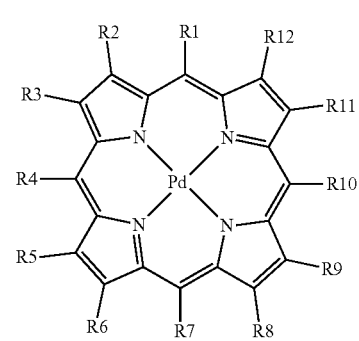
263
96
-continued
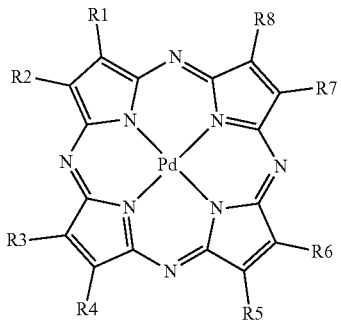
264
and said second transition-metal complex is a complex selected from the group consisting of Pt(II) complexes of formulae 15 to 136,
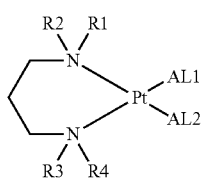
15
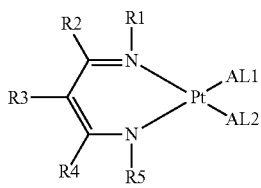
16
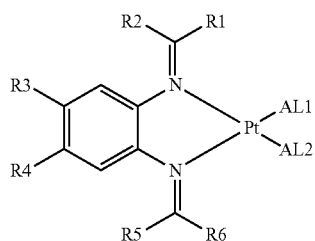
17
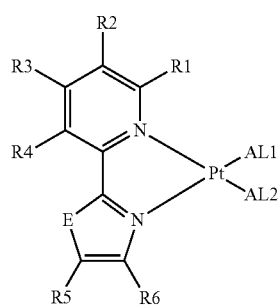
18
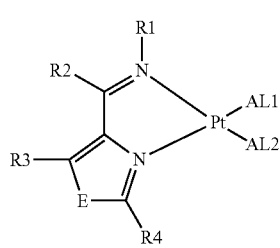
19

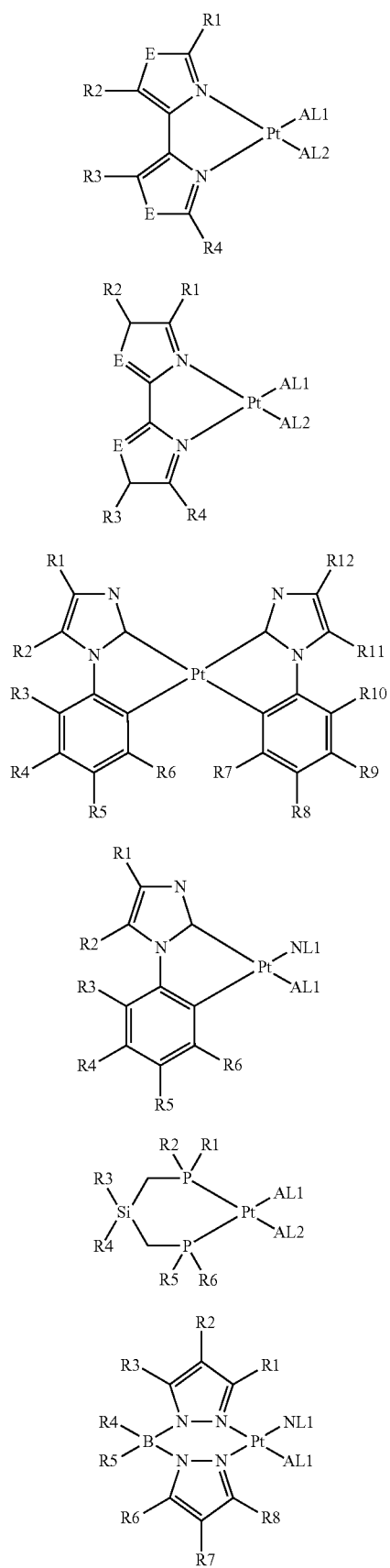
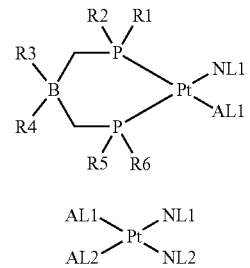

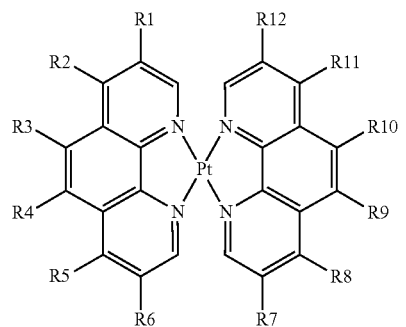
32
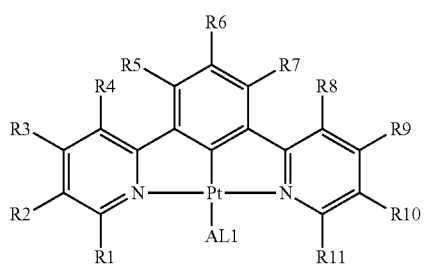
33
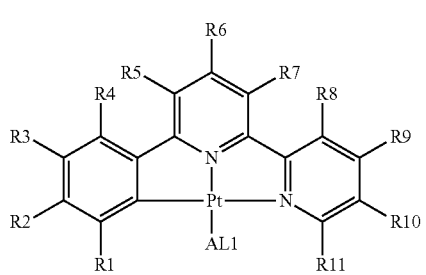
34
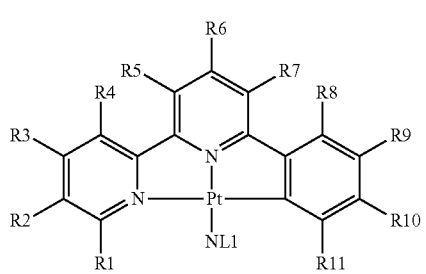
35
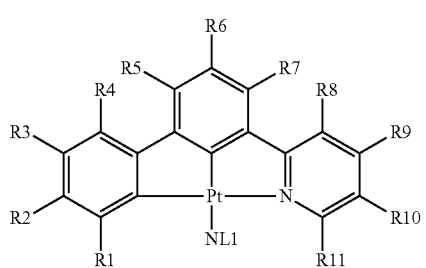
36
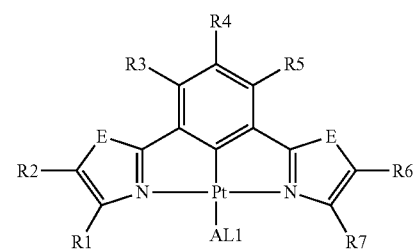
37
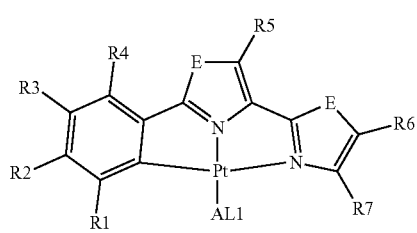
38
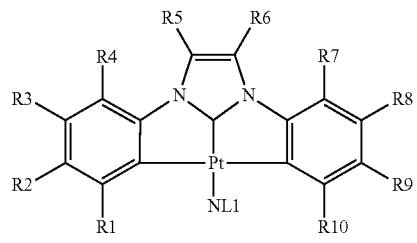
39
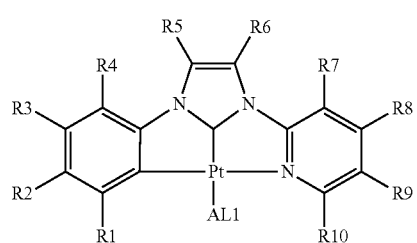
40
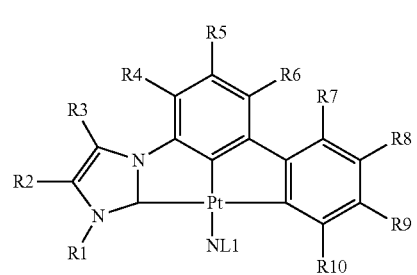
41
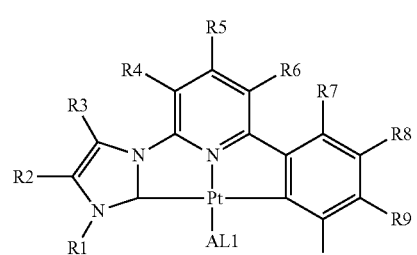
42
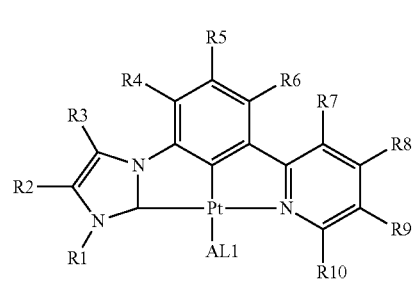
43

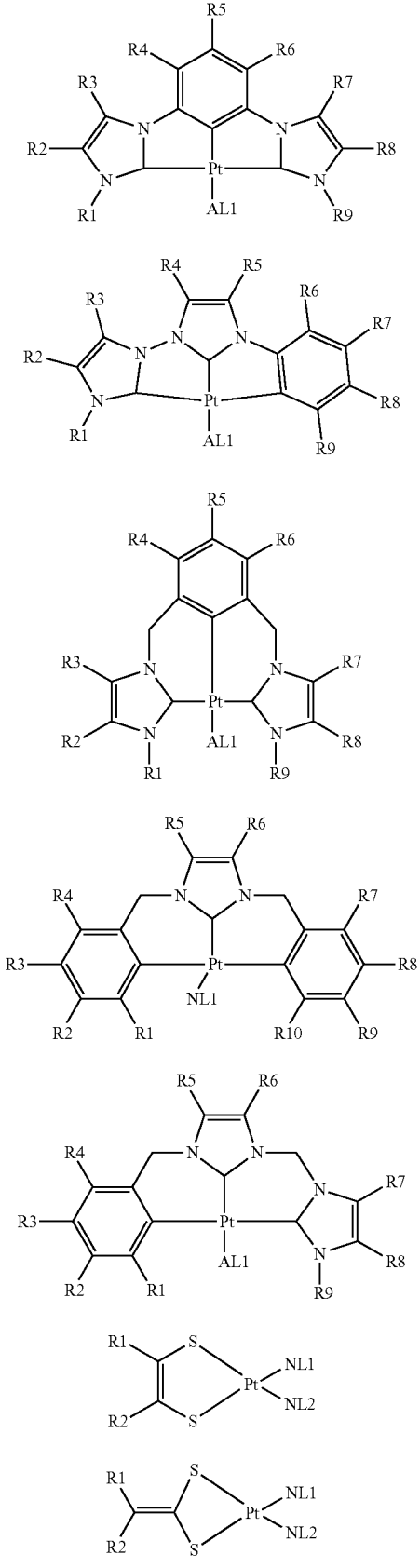

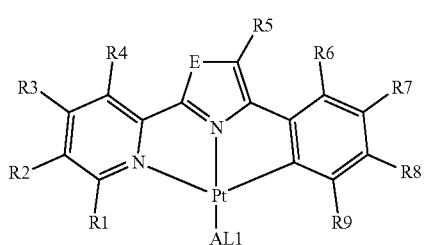
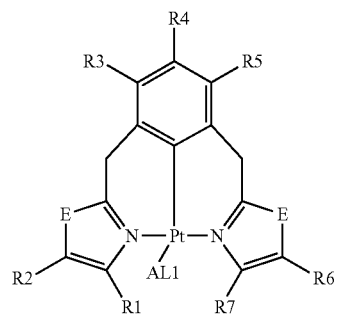
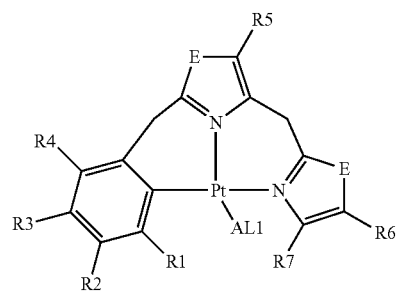
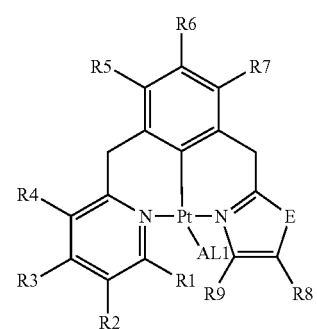
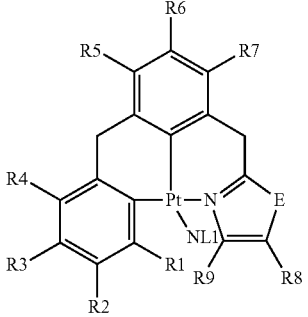
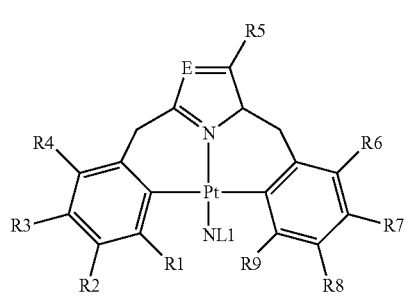
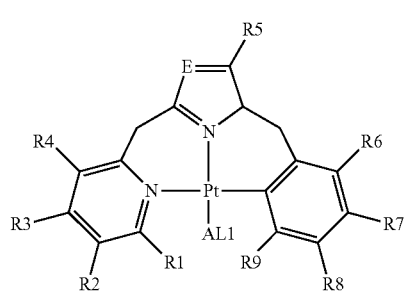
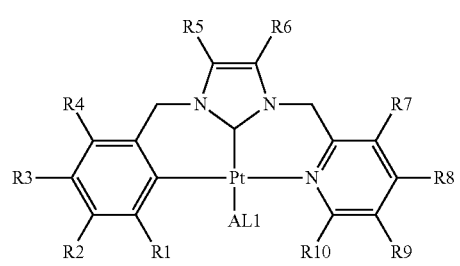
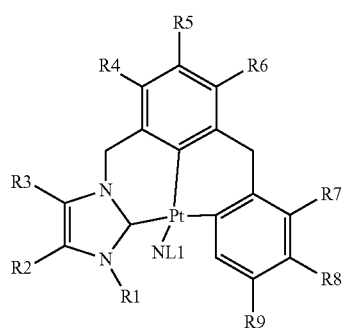

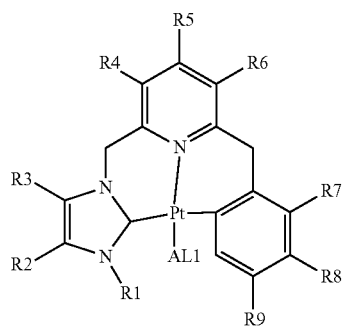
70
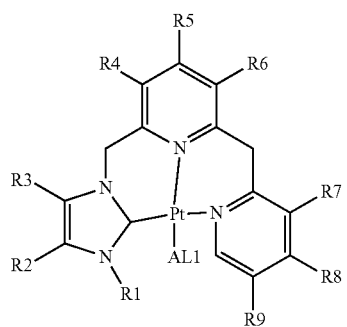
71
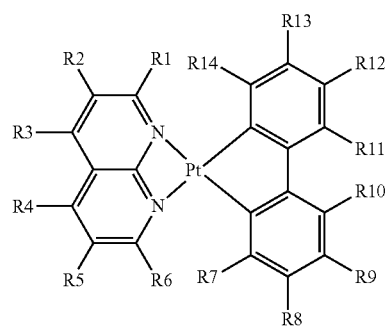
72
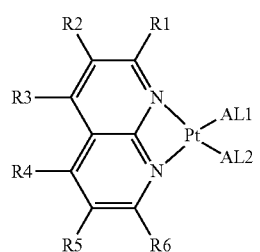
73
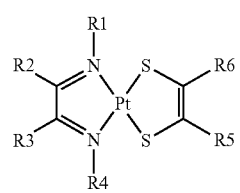
74
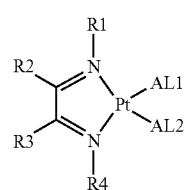
75
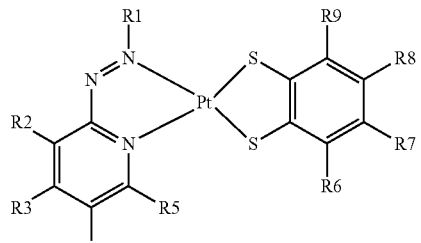
76
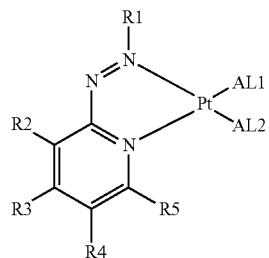
77
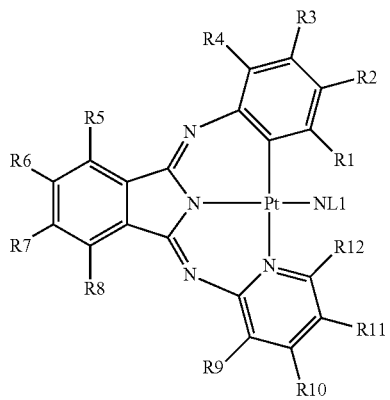
78
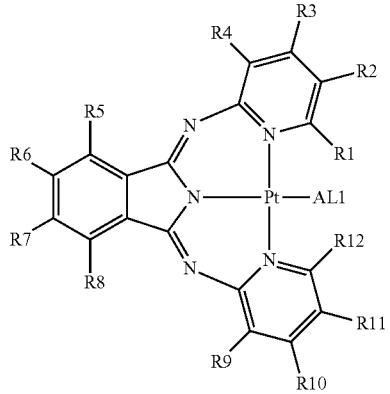
79
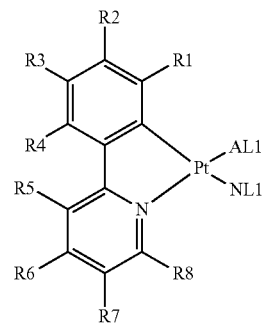
80

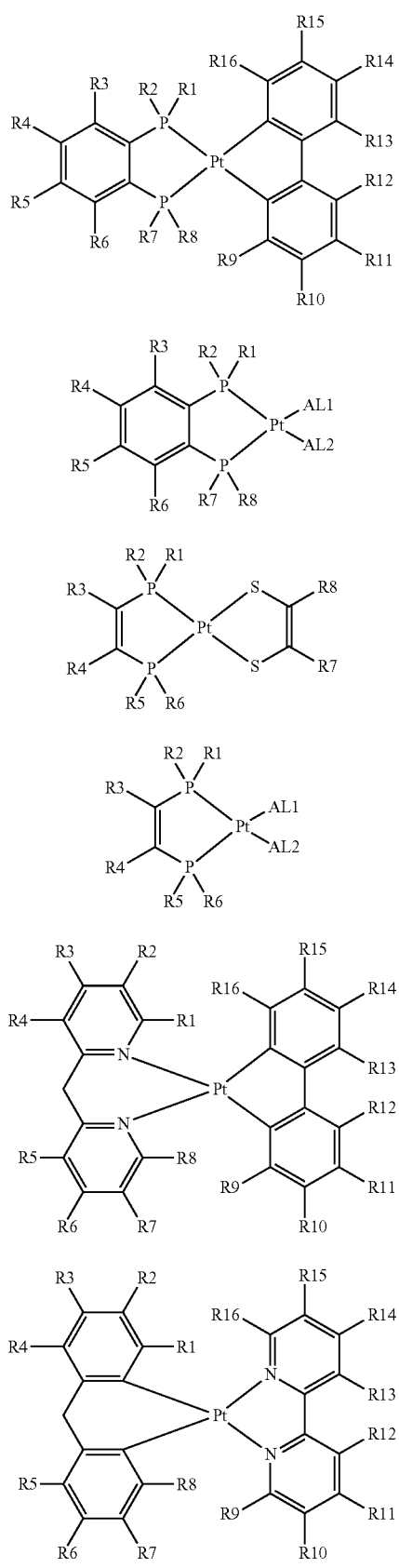
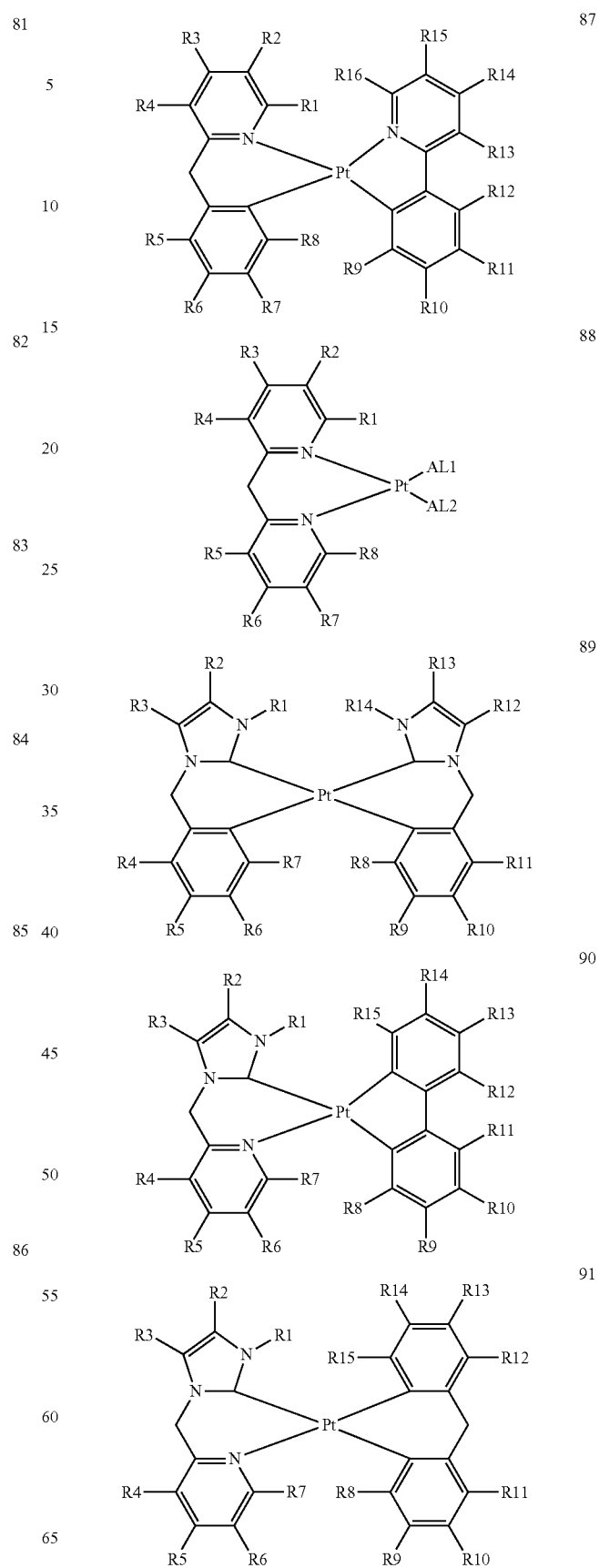

92
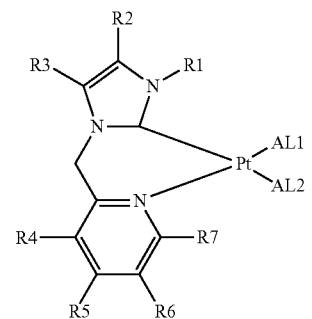
93
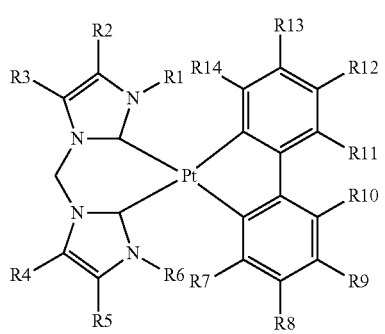
94
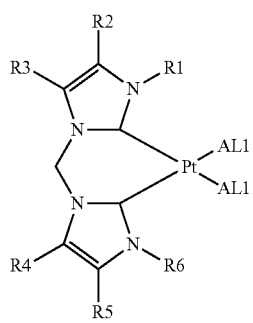
95
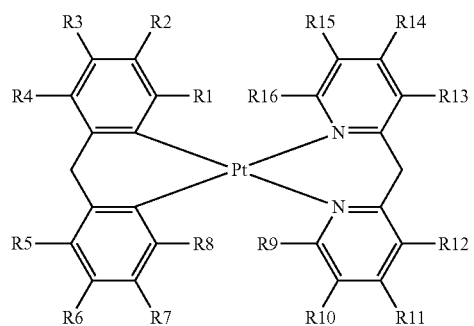
96
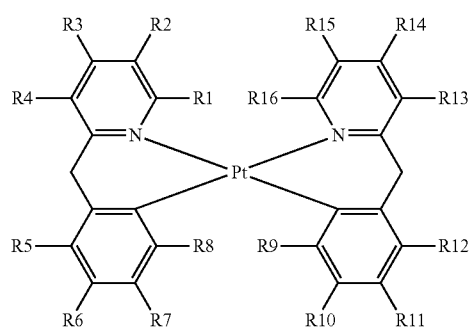
97
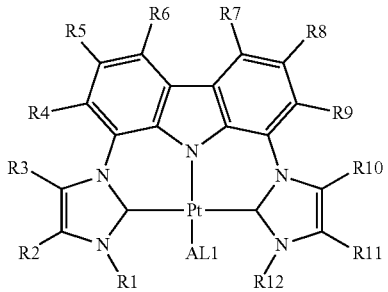
98
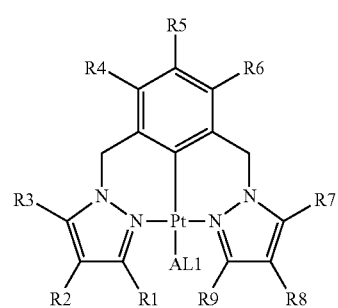
99
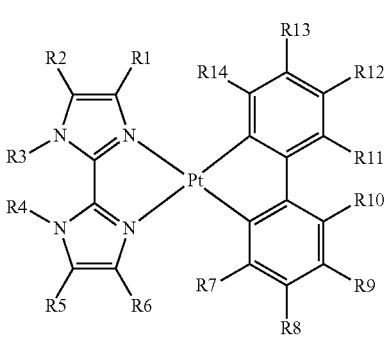
100
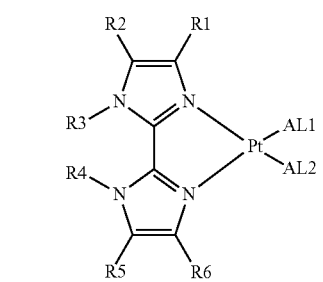
101
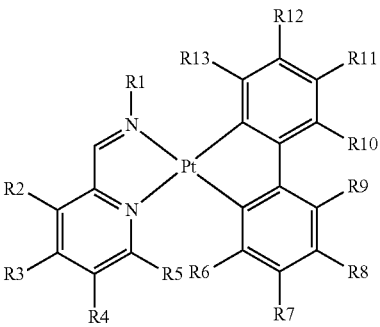

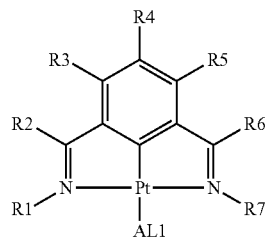
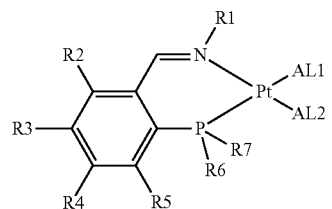
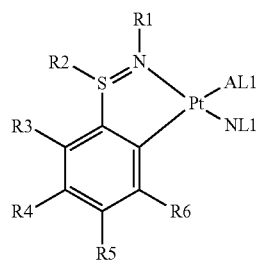
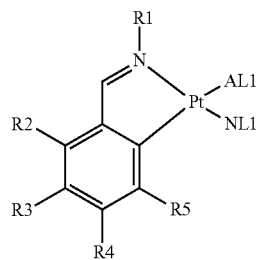
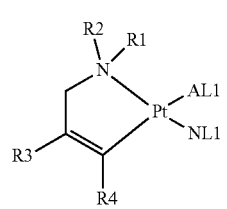
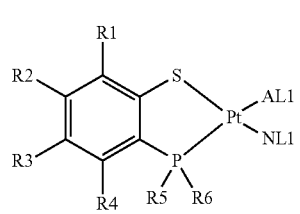
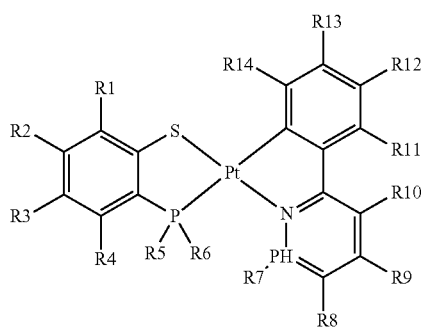
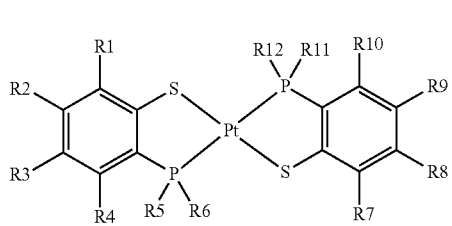
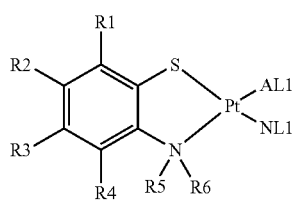
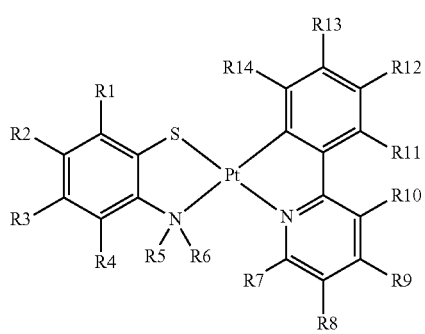
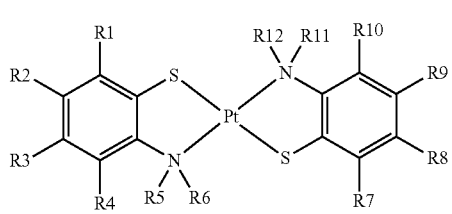
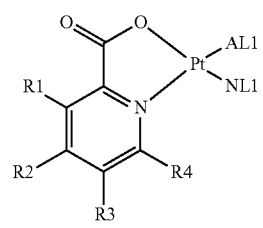

113
-continued
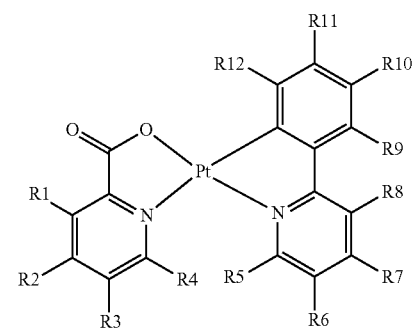
114
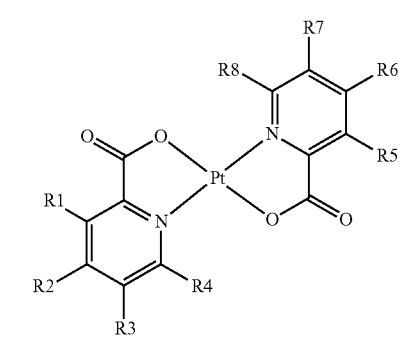
115
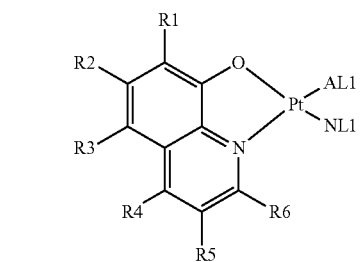
116
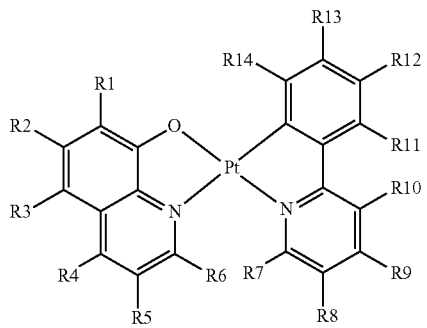
117
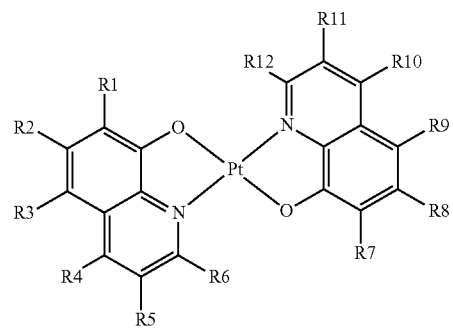
118
114
-continued
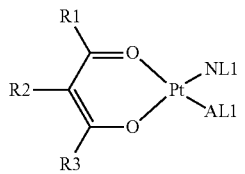
119
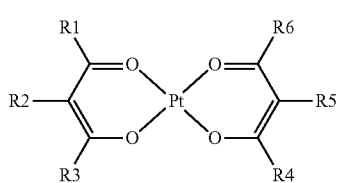
120
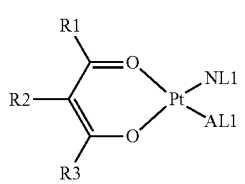
121
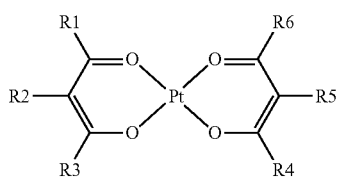
122
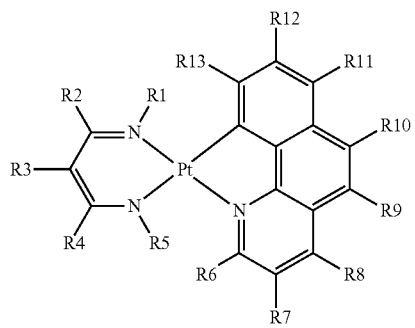
123
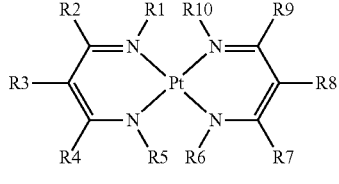
124
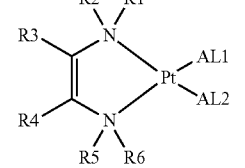
125

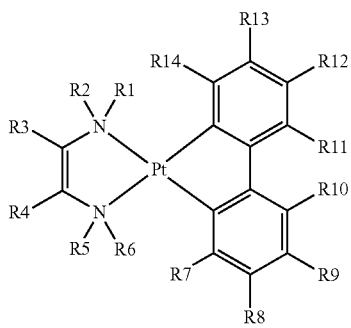
126
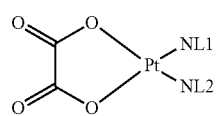
127
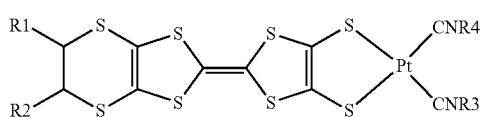
128
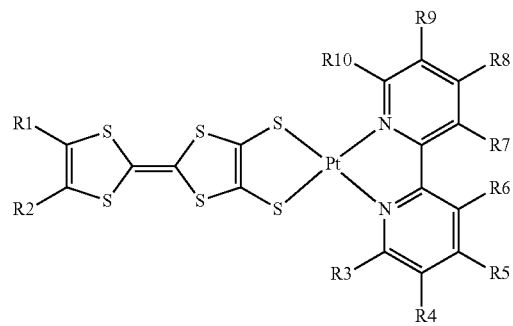
129
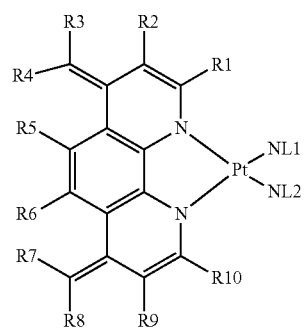
130
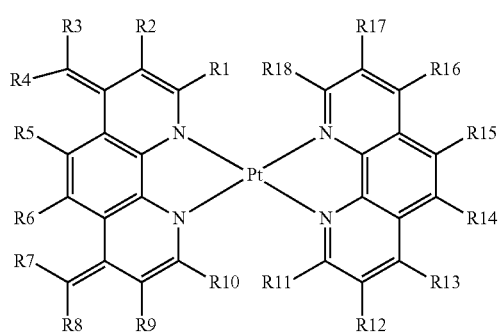
131
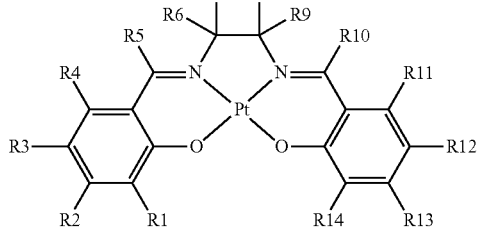
132
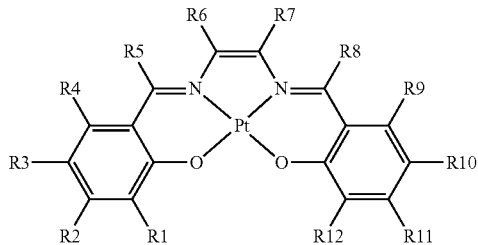
133
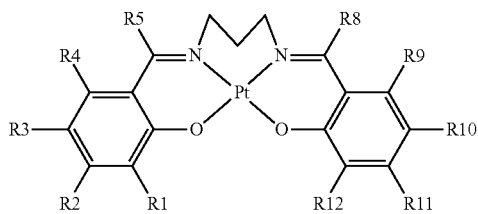
134
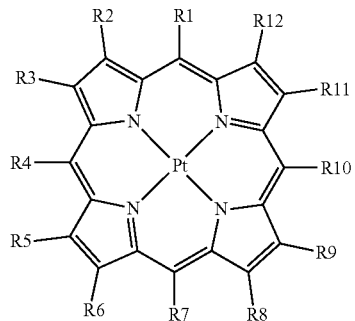
135
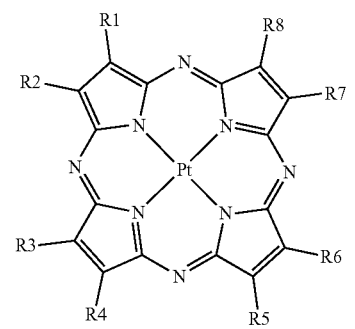
136

Ir(I) complexes of formulae to 7,
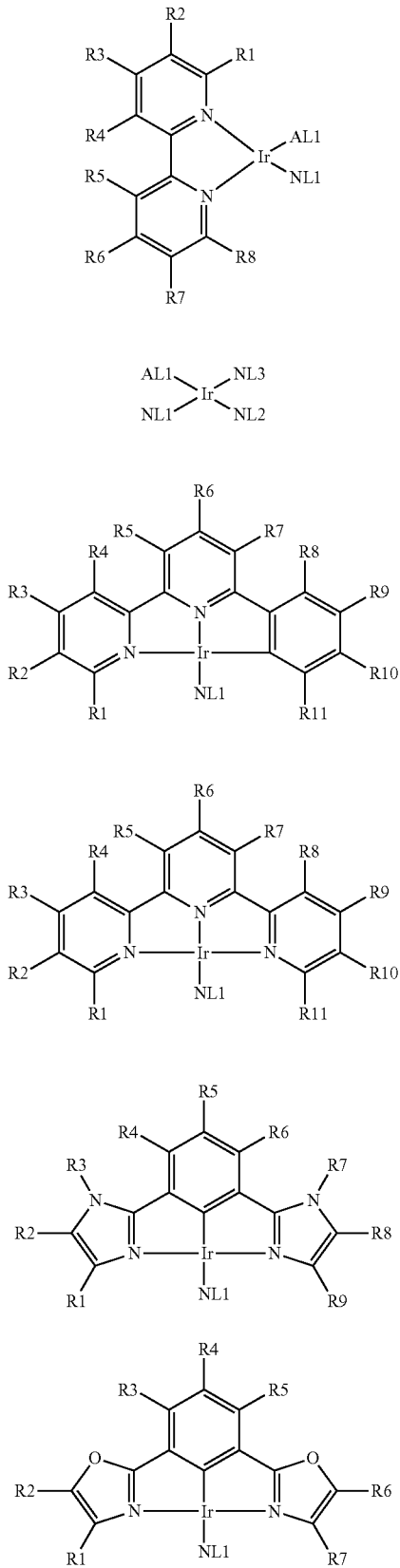
Rh(I) complexes of formulae 8 to 14, and
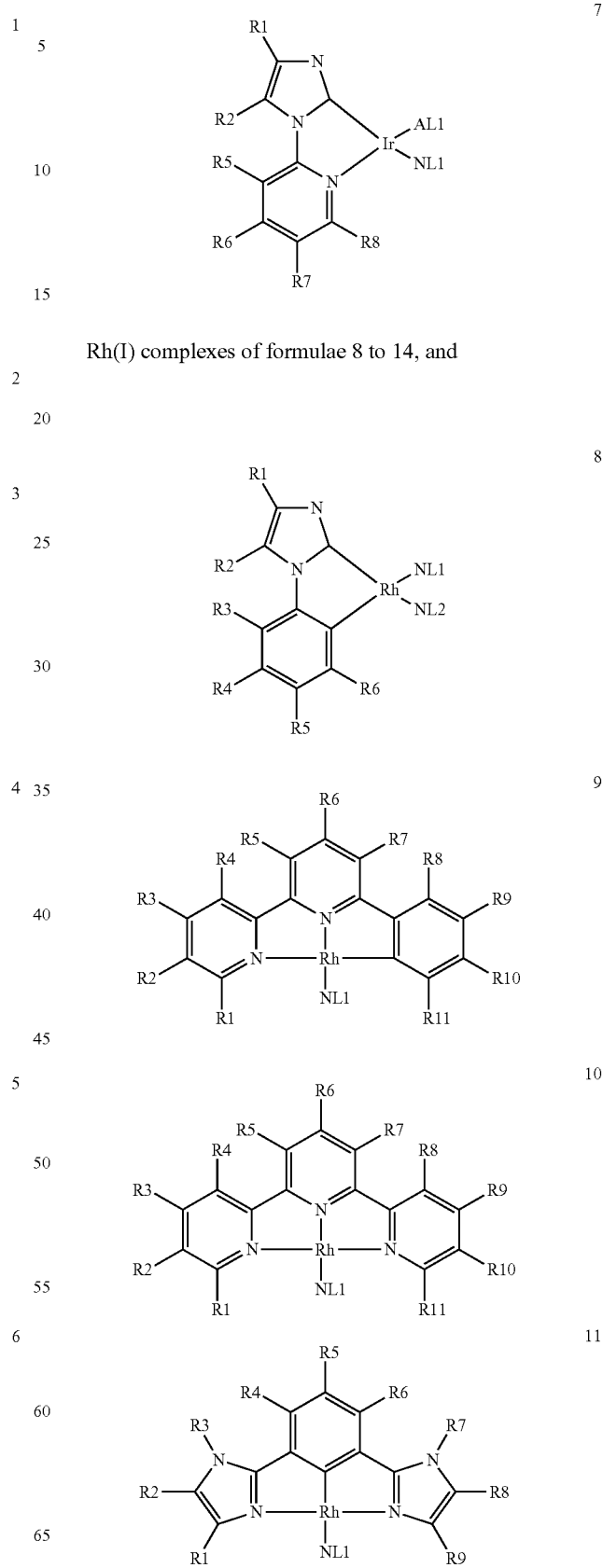

-continued

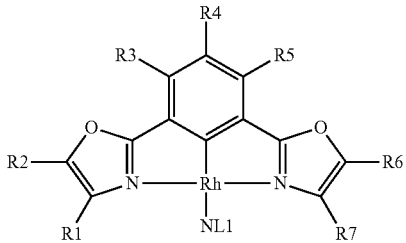

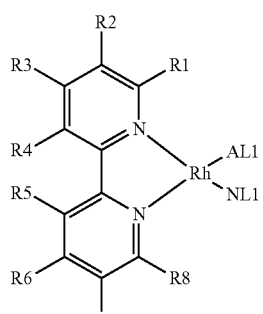

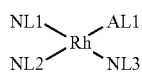

Au(III) complexes of formulae 265 to 271

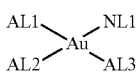

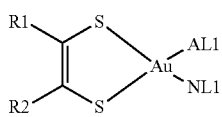

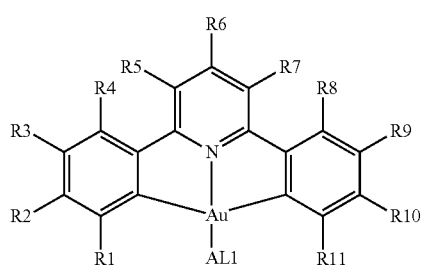

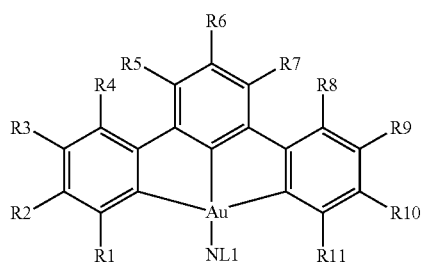

-continued

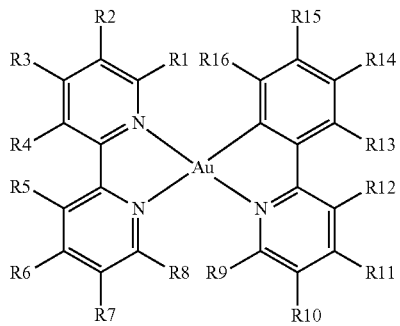

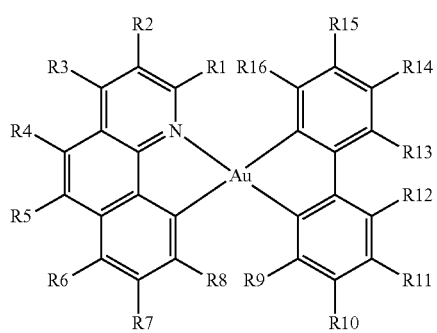

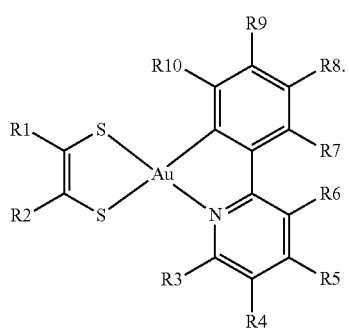

14. A process for producing the electronic component of claim 1 comprising applying a composition to a support, wherein said composition comprises
(1) a first neutral transition-metal complex, and
(2) a second neutral transition-metal complex,
wherein said first transition-metal complex and said second transition-metal complex together form a columnar structure.

15. A process for modifying the emission and/or absorption properties of an electronic component comprising introducing a composition into a matrix material for the transport of electrons or holes in an electronic component, wherein said composition comprises
(1) a first neutral transition-metal complex, and
(2) a second neutral transition-metal complex,
wherein said first transition-metal complex and said second transition-metal complex together form a columnar structure.

16. A composition comprising
(1) a first neutral transition-metal complex,
(2) a second neutral transition-metal complex, and
(3) optionally a matrix material,
wherein said first transition-metal complex and said second transition-metal complex together form a columnar structure.

* * * * *